United States Patent
Feng et al.

(10) Patent No.: US 12,266,409 B2
(45) Date of Patent: Apr. 1, 2025

(54) SHIFT REGISTER UNIT, GATE DRIVING CIRCUIT AND GATE DRIVING METHOD

(71) Applicants: Hefei BOE Joint Technology Co., Ltd., Anhui (CN); BOE Technology Group Co., Ltd., Beijing (CN)

(72) Inventors: Xuehuan Feng, Beijing (CN); Dacheng Zhang, Beijing (CN)

(73) Assignees: Hefei BOE Joint Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/277,059

(22) PCT Filed: Jul. 21, 2022

(86) PCT No.: PCT/CN2022/106996
§ 371 (c)(1),
(2) Date: Aug. 11, 2023

(87) PCT Pub. No.: WO2024/016256
PCT Pub. Date: Jan. 25, 2024

(65) Prior Publication Data
US 2025/0014662 A1  Jan. 9, 2025

(51) Int. Cl.
G09G 3/32 (2016.01)
G09G 3/3225 (2016.01)
G09G 3/3266 (2016.01)
G11C 19/28 (2006.01)

(52) U.S. Cl.
CPC ........... *G11C 19/28* (2013.01); *G09G 3/3225* (2013.01); *G09G 3/3266* (2013.01);
(Continued)

(58) Field of Classification Search
CPC .... G11C 19/28; G09G 3/3225; G09G 3/3266; G09G 2300/0842; G09G 2310/0286; G09G 2310/08; G09G 3/32; G09G 2300/08
See application file for complete search history.

(56) References Cited

U.S. PATENT DOCUMENTS

2017/0116921 A1  4/2017  Xiao et al.
2019/0139475 A1*  5/2019  Wang ...................... G11C 7/02
(Continued)

FOREIGN PATENT DOCUMENTS

CN  106935192 A  7/2017
CN  108682397 A  10/2018
(Continued)

*Primary Examiner* — Pegeman Karimi
(74) *Attorney, Agent, or Firm* — HOUTTEMAN LAW LLC

(57) ABSTRACT

The disclosure provides a shift register unit, including: a sensing control circuit configured to write an active level signal to a sensing control node; a first sensing input circuit connected to a first pull-up back node and configured to write an active level signal to the first pull-up back node; a first display input circuit connected to a first pull-up node and configured to write an active level signal to the first pull-up node; a first switch circuit connected in series between the first pull-up node and the first pull-up back node and configured to control connection and disconnection between the first pull-up node and the first pull-up back node in response to control of a signal from a switch signal input terminal; and a first driving output circuit connected to the first pull-up back node and configured to write a signal to a first driving signal output terminal.

20 Claims, 37 Drawing Sheets

(52) U.S. Cl.
    CPC ............ *G09G 2300/0842* (2013.01); *G09G 2310/0286* (2013.01); *G09G 2310/08* (2013.01)

(56) References Cited

U.S. PATENT DOCUMENTS

| | | | | |
|---|---|---|---|---|
| 2019/0295489 A1* | 9/2019 | Wang | ........................ | G11C 8/04 |
| 2021/0056880 A1* | 2/2021 | Mou | ........................ | G11C 19/28 |
| 2021/0118347 A1* | 4/2021 | Wang | .................... | G09G 3/3266 |
| 2021/0335178 A1* | 10/2021 | Hu | ........................ | G11C 19/28 |

FOREIGN PATENT DOCUMENTS

| | | | |
|---|---|---|---|
| CN | 108806611 | A | 11/2018 |
| CN | 109935185 | A | 6/2019 |
| CN | 109935196 | A | 6/2019 |
| CN | 109935197 | A | 6/2019 |
| CN | 109935208 | A | 6/2019 |
| CN | 109935209 | A | 6/2019 |
| CN | 109935269 | A | 6/2019 |
| CN | 110517637 | A | 11/2019 |
| CN | 111179808 | A | 5/2020 |
| CN | 111312140 | A | 6/2020 |
| CN | 111971737 | A | 11/2020 |
| CN | 113299243 | A | 8/2021 |
| CN | 113781967 | A | 12/2021 |
| CN | 113889020 | A | 1/2022 |
| CN | 114596817 | A | 6/2022 |
| CN | 114677965 | A | 6/2022 |
| KR | 100791332 | B1 | 1/2008 |
| KR | 20170078978 | A | 7/2017 |

* cited by examiner

SHIFT REGISTER UNIT, GATE DRIVING CIRCUIT AND GATE DRIVING METHOD

CROSS REFERENCE TO RELATED APPLICATION

This is a National Phase Application filed under 35 U.S.C. 371 as a national stage of PCT/CN2022/106996, filed on Jul. 21, 2022, the contents of which are hereby incorporated by reference in their entirety.

TECHNICAL FIELD

The present disclosure relates to the display field, and in particular, to a shift register unit, a gate driving circuit, and a gate driving method.

BACKGROUND

Active Matrix Organic Light Emitting Diode (AMOLED) panels have been applied more and more widely. A pixel display device in an AMOLED is an Organic Light-Emitting Diode (OLED), and the AMOLED can emit light by driving a thin film transistor to generate a driving current in a saturated state, and driving a light-emitting device by the driving current to emit light.

SUMMARY

In a first aspect, embodiments of the present disclosure provide a shift register unit, including:
  a sensing control circuit connected to a first sensing signal input terminal, a second sensing signal input terminal, and a sensing control node, and configured to write an active level signal provided by the second sensing signal input terminal to the sensing control node in response to control of an active level signal provided by the first sensing signal input terminal;
  a first sensing input circuit connected to a first level supply terminal, a first clock control signal input terminal, the sensing control node, and a first pull-up back node, and configured to write an active level signal provided by the first level supply terminal to the first pull-up back node in response to control of an active level signal at the sensing control node and an active level signal provided by the first clock control signal input terminal;
  a first display input circuit connected to a display signal input terminal, a third power supply terminal, and a first pull-up node, and configured to write an active level signal provided by the third power supply terminal to the first pull-up node in response to control of an active level signal provided by the display signal input terminal;
  a first switch circuit connected in series between the first pull-up node and the first pull-up back node, connected to a switch signal input terminal, and configured to control connection and disconnection between the first pull-up node and the first pull-up back node in response to control of a signal provided by the switch signal input terminal; and a first driving output circuit connected to the first pull-up back node, a first driving clock signal input terminal, and a first driving signal output terminal, and configured to write a signal provided by the first driving clock signal input terminal to the first driving signal output terminal in response to control of an active level signal at the first pull-up back node.

In some embodiments, the first switch circuit includes: a seventy-first transistor; and
  a control electrode of the seventy-first transistor is connected to the switch signal input terminal, a first electrode of the seventy-first transistor is connected to the first pull-up node, and a second electrode of the seventy-first transistor is connected to the first pull-up back node.

In some embodiments, the first sensing input circuit includes:
  a sensing input preparation sub-circuit connected to a sensing preparation node, the sensing control node, and the first level supply terminal, and configured to write a signal provided by the first level supply terminal to the sensing preparation node in response to control of an active level signal provided by the sensing control node; and
  a sensing input sub-circuit connected to the sensing preparation node, the first clock control signal input terminal, and the first pull-up back node, and configured to write a signal at the sensing preparation node to the first pull-up back node in response to control of an active level signal provided by the first clock control signal input terminal.

In some embodiments, the shift register unit further includes:
  a sensing control anti-leakage circuit, wherein the sensing control circuit is connected to the second sensing signal input terminal through the sensing control anti-leakage circuit, and is connected to the sensing control anti-leakage circuit at a sensing control anti-leakage node, and the sensing control anti-leakage node is connected to the sensing preparation node; and
  the sensing control anti-leakage circuit is further connected to a third sensing signal input terminal, and is configured to form a path between the sensing control anti-leakage node and the second sensing signal input terminal in response to control of an active level signal provided by the third sensing signal input terminal, and cut off the path between the sensing control anti-leakage node and the second sensing signal input terminal in response to control of an inactive level signal provided by the third sensing signal input terminal.

In some embodiments, the third sensing signal input terminal is the first sensing signal input terminal.

In some embodiments, the third sensing signal input terminal is the second sensing signal input terminal.

In some embodiments, the sensing control anti-leakage circuit includes: a seventy-second transistor; and
  a control electrode of the seventy-second transistor is connected to the third sensing signal input terminal, a first electrode of the seventy-second transistor is connected to the second sensing signal input terminal, and a second electrode of the seventy-second transistor is connected to the sensing control anti-leakage node.

In some embodiments, the first level supply terminal is the third power supply terminal.

In some embodiments, the shift register unit further includes:
  a first sensing input anti-leakage circuit, wherein the sensing input sub-circuit is connected to the sensing preparation node through the first sensing input anti-leakage circuit, and is connected to the first sensing input anti-leakage circuit at a first sensing input anti-leakage node; and the first sensing input anti-leakage circuit is further connected to the first clock control signal input terminal, and is configured to form a path between the first sensing input anti-leakage node and the sensing preparation node in response to control of an active level signal provided by the first clock control signal input terminal, and cut off the path between the first sensing input anti-leakage node and the sensing preparation node in response to control of an inactive level signal provided by the first clock control signal input terminal.

In some embodiments, the first sensing input anti-leakage circuit includes: a seventy-third transistor; and a control electrode of the seventy-third transistor is connected to the first clock control signal input terminal, a first electrode of the seventy-third transistor is connected to the sensing preparation node, and a second electrode of the seventy-third transistor is connected to the first sensing input anti-leakage node.

In some embodiments, the shift register unit further includes:

a sensing control anti-leakage circuit, wherein the sensing control circuit is connected to the second sensing signal input terminal through the sensing control anti-leakage circuit, and is connected to the sensing control anti-leakage circuit at a sensing control anti-leakage node; and the sensing control anti-leakage circuit is further connected to the first sensing signal input terminal, the sensing control node, and the third power supply terminal, and is configured to write an active level signal provided by the second sensing signal input terminal to the sensing control anti-leakage node in response to control of an active level signal provided by the first sensing signal input terminal, and write an active level signal provided by the third power supply terminal to the sensing control anti-leakage node in response to control of an active level signal at the sensing control node.

In some embodiments, the sensing control anti-leakage circuit includes: a seventy-fourth transistor and a seventy-fifth transistor;

a control electrode of the seventy-fourth transistor is connected to the first sensing signal input terminal, a first electrode of the seventy-fourth transistor is connected to the second sensing signal input terminal, and a second electrode of the seventy-fourth transistor is connected to the sensing control anti-leakage node; and a control electrode of the seventy-fifth transistor is connected to the sensing control node, a first electrode of the seventy-fifth transistor is connected to the third power supply terminal, and a second electrode of the seventy-fifth transistor is connected to the sensing control anti-leakage node.

In some embodiments, the first level supply terminal is the first clock control signal input terminal; and the shift register unit further includes:

a first sensing input anti-leakage circuit connected to the sensing preparation node and a third level supply terminal, and configured to write an active level signal provided by the third level supply terminal to the sensing preparation node in response to control of the active level signal provided by the third level supply terminal.

In some embodiments, the first sensing input anti-leakage circuit includes: a seventy-sixth transistor; and a control electrode of the seventy-sixth transistor is connected to the third level supply terminal, a first electrode of the seventy-sixth transistor is connected to the third level supply terminal, and a second electrode of the seventy-sixth transistor is connected to the sensing preparation node.

In some embodiments, the shift register unit further includes:

a first sensing reset circuit connected to a second clock control signal input terminal, a second level supply terminal, and the first pull-up back node, and configured to write an inactive level signal provided by the second level supply terminal to the first pull-up back node in response to control of an active level signal provided by the second clock control signal input terminal.

In some embodiments, the first sensing reset circuit includes: a seventy-seventh transistor; and a control electrode of the seventy-seventh transistor is connected to the second clock control signal input terminal, a first electrode of the seventy-seventh transistor is connected to the first pull-up back node, and a second electrode of the seventy-seventh transistor is connected to the second level supply terminal.

In some embodiments, the shift register unit further includes:

a second driving output circuit connected to the first pull-up back node, a second driving clock signal input terminal, and a second driving signal output terminal, and configured to write a signal provided by the second driving clock signal input terminal to the second driving signal output terminal in response to control of an active level signal at the first pull-up back node; and a first cascade output circuit connected to the first pull-up node, a first cascade clock signal input terminal, and a first cascade signal output terminal, and configured to write a signal provided by the first cascade clock signal input terminal to the first cascade signal output terminal in response to control of an active level signal at the first pull-up node.

In some embodiments, the shift register unit includes a first sensing reset circuit connected to a second clock control signal input terminal, a second level supply terminal, and the first pull-up back node, and configured to write an inactive level signal provided by the second level supply terminal to the first pull-up back node in response to control of an active level signal provided by the first clock control signal input terminal; and the second level supply terminal is the first cascade signal output terminal.

In some embodiments, the shift register unit further includes:

a first display reset circuit connected to a display reset signal input terminal, a second power supply terminal, and the first pull-up node, and configured to write an inactive level signal provided by the second power supply terminal to the first pull-up node in response to control of an active level signal provided by the display reset signal input terminal; and a first global reset circuit connected to a global reset signal input terminal, the second power supply terminal, and the first pull-up node, and configured to write an inactive level signal provided by the second power supply terminal to the first pull-up node in response to control of an active level signal provided by the global reset signal input terminal.

In some embodiments, the shift register unit further includes:
- a first pull-down control circuit connected to the second power supply terminal, a fifth power supply terminal, the first pull-up node, and a first pull-down node, and configured to write a voltage having a phase opposite to that of a voltage at the first pull-up node to the first pull-down node; and
- a first pull-up noise reduction circuit connected to the second power supply terminal, the first pull-up node, and the first pull-down node, and configured to write an inactive level signal provided by the second power supply terminal to the first pull-up node in response to control of an active level signal at the first pull-down node;
- wherein the first cascade output circuit is further connected to the first pull-down node and the second power supply terminal, and is further configured to write an inactive level signal provided by the second power supply terminal to the first cascade signal output terminal in response to control of an active level signal at the first pull-down node;
- the first driving output circuit is further connected to the first pull-down node and a fourth power supply terminal, and is further configured to write an inactive level signal provided by the fourth power supply terminal to the first driving signal output terminal in response to control of an active level signal at the first pull-down node; and
- the second driving output circuit is further connected to the first pull-down node and the fourth power supply terminal, and is further configured to write an inactive level signal provided by the fourth power supply terminal to the second driving signal output terminal in response to control of an active level signal at the first pull-down node.

In some embodiments, the shift register unit includes a first sensing reset circuit connected to a second clock control signal input terminal, a second level supply terminal, and the first pull-up back node, and configured to write an inactive level signal provided by the second level supply terminal to the first pull-up back node in response to control of an active level signal provided by the first clock control signal input terminal; and
the shift register unit further includes;
- a first sensing reset anti-leakage circuit, wherein the first sensing reset circuit is connected to the second level supply terminal through the first sensing reset anti-leakage circuit; and
- the first sensing reset anti-leakage circuit is further connected to the first pull-down node, and is configured to form a path between the first sensing reset circuit and the second level supply terminal in response to control of an active level signal at the first pull-down node, and cut off the path between the first sensing reset circuit and the second level supply terminal in response to control of an inactive level signal at the first pull-down node.

In some embodiments, the first sensing reset anti-leakage circuit includes: a seventy-eighth transistor; and
- a control electrode of the seventy-eighth transistor is connected to the first pull-down node, a first electrode of the seventy-eighth transistor is connected to the first sensing reset anti-leakage circuit, and a second electrode of the seventy-eighth transistor is connected to the second level supply terminal.

In some embodiments, the shift register unit further includes:
- a first voltage control circuit connected to the third power supply terminal, the first pull-up node, and a first voltage control node, and configured to write an active level signal provided by the third power supply terminal to the first voltage control node in response to control of an active level signal at the first pull-up node; and
- the shift register unit further includes: at least one of a first anti-leakage circuit, a second anti-leakage circuit, and a third anti-leakage circuit;
- the first global reset circuit is connected to the second power supply terminal through the first anti-leakage circuit, and is connected to the first anti-leakage circuit at a first anti-leakage node, the first anti-leakage node is connected to the first voltage control node, and the first anti-leakage circuit is connected to the global reset signal input terminal, and is configured to form a path between the first anti-leakage node and the second power supply terminal in response to control of an active level signal provided by the global reset signal input terminal, and cut off the path between the first anti-leakage node and the second power supply terminal in response to control of an inactive level signal provided by the global reset signal input terminal;
- the first display reset circuit is connected to the second power supply terminal through the second anti-leakage circuit, and is connected to the second anti-leakage circuit at a second anti-leakage node, the second anti-leakage node is connected to the first voltage control node, and the second anti-leakage circuit is connected to the display reset signal input terminal, and is configured to from a path between the second anti-leakage node and the second power supply terminal in response to control of an active level signal provided by the display reset signal input terminal, and cut off the path between the second anti-leakage node and the second power supply terminal in response to control of an inactive level signal provided by the display reset signal input terminal; and
- the first pull-up noise reduction circuit is connected to the second power supply terminal through the third anti-leakage circuit, and is connected to the third anti-leakage circuit at a third anti-leakage node, the third anti-leakage node is connected to the first voltage control node, and the third anti-leakage circuit is connected to the first pull-down node, and is configured to form a path between the third anti-leakage node and the second power supply terminal in response to control of an active level signal at the first pull-down node, and cut off the path between the third anti-leakage node and the second power supply terminal in response to control of an inactive level signal at the first pull-down node.

In some embodiments, the shift register unit further includes:
- a second sensing input circuit connected to the first clock control signal input terminal, the sensing preparation node, and a second pull-up back node, and configured to write a signal at the sensing preparation node to the second pull-up back node in response to control of an active level signal provided by the first clock control signal input terminal;
- a second display input circuit connected to the display signal input terminal, the third power supply terminal, and a second pull-up node, and configured to write an active level signal provided by the third power supply terminal to the second pull-up node in response to control of an active level signal provided by the display signal input terminal;

a second switch circuit connected in series between the second pull-up node and the second pull-up back node, connected to the switch signal input terminal, and configured to control connection and disconnection between the second pull-up node and the second pull-up back node in response to control of a signal provided by the switch signal input terminal; and a third driving output circuit connected to the second pull-up back node, a third driving clock signal input terminal, and a third driving signal output terminal, and configured to write a signal provided by the third driving clock signal input terminal to the third driving signal output terminal in response to control of an active level signal at the second pull-up back node.

In some embodiments, the second switch circuit includes: an eighty-first transistor; and a control electrode of the eighty-first transistor is connected to the switch signal input terminal, a first electrode of the eighty-first transistor is connected to the second pull-up node, and a second electrode of the eighty-first transistor is connected to the second pull-up back node.

In some embodiments, the shift register unit includes a first sensing input anti-leakage circuit, wherein the sensing input sub-circuit is connected to the sensing preparation node through the first sensing input anti-leakage circuit, and is connected to the first sensing input anti-leakage circuit at a first sensing input anti-leakage node;

the first sensing input anti-leakage circuit is further connected to the first clock control signal input terminal, and is configured to form a path between the first sensing input anti-leakage node and the sensing preparation node in response to control of an active level signal provided by the first clock control signal input terminal, and cut off the path between the first sensing input anti-leakage node and the sensing preparation node in response to control of an inactive level signal provided by the first clock control signal input terminal; and the second sensing input circuit is connected to the first sensing input anti-leakage node to be connected to the sensing preparation node through the first sensing input anti-leakage circuit.

In some embodiments, the shift register unit further includes:

a second sensing input anti-leakage circuit, wherein the second sensing input circuit is connected to the sensing preparation node through the second sensing input anti-leakage circuit, and is connected to the second sensing input anti-leakage circuit at a second sensing input anti-leakage node; and the second sensing input anti-leakage circuit is further connected to the first clock control signal input terminal, and is configured to form a path between the second sensing input anti-leakage node and the sensing preparation node in response to control of an active level signal provided by the first clock control signal input terminal, and cut off the path between the second sensing input anti-leakage node and the sensing preparation node in response to control of an inactive level signal provided by the first clock control signal input terminal.

In some embodiments, the second sensing input anti-leakage circuit includes: an eighty-third transistor; and a control electrode of the eighty-third transistor is connected to the first clock control signal input terminal, a first electrode of the eighty-third transistor is connected to the sensing preparation node, and a second electrode of the eighty-third transistor is connected to the second sensing input anti-leakage node.

In some embodiments, the shift register unit further includes:

a second sensing reset circuit connected to a second clock control signal input terminal, a second level supply terminal, and the second pull-up back node, and configured to write an inactive level signal provided by the second level supply terminal to the second pull-up back node in response to control of an active level signal provided by the second clock control signal input terminal.

In some embodiments, the second sensing reset circuit includes: an eighty-seventh transistor; and a control electrode of the eighty-seventh transistor is connected to the second clock control signal input terminal, a first electrode of the eighty-seventh transistor is connected to the second pull-up back node, and a second electrode of the eighty-seventh transistor is connected to the second level supply terminal.

In some embodiments, the shift register unit further includes:

a fourth driving output circuit connected to the second pull-up back node, a fourth driving clock signal input terminal, and a fourth driving signal output terminal, and configured to write a signal provided by the fourth driving clock signal input terminal to the fourth driving signal output terminal in response to control of an active level signal at the second pull-up back node.

In some embodiments, the shift register unit further includes:

a second display reset circuit connected to a display reset signal input terminal, a second power supply terminal, and the second pull-up node, and configured to write an inactive level signal provided by the second power supply terminal to the second pull-up node in response to control of an active level signal provided by the display reset signal input terminal; and a second global reset circuit connected to a global reset signal input terminal, the second power supply terminal, and the second pull-up node, and configured to write an inactive level signal provided by the second power supply terminal to the second pull-up node in response to control of an active level signal provided by the global reset signal input terminal.

In some embodiments, the shift register unit further includes:

a second pull-down control circuit connected to the second power supply terminal, a fifth power supply terminal, the second pull-up node, and a second pull-down node, and configured to write a voltage having a phase opposite to that of a voltage at the second pull-up node to the second pull-down node; and a second pull-up noise reduction circuit connected to the second power supply terminal, the second pull-up node, and the second pull-down node, and configured to write an inactive level signal provided by the second power supply terminal to the second pull-up node in response to control of an active level signal at the second pull-down node;

wherein the third driving output circuit is further connected to the second pull-down node and a fourth power supply terminal, and is further configured to write an inactive level signal provided by the fourth power supply terminal to the third driving signal output terminal in response to control of an active level signal at the second pull-down node; and the fourth driving output circuit is further connected to the second pull-down node and the fourth power supply terminal, and is further configured to write an inactive level signal provided by the fourth power supply terminal to the fourth driving signal output terminal in response to control of an active level signal at the second pull-down node.

In some embodiments, the shift register unit includes a second sensing reset circuit connected to a second clock control signal input terminal, a second level supply terminal, and the second pull-up back node, and configured to write an inactive level signal provided by the second level supply terminal to the second pull-up back node in response to control of an active level signal provided by the second clock control signal input terminal; and the shift register unit further includes:
a second sensing reset anti-leakage circuit, wherein the second sensing reset circuit is connected to the second level supply terminal through the second sensing reset anti-leakage circuit; and the second sensing reset anti-leakage circuit is further connected to the second pull-down node, and is configured to form a path between the second sensing reset circuit and the second level supply terminal in response to control of an active level signal at the second pull-down node, and cut off the path between the second sensing reset circuit and the second level supply terminal in response to control of an inactive level signal at the second pull-down node.

In some embodiments, the second sensing reset anti-leakage circuit includes: an eighty-eighth transistor; and
a control electrode of the eighty-eighth transistor is connected to the second pull-down node, a first electrode of the eighty-eighth transistor is connected to the second sensing reset anti-leakage circuit, and a second electrode of the eighty-eighth transistor is connected to the second level supply terminal.

In some embodiments, the shift register unit includes a first sensing reset anti-leakage circuit, wherein the first sensing reset circuit is connected to the second level supply terminal through the first sensing reset anti-leakage circuit;
the first sensing reset anti-leakage circuit is further connected to the first pull-down node, and is configured to form a path between the first sensing reset circuit and the second level supply terminal in response to control of an active level signal at the first pull-down node, and cut off the path between the first sensing reset circuit and the second level supply terminal in response to control of an inactive level signal at the first pull-down node;

the first sensing reset anti-leakage circuit is further connected to the second pull-down node, and is further configured to form the path between the first sensing reset circuit and the second level supply terminal in response to control of an active level signal at the second pull-down node, and cut off the path between the first sensing reset circuit and the second level supply terminal in response to control of an inactive level signal at the second pull-down node; and the second sensing reset anti-leakage circuit is further connected to the first pull-down node, and the first sensing reset anti-leakage circuit is further configured to form the path between the second sensing reset circuit and the second level supply terminal in response to control of an active level signal at the first pull-down node, and cut off the path between the second sensing reset circuit and the second level supply terminal in response to control of an inactive level signal at the first pull-down node.

In some embodiments, the first sensing reset anti-leakage circuit includes: a seventy-eighth transistor and a seventy-ninth transistor;
the second sensing reset anti-leakage circuit includes: an eighty-eighth transistor and an eighty-ninth transistor;
a control electrode of the seventy-eighth transistor is connected to the first pull-down node, a first electrode of the seventy-eighth transistor is connected to the first sensing reset anti-leakage circuit, and a second electrode of the seventy-eighth transistor is connected to the second level supply terminal;
a control electrode of the seventy-ninth transistor is connected to the second pull-down node, a first electrode of the seventy-ninth transistor is connected to the first sensing reset anti-leakage circuit, and a second electrode of the seventy-ninth transistor is connected to the second level supply terminal;
a control electrode of the eighty-eighth transistor is connected to the second pull-down node, a first electrode of the eighty-eighth transistor is connected to the second sensing reset anti-leakage circuit, and a second electrode of the eighty-eighth transistor is connected to the second level supply terminal; and
a control electrode of the eighty-ninth transistor is connected to the first pull-down node, a first electrode of the eighty-ninth transistor is connected to the second sensing reset anti-leakage circuit, and a second electrode of the eighty-ninth transistor is connected to the second level supply terminal.

In some embodiments, the shift register unit further includes:
a second voltage control circuit connected to the third power supply terminal, the second pull-up node, and a second voltage control node, and configured to write an active level signal provided by an active level supply terminal to the second voltage control node in response to control of an active level signal at the second pull-up node; and the shift register unit further includes: at least one of a fourth anti-leakage circuit, a fifth anti-leakage circuit, and a sixth anti-leakage circuit;
the second global reset circuit is connected to the second power supply terminal through the fourth anti-leakage circuit, and is connected to the fourth anti-leakage circuit at a fourth anti-leakage node, the fourth anti-leakage node is connected to the second voltage control node, and the fourth anti-leakage circuit is connected to the global reset signal input terminal, and is configured to form a path between the fourth anti-leakage node and the second power supply terminal in response to control of an active level signal provided by the global reset signal input terminal, and cut off the path between the fourth anti-leakage node and the second power supply terminal in response to control of an inactive level signal provided by the global reset signal input terminal;
the second display reset circuit is connected to the second power supply terminal through the fifth anti-leakage circuit, and is connected to the fifth anti-leakage circuit at a fifth anti-leakage node, the fifth anti-leakage node is connected to the second voltage control node, and the fifth anti-leakage circuit is connected to the display reset signal input terminal, and is configured to form a path between the fifth anti-leakage node and the second power supply terminal in response to control of an active level signal provided by the display reset signal input terminal, and cut off the path between the fifth anti-leakage node and the second power supply terminal in response to control of an inactive level signal provided by the display reset signal input terminal; and the second pull-up noise reduction circuit is connected to the second power supply terminal through the sixth anti-leakage circuit, and is connected to the sixth anti-leakage circuit at a sixth anti-leakage node, the sixth anti-leakage node is connected to the second voltage control node, and the sixth anti-leakage circuit is connected to the second pull-down node, and is configured to form a path between the sixth anti-leakage node and the second power supply terminal in response to control of an active level signal at the second pull-down node, and cut off the path between the sixth anti-leakage node and the second power supply terminal in response to control of an inactive level signal at the second pull-down node.

In a second aspect, the embodiments of the present disclosure further provide a shift register unit, including:

a sensing control circuit connected to a first sensing signal input terminal, a second sensing signal input terminal, and a sensing control node, and configured to write an active level signal provided by the second sensing signal input terminal to the sensing control node in response to control of an active level signal provided by the first sensing signal input terminal;

a first sensing input circuit including: a sensing input preparation sub-circuit and a sensing input sub-circuit; wherein the sensing input preparation sub-circuit is connected to a sensing preparation node, the sensing control node, and a first level supply terminal, and is configured to write a signal provided by the first level supply terminal to the sensing preparation node in response to control of an active level signal provided by the sensing control node; and the sensing input sub-circuit is connected to the sensing preparation node, a first clock control signal input terminal, and a first pull-up back node, and is configured to write a signal at the sensing preparation node to the first pull-up back node in response to control of an active level signal provided at the first clock control signal input terminal;

a sensing control anti-leakage circuit, wherein the sensing control circuit is connected to the second sensing signal input terminal through the sensing control anti-leakage circuit, and is connected to the sensing control anti-leakage circuit at a sensing control anti-leakage node, and the sensing control anti-leakage node is connected to the sensing preparation node; and the sensing control anti-leakage circuit is further connected to a third sensing signal input terminal, and is configured to form a path between the sensing control anti-leakage node and the second sensing signal input terminal in response to control of an active level signal provided by the third sensing signal input terminal, and cut off the path between the sensing control anti-leakage node and the second sensing signal input terminal in response to control of an inactive level signal provided by the third sensing signal input terminal; and a first driving output circuit connected to the first pull-up back node, a first driving clock signal input terminal, and a first driving signal output terminal, and configured to write a signal provided by the first driving clock signal input terminal to the first driving signal output terminal in response to control of an active level signal at the first pull-up back node.

In some embodiments, the third sensing signal input terminal is the first sensing signal input terminal or the second sensing signal input terminal.

In some embodiments, the shift register unit further includes:

a first display input circuit connected to a display signal input terminal, a third power supply terminal, and a first pull-up node, and configured to write an active level signal provided by the third power supply terminal to the first pull-up node in response to control of an active level signal provided by the display signal input terminal;

wherein the first pull-up node is connected to the first pull-up back node; and the first level supply terminal is the third power supply terminal.

In a third aspect, the embodiments of the present disclosure further provide a gate driving circuit, including: a plurality of shift register units that are cascaded, wherein each of the plurality of shift register units is the shift register unit provided in the first aspect or the second aspect.

In a fourth aspect, the embodiments of the present disclosure further provide a gate driving method based on the shift register unit provided in the first aspect, including:

forming, by the first switch circuit, a path between the first pull-up node and the first pull-up back node in response to control of an active level signal provided by the switch signal input terminal, and writing, by the sensing control circuit, an active level signal provided by the second sensing signal input terminal to the sensing control node in response to control of an active level signal provided by the first sensing signal input terminal; and writing, by the first display input circuit, an active level signal provided by the third power supply terminal to the first pull-up node and the first pull-up back node in response to control of an active level signal provided by the display signal input terminal, and writing, by the first driving output circuit, a signal provided by the first driving clock signal input terminal to the first driving signal output terminal in response to control of an active level signal at the first pull-up back node.

writing, by the first sensing input circuit, an active level signal provided by the first level supply terminal to the first pull-up back node in response to control of an active level signal at the sensing control node and an active level signal provided by the first clock control signal input terminal; and cutting off, by the first switch circuit, the path between the first pull-up node and the first pull-up back node in response to control of an active level signal provided by the switch signal input terminal, and writing, by the first driving output circuit, a signal provided by the first driving clock signal input terminal to the first driving signal output terminal in response to control of an active level signal at the first pull-up back node.

DETAIL DESCRIPTION OF EMBODIMENTS

Figure 1:
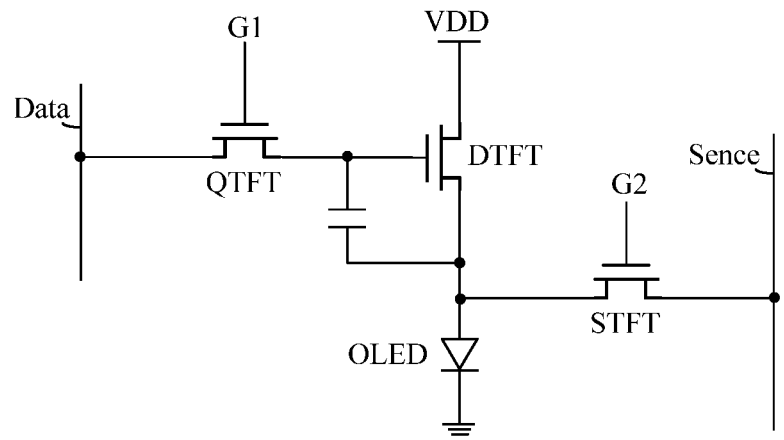
FIG. 1 is a schematic diagram showing a circuit structure of a pixel circuit in an OLED display panel.

In order to enable those of ordinary skill in the art to better understand the technical solutions of the present disclosure, a shift register unit, a gate driving circuit, a display panel, and a display device provided by the present disclosure are described in detail below with reference to the drawings.

The words "first", "second" and the like used in the embodiments of the present disclosure do not denote any order, quantity or importance, but are just used to distinguish between different elements. Similarly, the words "include", "comprise" and the like indicate that an element or object before the words covers elements or objects listed after the words or the equivalents thereof, but do not exclude other elements or objects. The words "connect", "couple", and the like are not restricted to physical or mechanical connection, but may also include electrical connection, whether direct or indirect.

The transistors adopted in the embodiments of the present disclosure may all be thin film transistors or field effect transistors or other devices having the same characteristics. In the embodiments, a coupling mode of a drain electrode and a coupling mode of a source electrode of each transistor are interchangeable, thus, there is actually no difference between the drain electrode and the source electrode of each transistor in the embodiments of the present disclosure. In the present disclosure, only for distinguishing between two electrodes other than a control electrode (i.e., a gate electrode) of a transistor, one of the two electrodes is referred to as a drain electrode, and the other is referred to as a source electrode. The thin film transistors adopted in the embodiments of the present disclosure may be N-type transistors or P-type transistors. In the embodiments of the present disclosure, when an N-type thin film transistor is adopted, the first electrode thereof may be a source electrode, and the second electrode thereof may be a drain electrode. A case where the thin film transistors are the N-type transistors is taken as an example for illustration in the following embodiments.

In the present disclosure, an "active level signal" refers to a signal capable of controlling a transistor to be turned on after being input to a control electrode of the transistor, and an "inactive level signal" refers to a signal capable of controlling the transistor to be turned off after being input to the control electrode thereof. For an N-type transistor, a high level signal is an active level signal, and a low level signal is an inactive level signal; and for a P-type transistor, a low level signal is an active level signal, and a high level signal is an inactive level signal.

The case where the transistors are N-type transistors is taken as an example for illustration in the following description. In such case, the active level signal refers to a high level signal, and the inactive level signal refers to a low level signal. It should be envisaged that timing of control signals needs to be adjusted accordingly when the P-type transistors are adopted. Specific details are not described herein, but should also fall within the protection scope of the present disclosure.

Figure 2:
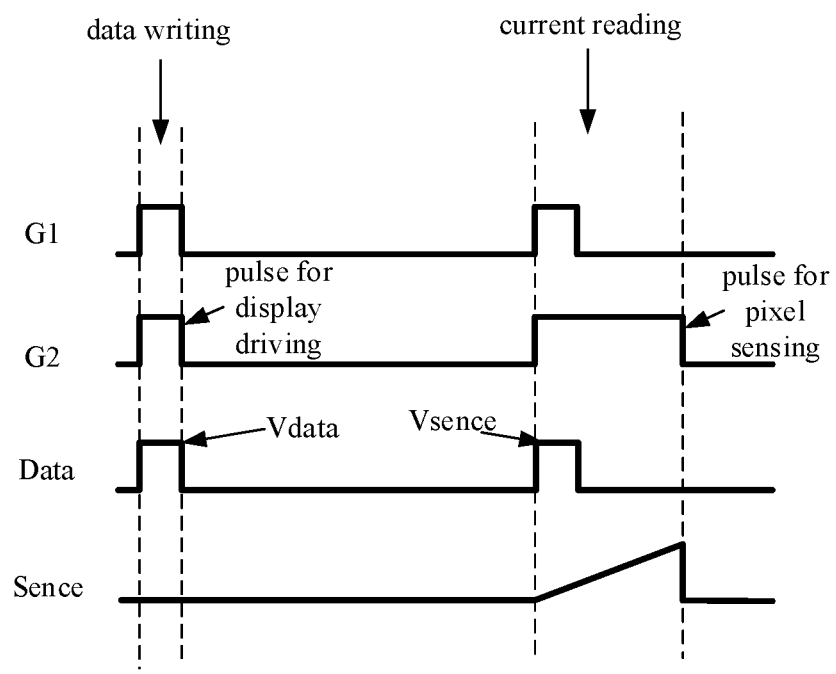
FIG. 2 is an operating timing diagram of the pixel circuit shown in FIG. 1.

FIG. 1 is a schematic diagram showing a circuit structure of a pixel circuit in an OLED display panel, and FIG. 2 is an operating timing diagram of the pixel circuit shown in FIG. 1. As shown in FIG. 1 and FIG. 2, for an OLED display panel with an external compensation function, one frame of image can be divided to two phases: a display driving phase and a blank phase. In the display driving phase, each row of pixel units in the display panel completes display driving; and in the blank phase, a certain row of pixel units in the display panel completes current extraction (i.e., sensing).

With reference to FIG. 1, the pixel circuit includes a display switching transistor QTFT (having a control electrode connected to a first gate line G1), a driving transistor DTFT, a sensing switching transistor STFT (having a control electrode connected to a second gate line G2), and a storage capacitor Cst. When external compensation needs to be performed on the pixel circuit, the pixel circuit includes at least the following two phases in an operating process; a pixel driving phase (including a data voltage writing process) and a pixel sensing phase (including a current reading process).

In the pixel driving phase, a data voltage Vdata in a data line Data needs to be written to a pixel unit; and in the pixel sensing phase, a test voltage Vsence needs to be written to the pixel unit through the data line Data, and an electrical signal at a drain electrode of the driving transistor needs to be read and input to a signal reading line Sence through the sensing switching transistor STFT. In the current reading process, an active level voltage needs to be written to a gate electrode of the sensing switching transistor STFT through the corresponding second gate line G2. It should be noted that a specific compensation process and principle of the external compensation performed on the pixel unit in the OLED display panel are not described in detail herein.

As can be seen from a signal applied to a second gate line G2 in FIG. 2, in one frame, one pulse signal (referred to as "a pulse for display driving") needs to be provided to the second gate line G2 in the display driving phase, and moreover, one pulse signal ("a pulse for pixel sensing") having a relatively wide pulse width also needs to be provided to the second gate line G2 in the pixel sensing phase.

Figure 3:
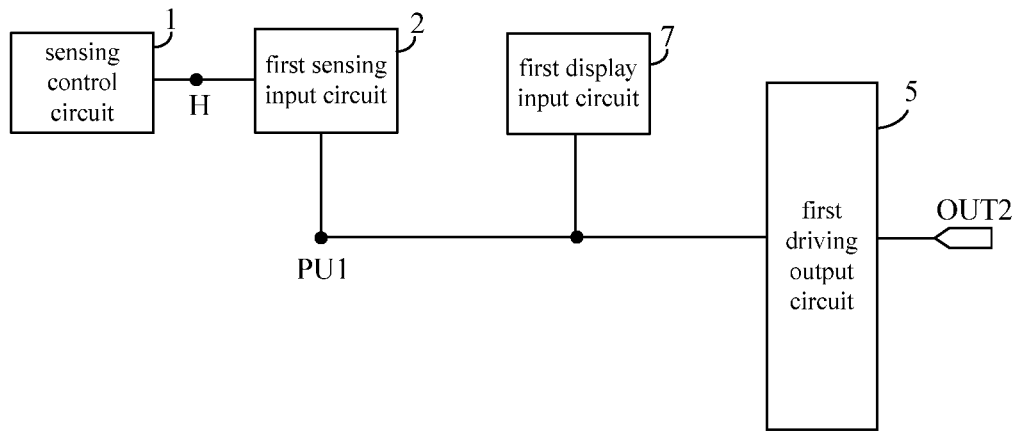
FIG. 3 is a schematic diagram showing a circuit structure of a shift register unit in the related art.

FIG. 3 is a schematic diagram showing a circuit structure of a shift register unit in the related art. As shown in FIG. 3, in the related art, the shift register unit includes a sensing control circuit 1, a first sensing input circuit 2, a first display input circuit 7, and a first driving output circuit 5. The sensing control circuit 1 is connected to the first sensing input circuit 2 at a sensing control node H, the first sensing input circuit 2, the first display input circuit 7, and the first driving output circuit 5 are connected at a first pull-up node PU1, the first driving output circuit 5 is provided with a first driving signal output terminal OUT2, and the first driving signal output terminal OUT2 is connected to a corresponding second gate line G2.

In the display driving phase, the first display input circuit 7 provides an active level signal to the first pull-up node PU1 to control the first driving signal output terminal OUT2 to output a pulse for display driving. In the pixel sensing phase, the first sensing input circuit 2 provides an active level signal to the first pull-up node PU1 to control the first driving output circuit 5 to output a pulse for pixel sensing.

It is found in practical applications that, in the pixel sensing phase, after the first sensing input circuit 2 finishes writing the active level signal to the first pull-up node PU1, the first pull-up node PU1 is in a floating state for a long period of time (the first driving output circuit outputs the pulse for display driving during this period of time). At this time, since the first pull-up node PU1 is connected to a relatively large number of circuit structures and remains the floating state for a relatively long period of time, noise interference at the first pull-up node PU1 is relatively serious. For example, an electrical device (e.g., a transistor) in the first display input circuit 7 may cause interference to a voltage at the first pull-up node PU1; at this time, a relatively large swing of the voltage at the first pull-up node PU1 occurs, which affects output of the first driving output circuit 5. For example, when the voltage at the first pull-up node PU1 turns into an inactive level state due to noise interference, the first driving output circuit 5 cannot perform normal output. Thus, how to ensure stable output of the first driving output circuit 5 in the pixel sensing phase is an urgent technical problem to be solved by those of ordinary skill in the art.

In view of the above technical problem, the embodiments of the present disclosure provide corresponding solutions, and the embodiments will be described in detail below with reference to the drawings.

Figure 4:
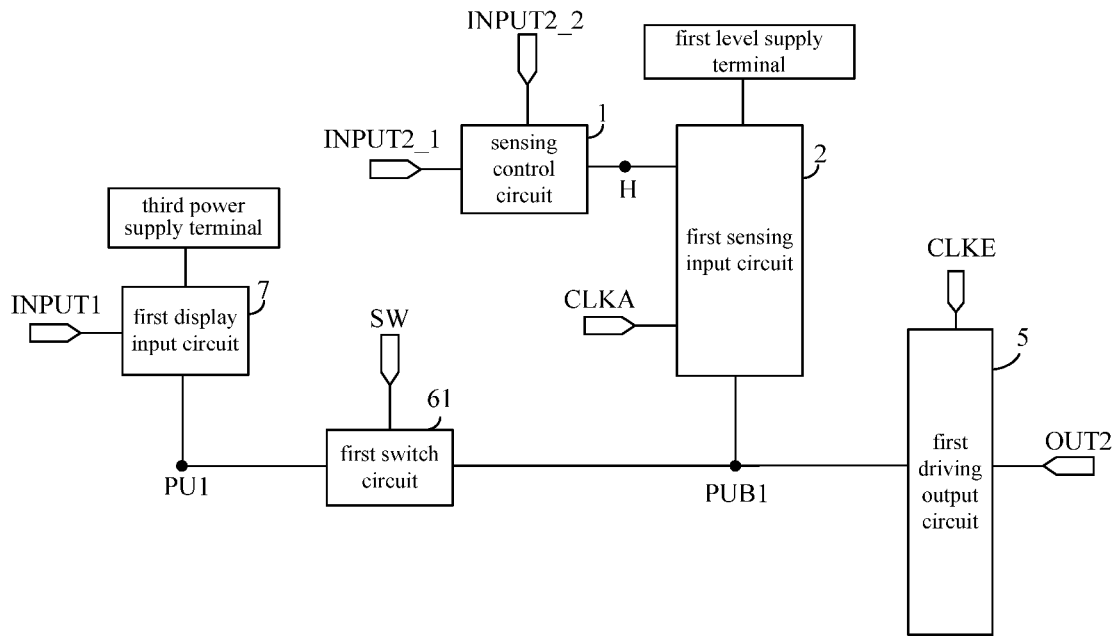
FIG. 4 is a schematic diagram showing a circuit structure of a shift register unit according to the embodiments of the present disclosure.

FIG. 4 is a schematic diagram showing a circuit structure of a shift register unit according to the embodiments of the present disclosure. As shown in FIG. 4, the shift register unit includes: a sensing control circuit 1, a first sensing input circuit 2, a first display input circuit 7, a first switch circuit 61, and a first driving output circuit 5.

The sensing control circuit 1 is connected to a first sensing signal input terminal INPUT2_1, a second sensing signal input terminal INPUT2_2, and a sensing control node H, and is configured to write an active level signal provided by the second sensing signal input terminal INPUT2_2 to the sensing control node H in response to control of an active level signal provided by the first sensing signal input terminal INPUT2_1.

The first sensing input circuit 2 is connected to a first level supply terminal, a first clock control signal input terminal CLKA, the sensing control node H, and a first pull-up back node PUB1, and is configured to write an active level signal provided by the first level supply terminal to the first pull-up back node PUB1 in response to control of an active level signal at the sensing control node H and an active level signal provided by the first clock control signal input terminal CLKA.

The first display input circuit 7 is connected to a display signal input terminal INPUT1, a third power supply terminal, and a first pull-up node PU1, and is configured to write an active level signal provided by the third power supply terminal to the first pull-up node PU1 in response to control of an active level signal provided by the display signal input terminal INPUT1.

The first switch circuit 61 is connected in series between the first pull-up node PU1 and the first pull-up back node PUB1, is connected to a switch signal input terminal SW, and is configured to control connection and disconnection between the first pull-up node PU1 and the first pull-up back node PUB1 in response to control of a signal provided by the switch signal input terminal SW.

The first driving output circuit 5 is connected to the first pull-up back node PUB1, a first driving clock signal input terminal CLKE, and a first driving signal output terminal OUT2, and is configured to write a signal provided by the first driving clock signal input terminal CLKE to the first driving signal output terminal OUT2 in response to control of an active level signal at the first pull-up back node PUB1.

In the embodiments of the present disclosure, the first display input circuit 7 is connected to the first pull-up node PU1, the first sensing input circuit 2 and the first driving output circuit 5 are both connected to the first pull-up back node PUB1, the first driving output circuit 5 operates under the control of the active level signal at the first pull-up back node PUB1, and the first switch circuit 61 is connected in series between the first pull-up node PU1 and the first pull-up back node PUB1, and can control the connection and the disconnection between the first pull-up node PU1 and the first pull-up back node PUB1.

In a display driving phase, the switch signal input terminal SW provides an active level signal to turn on the first switch circuit 61, at this time, a path is formed between the first pull-up node PU1 and the first pull-up back node PUB1, the first display input circuit 7 provides an active level signal to the first pull-up node PU1, and the active level signal can be written to the first pull-up back node PUB1 through the first switch circuit 61, so as to control the first driving output circuit 5 to output a pulse for display driving.

After the display driving phase ends and a pixel sensing phase begins, the switch signal input terminal SW provides an inactive level signal to turn off the first switch circuit 61, so that the path between the first pull-up node PU1 and the first pull-up back node PUB1 is cut off. The first sensing input circuit 2 provides an active level signal to the first pull-up back node PUB1, at this time, since the path between the first pull-up node PU1 and the first pull-up back node PUB1 is cut off, the active level signal cannot be written to the first pull-up node PU1; and then, the first driving output circuit 5 outputs a pulse for pixel sensing under the control of the active level signal at the first pull-up back node PUB1.

In the process of outputting the pulse for pixel sensing by the first driving output circuit 5, the path between the first pull-up back node PUB1 and the first pull-up node PU1 remains an off state, so that an electrical device in the first display input circuit 7 cannot cause interference to a voltage at the first pull-up back node PUB1. In other words, in the process of outputting the pulse for pixel sensing by the first driving output circuit 5, noise interference at the first pull-up back node PUB1 configured to control the operation of the first driving output circuit 5 in the embodiments of the present disclosure is less serious than that at the first pull-up node PU1 configured to control the operation of the first driving output circuit 5 in the related art. Thus, compared to the related art, stability of the process of outputting the pulse for pixel sensing by the first driving output circuit 5 is better in the present disclosure.

Figure 5:
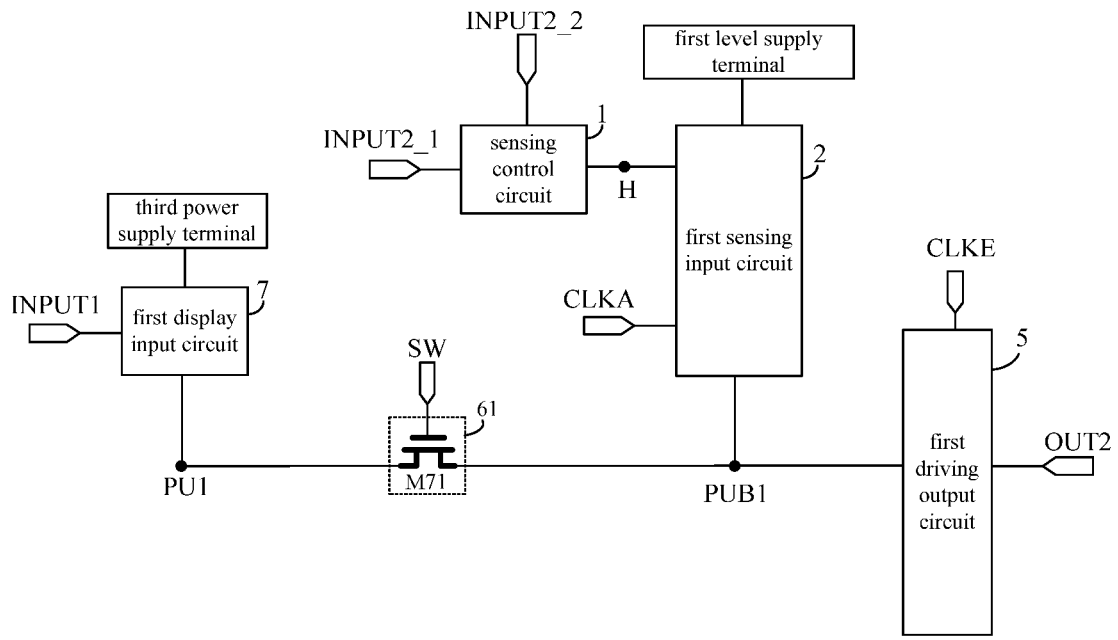
FIG. 5 is a schematic diagram showing another circuit structure of the shift register unit according to the embodiments of the present disclosure.

FIG. 5 is a schematic diagram showing another circuit structure of the shift register unit according to the embodiments of the present disclosure. As shown in FIG. 5, in some embodiments, the first switch circuit 61 includes: a seventy-first transistor M71; and a control electrode of the seventy-first transistor M71 is connected to the switch signal input terminal SW, a first electrode of the seventy-first transistor M71 is connected to the first pull-up node PU1, and a second electrode of the seventy-first transistor M71 is connected to the first pull-up back node PUB1.

When the switch signal input terminal SW provides the active level signal, the seventy-first transistor M71 is turned on, and the path between the first pull-up node PU1 and the first pull-up back node PUB1 is formed; and when the switch signal input terminal SW provides the inactive level signal, the seventy-first transistor M71 is turned off, and the path between the first pull-up node PU1 and the first pull-up back node PUB1 is cut off.

Figure 6:
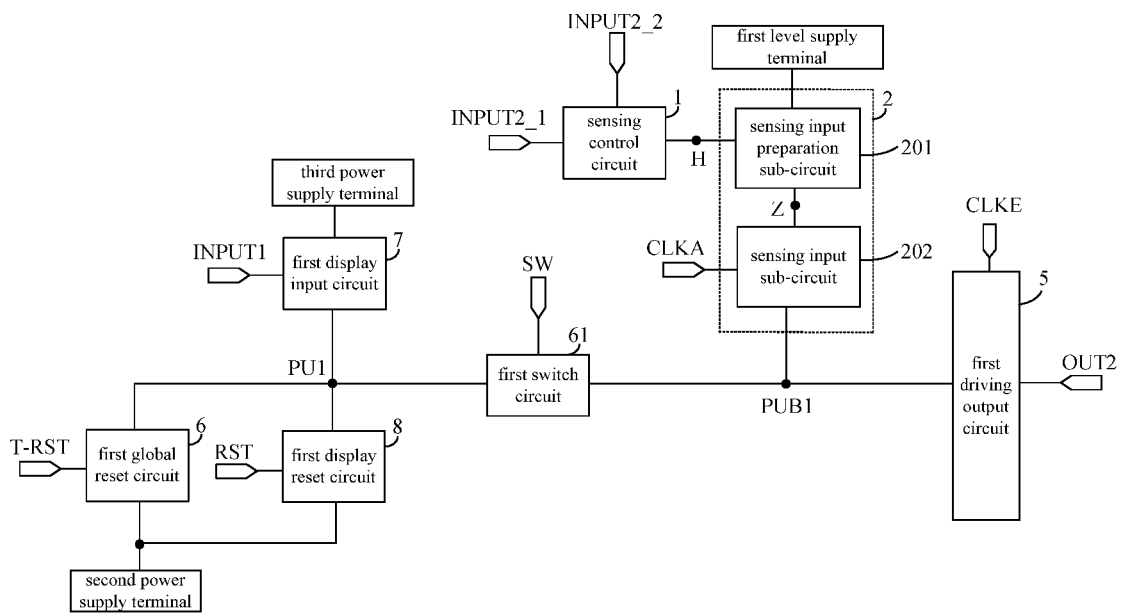
FIG. 6 is a schematic diagram showing still another circuit structure of the shift register unit according to the embodiments of the present disclosure.

FIG. 6 is a schematic diagram showing still another circuit structure of the shift register unit according to the embodiments of the present disclosure. As shown in FIG. 6, in some embodiments, the first sensing input circuit 2 includes: a sensing input preparation sub-circuit 201 and a sensing input sub-circuit 202.

The sensing input preparation sub-circuit 201 is connected to a sensing preparation node Z, the sensing control node H, and the first level supply terminal, and is configured to write a signal provided by the first level supply terminal to the sensing preparation node Z in response to control of an active level signal provided by the sensing control node H.

The sensing input sub-circuit 202 is connected to the sensing preparation node Z, the first clock control signal input terminal CLKA, and the first pull-up back node PUB1, and is configured to write a signal at the sensing preparation node Z to the first pull-up back node PUB1 in response to control of an active level signal provided by the first clock control signal input terminal CLKA.

In some embodiments, the first level supply terminal may be the third power supply terminal (which provides an active level voltage VDD1) or the first clock control signal input terminal CLKA.

In some embodiments, the shift register unit further includes: a first display reset circuit 8 and a first global reset circuit 6.

The first display reset circuit 8 is connected to a display reset signal input terminal RST, a second power supply terminal, and the first pull-up node PU1, and is configured to write an inactive level signal provided by the second power supply terminal to the first pull-up node PU1 in response to control of an active level signal provided by the display reset signal input terminal RST.

The first global reset circuit 6 is connected to a global reset signal input terminal T-RST, the second power supply terminal, and the first pull-up node PU1, and is configured to write an inactive level signal provided by the second power supply terminal to the first pull-up node PU1 in response to control of an active level signal provided by the global reset signal input terminal T-RST.

Figure 7:
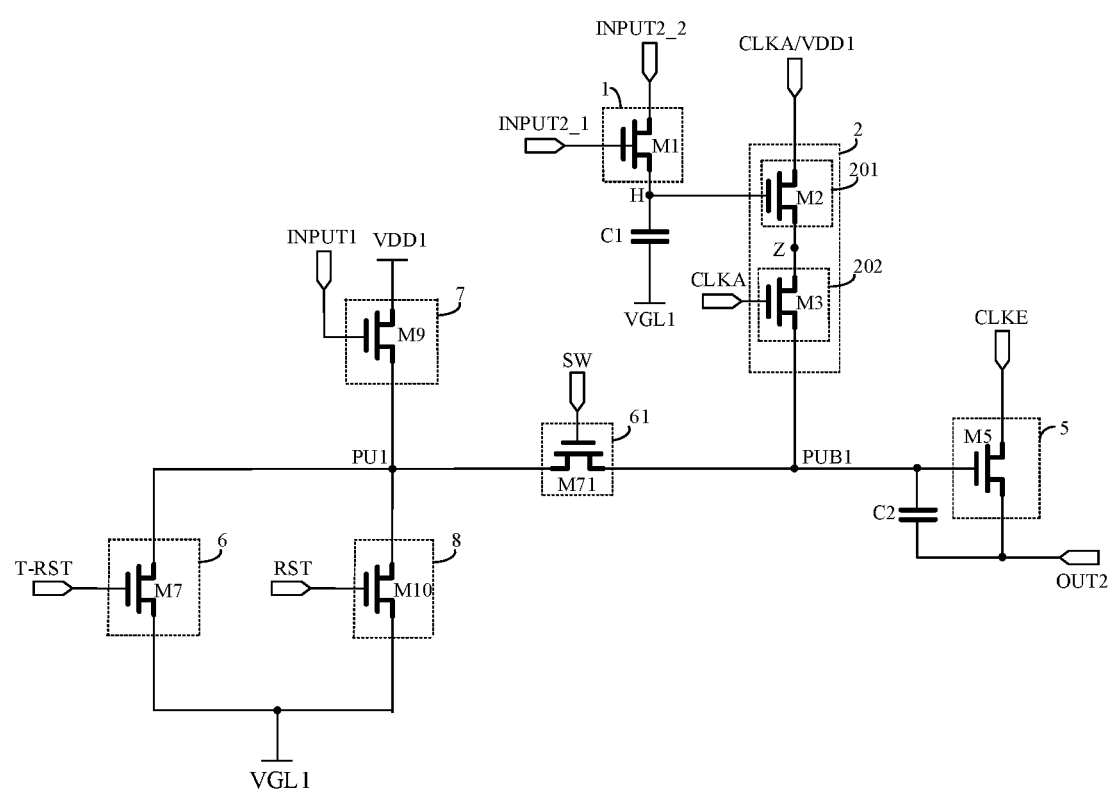
FIG. 7 is a schematic diagram showing yet another circuit structure of the shift register unit according to the embodiments of the present disclosure.

FIG. 7 is a schematic diagram showing yet another circuit structure of the shift register unit according to the embodiments of the present disclosure. As shown in FIG. 7, the shift register unit shown in FIG. 7 is an exemplary implementation based on the shift register unit shown in FIG. 6.

In an embodiment, the sensing control circuit 1 includes a first transistor M1.

A control electrode of the first transistor M1 is connected to the first sensing signal input terminal INPUT2_1, a first electrode of the first transistor M1 is connected to the second sensing signal input terminal INPUT2_2, and a second electrode of the first transistor M1 is connected to the sensing control node H.

In an embodiment, the first sensing input circuit 2 includes a second transistor M2 and a third transistor M3.

A control electrode of the second transistor M2 is connected to the sensing control node H, a first electrode of the second transistor M2 is connected to the first level supply terminal, and a second electrode of the second transistor M2 is connected to the sensing preparation node Z.

A control electrode of the third transistor M3 is connected to the first clock control signal input terminal CLKA, a first electrode of the third transistor M3 is connected to the sensing preparation node Z, and a second electrode of the third transistor M3 is connected to the first pull-up back node PUB1.

In an embodiment, the first switch circuit 61 includes the seventy-first transistor M71.

The control electrode of the seventy-first transistor M71 is connected to the switch signal input terminal SW, the first electrode of the seventy-first transistor M71 is connected to the first pull-up node PU1, and the second electrode of the seventy-first transistor M71 is connected to the first pull-up back node PUB1.

In an embodiment, the first global reset circuit 6 includes a seventh transistor M7.

A control electrode of the seventh transistor M7 is connected to the global reset signal input terminal T-RST, a first electrode of the seventh transistor M7 is connected to the first pull-up node PU1, and a second electrode of the seventh transistor M7 is connected to the second power supply terminal.

In an embodiment, the first display input circuit 7 includes a ninth transistor M9.

A control electrode of the ninth transistor M9 is connected to the display signal input terminal INPUT1, a first electrode of the ninth transistor M9 is connected to the third power supply terminal, and a second electrode of the ninth transistor M9 is connected to the first pull-up node PU1.

In an embodiment, the first display reset circuit 8 includes a tenth transistor M10.

A control electrode of the tenth transistor M10 is connected to the display reset signal input terminal RST, a first electrode of the tenth transistor M10 is connected to the first pull-up node PU1, and a second electrode of the tenth transistor M10 is connected to the second power supply terminal.

In an embodiment, the first driving output circuit 5 includes a fifth transistor M5.

A control electrode of the fifth transistor M5 is connected to the first pull-up back node PUB1, a first electrode of the fifth transistor M5 is connected to the first driving clock signal input terminal CLKE, and a second electrode of the fifth transistor M5 is connected to the first driving signal output terminal OUT2.

In some embodiments, a first capacitor C1 is disposed at the sensing control node H, and can play a role of stabilizing a voltage at the sensing control node H.

In some embodiments, a second capacitor C2 is disposed at the first driving signal output terminal OUT2, and is beneficial to improving stability of a signal output by the first driving signal output terminal OUT2.

In some embodiments, the first level supply terminal may be the third power supply terminal (which provides the active level voltage VDD1) or the first clock control signal input terminal CLKA.

Figure 8:
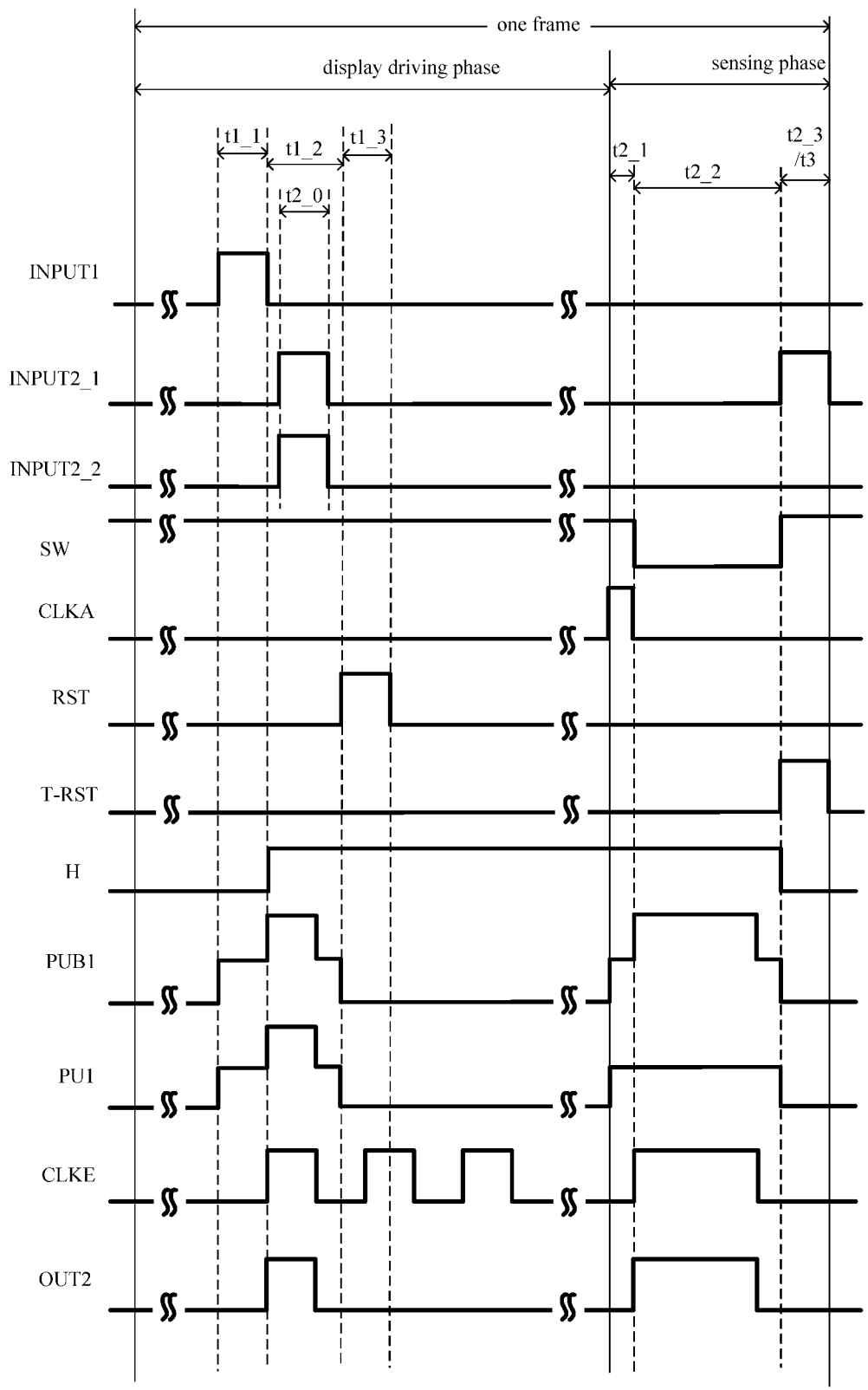
FIG. 8 is an operating timing diagram of the shift register unit shown in FIG. 7.

FIG. 8 is an operating timing diagram of the shift register unit shown in FIG. 7. As shown in FIG. 8, illustration is given by taking a case where the second power supply terminal provides a low level voltage VGL1, the third power supply terminal provides a high level voltage VDD1 and the first level supply terminal is the first clock control signal input terminal CLKA as an example.

An operating process of the shift register unit includes: a display driving phase, a sensing driving phase, and a global reset phase t3.

The display driving phase includes: a display input sub-phase t1_1, a display output sub-phase t1_2, and a display reset sub-phase t1_3, which are sequentially carried out; and the sensing driving phase includes: a sensing preparation sub-phase t2_0, a sensing input sub-phase t2_1, a sensing output sub-phase t2_2, and a sensing control reset sub-phase t2_3, which are sequentially carried out.

In the display input sub-phase t1_1, the switch signal input terminal SW provides a high level signal, the seventy-first transistor M71 is turned on, and the path between the first pull-up node PU1 and the first pull-up back node PUB1 is formed; and meanwhile, the display signal input terminal INPUT1 provides a high level signal, the ninth transistor M9 is turned on, the high level voltage VDD1 is written to the first pull-up node PU1 through the ninth transistor M9, and a voltage at the first pull-up node PU1 is in a high level state.

Because the path between the first pull-up node PU1 and the first pull-up back node PUB1 is formed, a voltage at the first pull-up back node PUB1 is also in a high level state, at this time, the fifth transistor M5 is turned on, and a low level signal provided by the first driving clock signal input terminal CLKE is written to the first driving signal output terminal OUT2 through the fifth transistor M5, that is, the first driving signal output terminal OUT2 outputs a low level signal.

In the display output sub-phase t1_2, the switch signal input terminal SW provides a high level signal, the seventy-first transistor M71 remains on state, and the path between the first pull-up node PU1 and the first pull-up back node PUB1 remains; and meanwhile, the display signal input terminal INPUT1 provides a low level signal, the ninth transistor M9 is turned off, at this time, the first pull-up node PU1 and the first pull-up back node PUB1 are both in a floating state and maintain a high level, and accordingly, the fifth transistor M5 remains on state.

At the beginning of the display output sub-phase t1_2, the signal provided by the first driving clock signal input terminal CLKE is changed from the low level signal to a high level signal, the voltages at the first pull-up node PU1 and the first pull-up back node PUB1 are both pulled up to a higher level under a bootstrap action of the second capacitor C2, and the first driving signal output terminal OUT2 outputs a high level signal (outputs a pulse for display driving).

After the display output sub-phase t1_2 is carried out for a period of time, the signal provided by the first driving clock signal input terminal CLKE is changed from the high level signal to a low level signal, the voltages at the first pull-up node PU1 and the first pull-up back node PUB1 are both pulled down to the initial high level voltages under the bootstrap action of the second capacitor C2, the fifth transistor M5 remains on state, and the first driving signal output terminal OUT2 outputs a low level signal.

In the display reset sub-phase t1_3, the display reset signal input terminal provides a high level signal, the tenth transistor M10 is turned on, the low level voltage VGL1 is written to the first pull-up node PU1 and the first pull-up back node PUB1 through the tenth transistor M10, the voltages at the first pull-up node PU1 and the first pull-up back node PUB1 are both in a low level state, so the fifth transistor M5 is turned off. At this time, the first driving signal output terminal OUT2 is in a floating state, and a voltage at the first driving signal output terminal OUT2 maintains the low level state as in the previous phase, so the first driving signal output terminal OUT2 outputs a low level signal.

In the sensing preparation sub-phase t2_0, the first sensing signal input terminal INPUT2_1 provides a high level signal, the first transistor M1 is turned on, a high level signal provided by the second sensing signal input terminal INPUT2_2 is written to the sensing control node through the first transistor M1, and a voltage at the sensing control node H is in a high level state, so the second transistor M2 is turned on. Moreover, since the first clock control signal input terminal CLKA provides a low level signal, the third transistor M3 is turned off.

In the sensing input sub-phase t2_1, the first clock control signal input terminal CLKA provides a high level signal, so the third transistor M3 is turned on. At this time, since the voltage at the sensing control node H is in the high level state, the second transistor M2 remains on state, so the high level signal provided by the first clock control signal input terminal CLKA can be written to the first pull-up back node PUB1 through the second transistor M2 and the third transistor M3, that is, the voltage at the first pull-up back node PUB1 is in a high level state. It should be noted that, since the seventy-first transistor M71 remains on state at this time, the voltage at the first pull-up node PU1 is also in a high level state.

At this time, the fifth transistor M5 is turned on, and a low level signal provided by the first driving clock signal input terminal CLKE is written to the first driving signal output terminal OUT2 through the fifth transistor M5, that is, the first driving signal output terminal OUT2 outputs a low level signal.

In the sensing output sub-phase t2_2, the switch signal input terminal SW provides a low level signal, the seventy-first transistor M71 is turned off, and the path between the first pull-up node PU1 and the first pull-up back node PUB1 is cut off.

At the beginning of the sensing output sub-phase t2_2, the signal provided by the first driving clock signal input terminal CLKE is changed from the low level signal to a high level signal, the voltage at the first pull-up back node PUB1 is pulled up to a higher level under the bootstrap action of the second capacitor C2, and the first driving signal output terminal OUT2 outputs a high level signal (outputs a pulse for pixel sensing). It should be noted that, since the path between the first pull-up node PU1 and the first pull-up back node PUB1 is cut off, the voltage at the first pull-up node PU1 is not pulled up.

After the sensing output sub-phase t2_2 is carried out for a period of time, the signal provided by the first driving clock signal input terminal CLKE is changed from the high level signal to a low level signal, and the voltage at the first pull-up back node PUB1 is pulled down to the initial high level voltage under the bootstrap action of the second capacitor C2, the fifth transistor M5 remains on state, and the first driving signal output terminal OUT2 outputs a low level signal.

It should be noted that, during the sensing output sub-phase t2_2, since the seventy-first transistor M71 is turned off to cut off the path between the first pull-up node PU1 and the first pull-up back node PUB1, interference caused by an electrical device in a circuit structure (e.g., the first display input circuit 7, the first global reset circuit 6, or the first display reset circuit 8) connected to the first pull-up node PU1 to the voltage at the first pull-up back node PUB1 can be effectively shielded, which is beneficial to improving the stability of the process of outputting the pulse for pixel sensing by the first driving output circuit 5.

In the sensing control reset sub-phase t2_3, the first sensing signal input terminal INPUT2_1 provides a high level signal, the first transistor M1 is turned on, a low level signal provided by the second sensing signal input terminal INPUT2_2 is written to the sensing control node H through the first transistor M1, and the voltage at the sensing control node H is in a low level state, so the second transistor M2 is turned off. Moreover, since the first clock control signal input terminal CLKA provides a low level signal, the third transistor M3 is also turned off.

In the global reset phase t3, the switch signal input terminal SW provides a high level signal, the seventy-first transistor M71 is turned on, and the path between the first pull-up node PU1 and the first pull-up back node PUB1 is formed. The global reset signal input terminal provides a high level signal, so the seventh transistor M7 is turned on, the low level voltage VGL1 is written to the first pull-up node PU1 through the seventh transistor M7, and the voltage at the first pull-up node PU1 is in a low level state. Since the path between the first pull-up node PU1 and the first pull-up back node PUB1 is formed, the voltage at the first pull-up back node PUB1 is in a low level state. Accordingly, the fifth transistor M5 is turned off. At this time, the first driving signal output terminal OUT2 is in the floating state, and the voltage at the first driving signal output terminal OUT2 maintains the low level state as in the previous phase, so the first driving signal output terminal OUT2 outputs a low level signal.

It should be noted that a case illustrated by FIG. 8 where the sensing preparation sub-phase t2_0 is within the display output sub-phase t1_2 and the sensing control reset sub-phase t2_3 is carried out synchronously with the global reset phase t3 is only for the purpose of illustration, and does not limit the technical solutions of the present disclosure.

In the embodiments of the present disclosure, it only needs to be ensured that the display input sub-phase t1_1, the display output sub-phase t1_2, and the display reset sub-phase t1_3 are sequentially carried out and are within the display driving phase, the sensing preparation sub-phase t2_0, the sensing input sub-phase t2_1, the sensing output sub-phase t2_2, and the sensing control reset sub-phase t2_3 are sequentially carried out, the sensing preparation sub-phase t2_0 is within the display driving phase, the sensing input sub-phase t2_1 and the sensing output sub-phase t2_2 are within the sensing phase, and the global reset phase t3 is carried out after the sensing output sub-phase t2_2.

Figure 9:
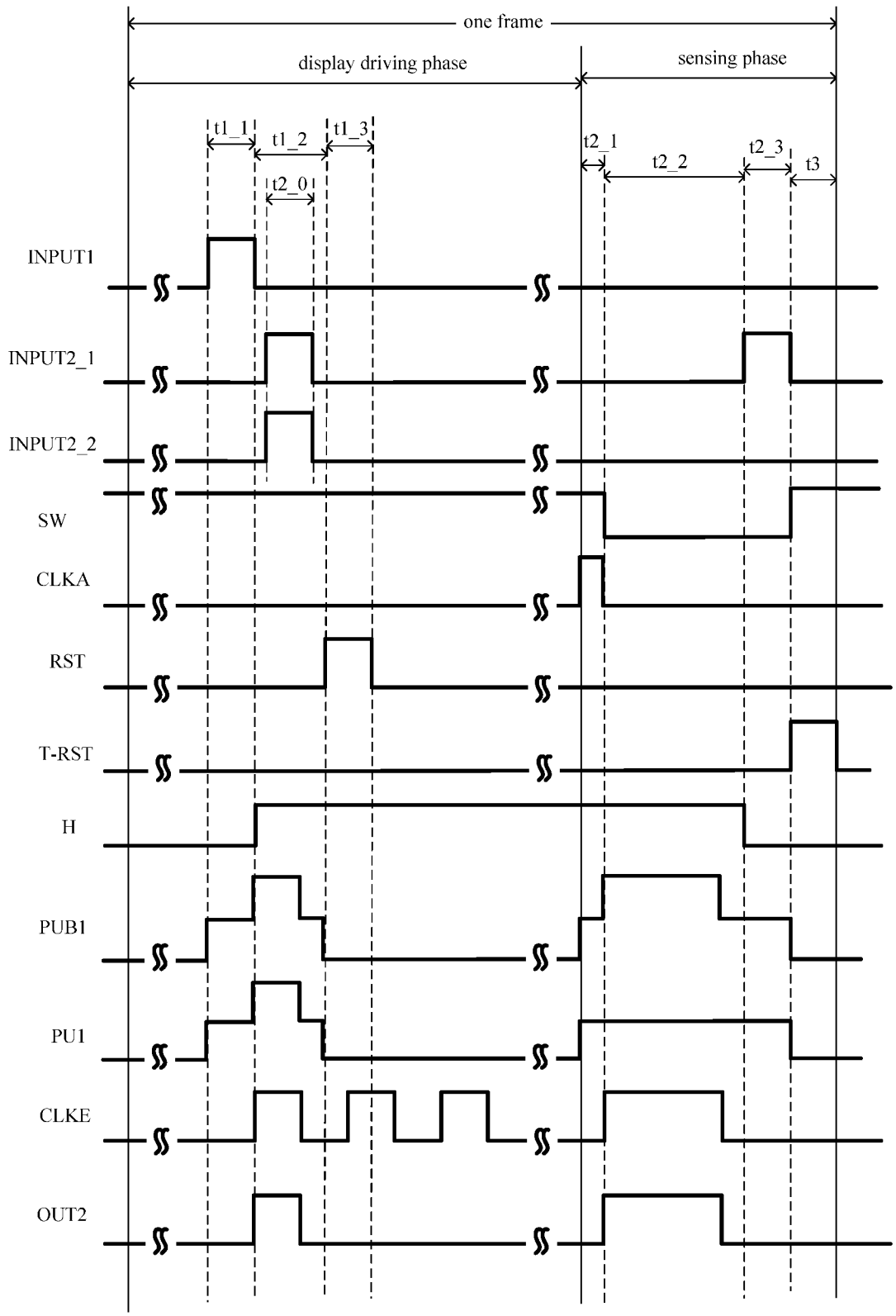
FIGS. 9 to 11 are another three operating timing diagrams of the shift register unit shown in FIG. 7.
Figure 10:
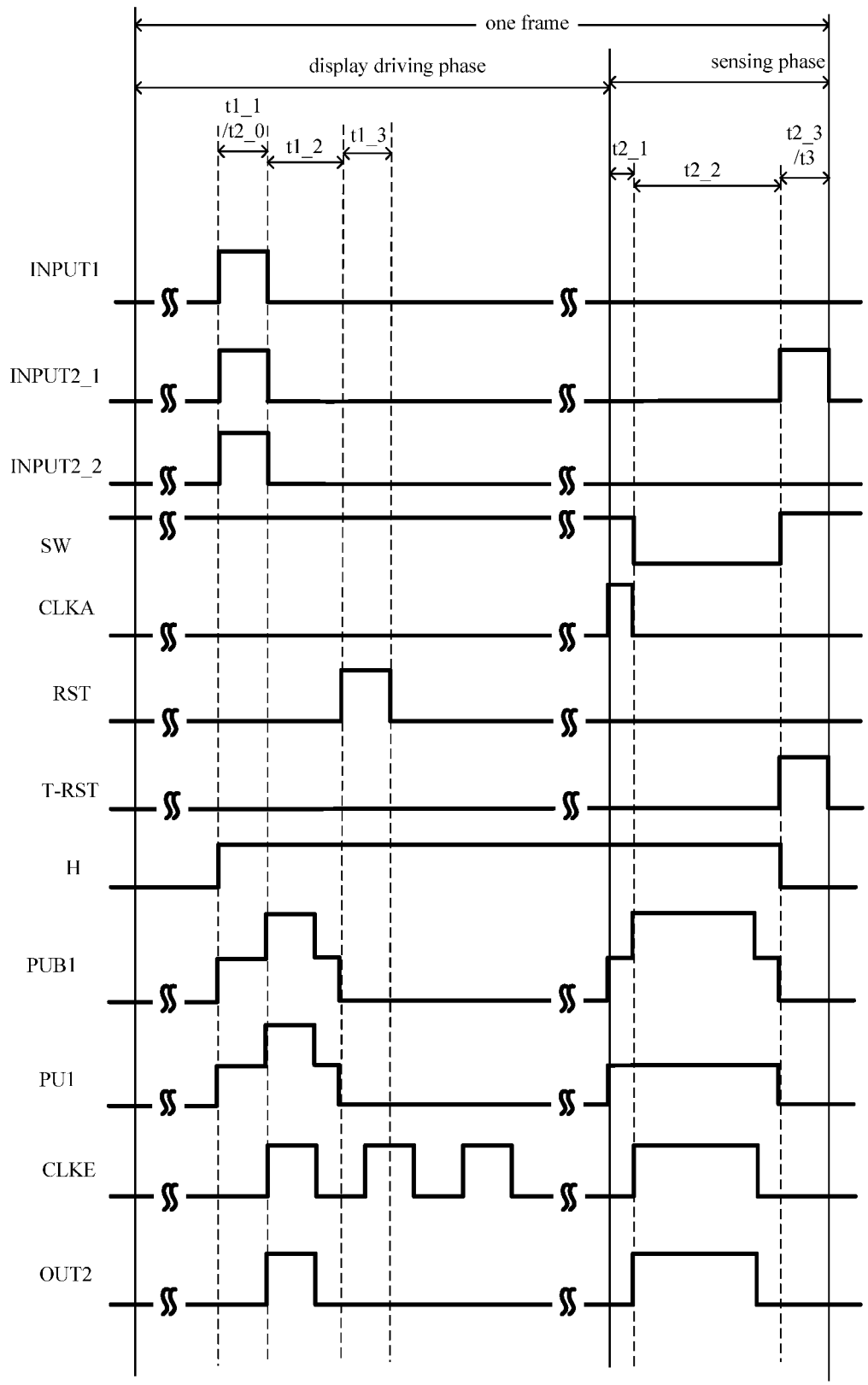
Figure 11:
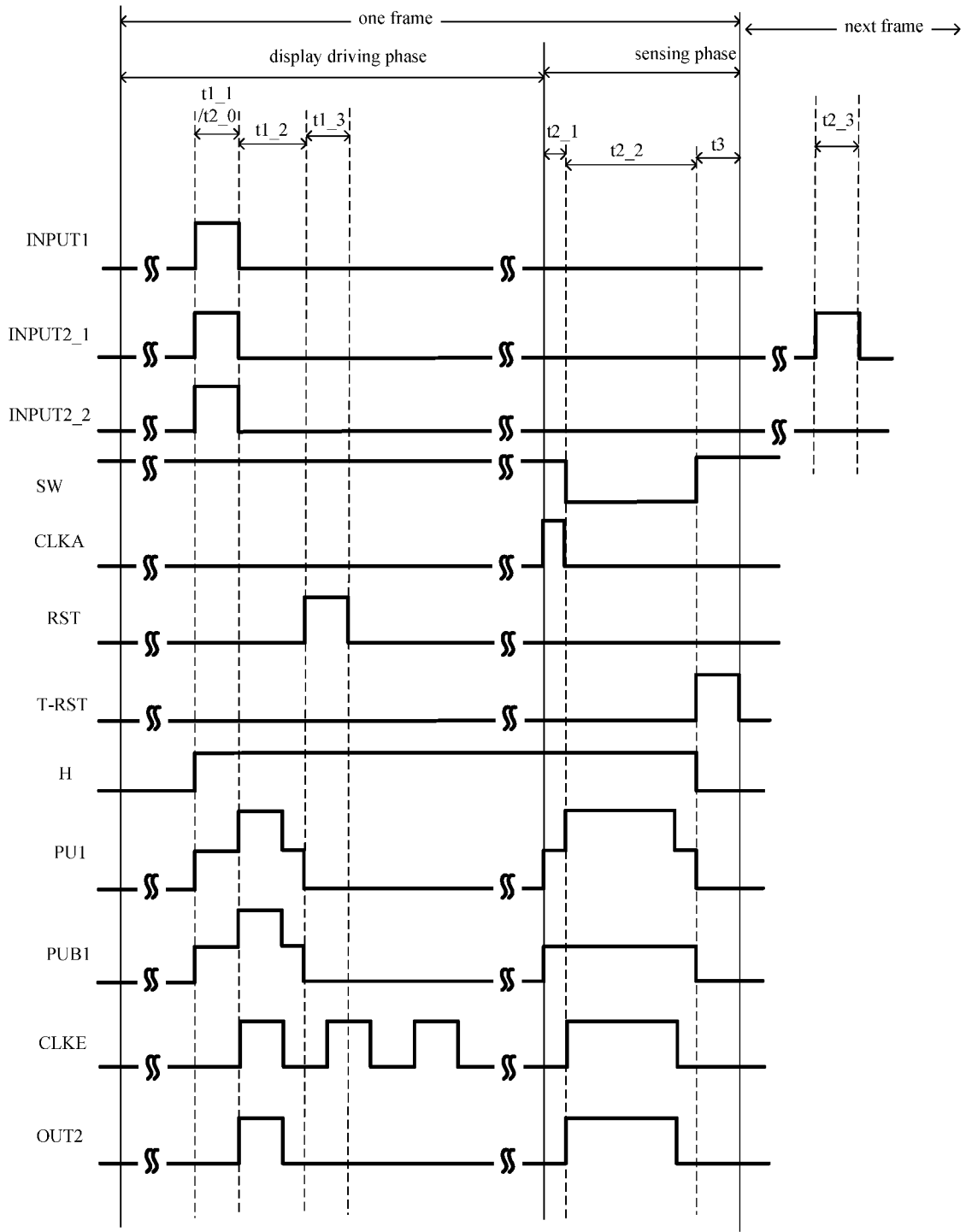

FIGS. 9 to 11 are another three operating timing diagrams of the shift register unit shown in FIG. 7. With reference to FIGS. 9 to 11, FIG. 9 illustrates a case where the sensing control reset sub-phase t2_3 is carried out before the global reset phase t3; FIG. 10 illustrates a case where the sensing preparation sub-phase t2_0 is carried out before the display output sub-phase t1_2 (the sensing preparation sub-phase t2_0 may be carried out synchronously with the display input sub-phase t1_1); and FIG. 11 illustrates a case where the sensing control reset sub-phase t2_3 is carried out after the global reset phase t3, and the sensing control reset sub-phase t2_3 may be carried out in the display driving phase of the next frame. All those cases should belong to the protection scope of the present disclosure. Apparently, other operating timing may also be adopted in the technical solutions of the present disclosure (for example, the sensing preparation sub-phase t2_0 may be carried out after the display output sub-phase t1_2), which will not be listed one by one here.

Figure 12:
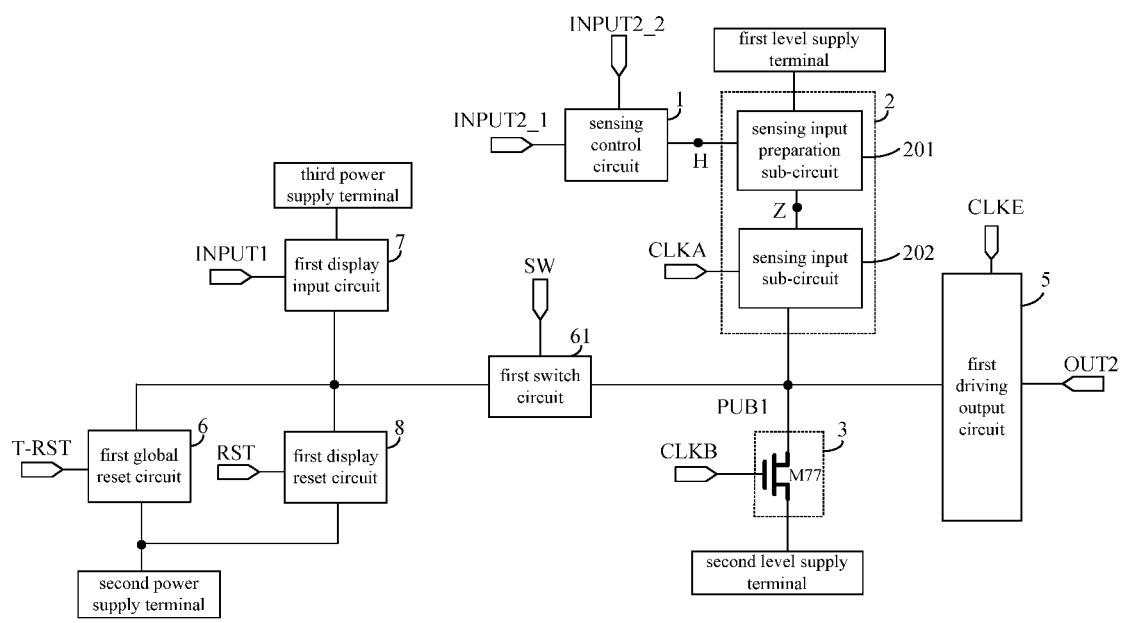
FIG. 12 is a schematic diagram showing yet another circuit structure of the shift register unit according to the embodiments of the present disclosure.

FIG. 12 is a schematic diagram showing yet another circuit structure of the shift register unit according to the embodiments of the present disclosure. As shown in FIG. 12, in some embodiments, in addition to the first switch circuit 61, the shift register unit is further provided with a first sensing reset circuit 3.

As can be seen from the above description of the shift register unit shown in FIG. 7 and the operating process thereof, the global reset signal input terminal writes the low level voltage VGL1 to the first pull-up back node PUB1 through the first switch circuit 61 in the global reset phase t3; that is, the first pull-up back node PUB1 depends on the first global reset circuit 6 to achieve reset, and meanwhile, the first switch circuit 61 needs to be in an on state in the global reset phase.

Still with reference to FIGS. 8 to 11, it is found in practical applications that, in order to enable the first driving output circuit 5 to stably output the pulse for pixel sensing in the sensing output sub-phase t2_2, a time point at which the first switch circuit 61 is switched from the off state to the on state needs to be after the sensing output sub-phase t2_2 to ensure that the first switch circuit 61 is always in the off state in the sensing output sub-phase t2_2. In addition, in order to guarantee enough time for the first global reset circuit to write the low level voltage VGL1 to the first pull-up back node PUB1 in the global reset phase, the time point at which the first switch circuit is switched from the off state to the on state needs to be as close as possible to the beginning of the global reset phase t3 possible. However, in general, an interval between the end of the sensing output sub-phase t2_2 and the beginning of the global reset phase t3 is short, for example, the end of the sensing output sub-phase t2_2 coincides with the beginning of the global reset phase t3 as shown in FIGS. 8, 10, and 11, and the interval between the end of the sensing output sub-phase t2_2 and the beginning of the global reset phase t3 is equal to a duration of one sensing control reset sub-phase t2_3 as shown in FIG. 9. Therefore, a relatively high accuracy is required for the time point at which the first switch circuit 61 is switched from the off state to the on state.

In order to effectively solve the above technical problem, the first pull-up back node PUB1 is provided with the first sensing reset circuit in the embodiments of the present disclosure. The first sensing reset circuit can be configured to reset the first pull-up back node PUB1, so that the reset of the first pull-up back node PUB1 no longer depends on the first global reset circuit 6 and the first switch circuit 61. Only the first sensing reset circuit 3 is described in detail below.

The first sensing reset circuit 3 is connected to a second clock control signal input terminal CLKB, a second level supply terminal, and the first pull-up back node PUB1, and is configured to write an inactive level signal provided by the second level supply terminal to the first pull-up back node PUB1 in response to control of an active level signal provided by the second clock control signal input terminal CLKB. The second level supply terminal can provide an inactive level signal for reset when the first pull-up back node PUB1 needs to be reset.

In some embodiments, the first sensing reset circuit 3 includes: a seventy-seventh transistor M77; and a control electrode of the seventy-seventh transistor M77 is connected to the second clock control signal input terminal CLKB, a first electrode of the seventy-seventh transistor M77 is connected to the first pull-up back node PUB1, and a second electrode of the seventy-seventh transistor M77 is connected to the second level supply terminal.

Figure 13:
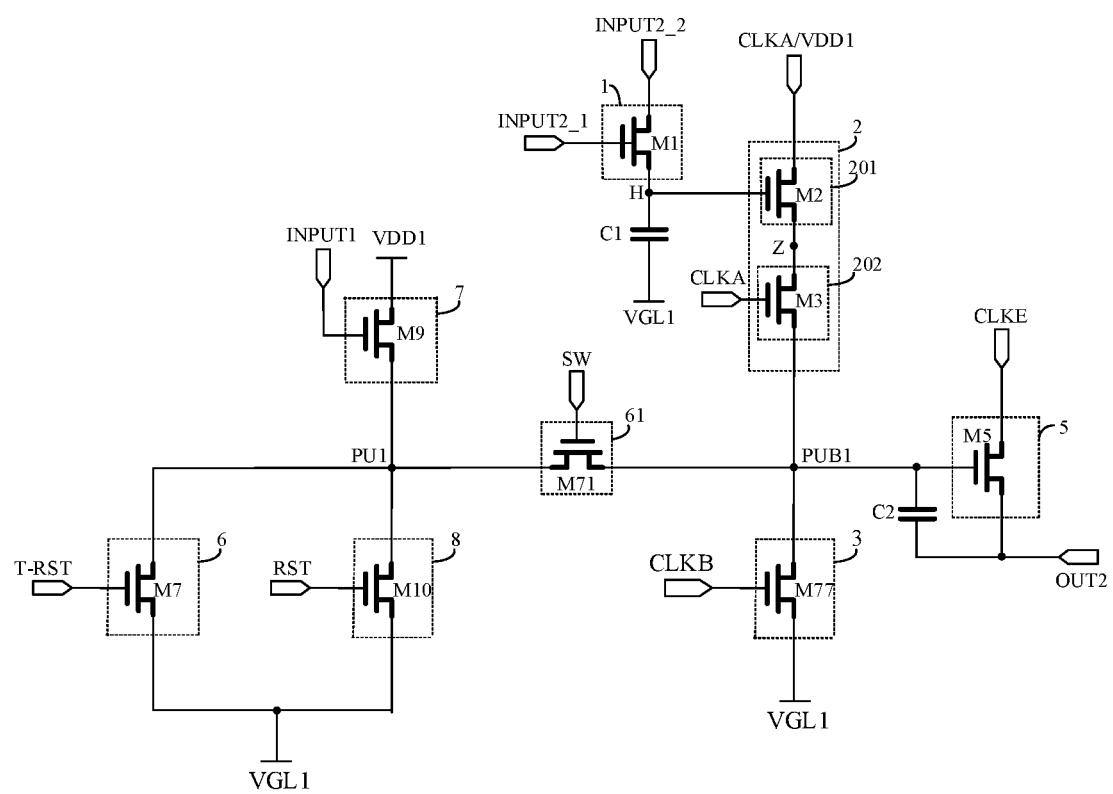
FIG. 13 is a schematic diagram showing yet another circuit structure of the shift register unit according to the embodiments of the present disclosure.

FIG. 13 is a schematic diagram showing yet another circuit structure of the shift register unit according to the embodiments of the present disclosure. As shown in FIG. 13, the shift register unit shown in FIG. 13 is an exemplary implementation based on the shift register unit shown in FIG. 12.

The sensing control circuit 1 includes the first transistor M1, the first sensing input circuit 2 includes the second transistor M2 and the third transistor M3, the first switch circuit 61 includes the seventy-first transistor M71, the first global reset circuit 6 includes the seventh transistor M7, the first display input circuit 7 includes the ninth transistor M9, the first display reset circuit 8 includes the tenth transistor M10, the first driving output circuit 5 includes the fifth transistor M5, and the first sensing reset circuit 3 includes the seventy-seventh transistor M77. The connection relationship between the transistors may refer to the content of the above embodiments, and thus will not be repeated here.

Figure 14A:
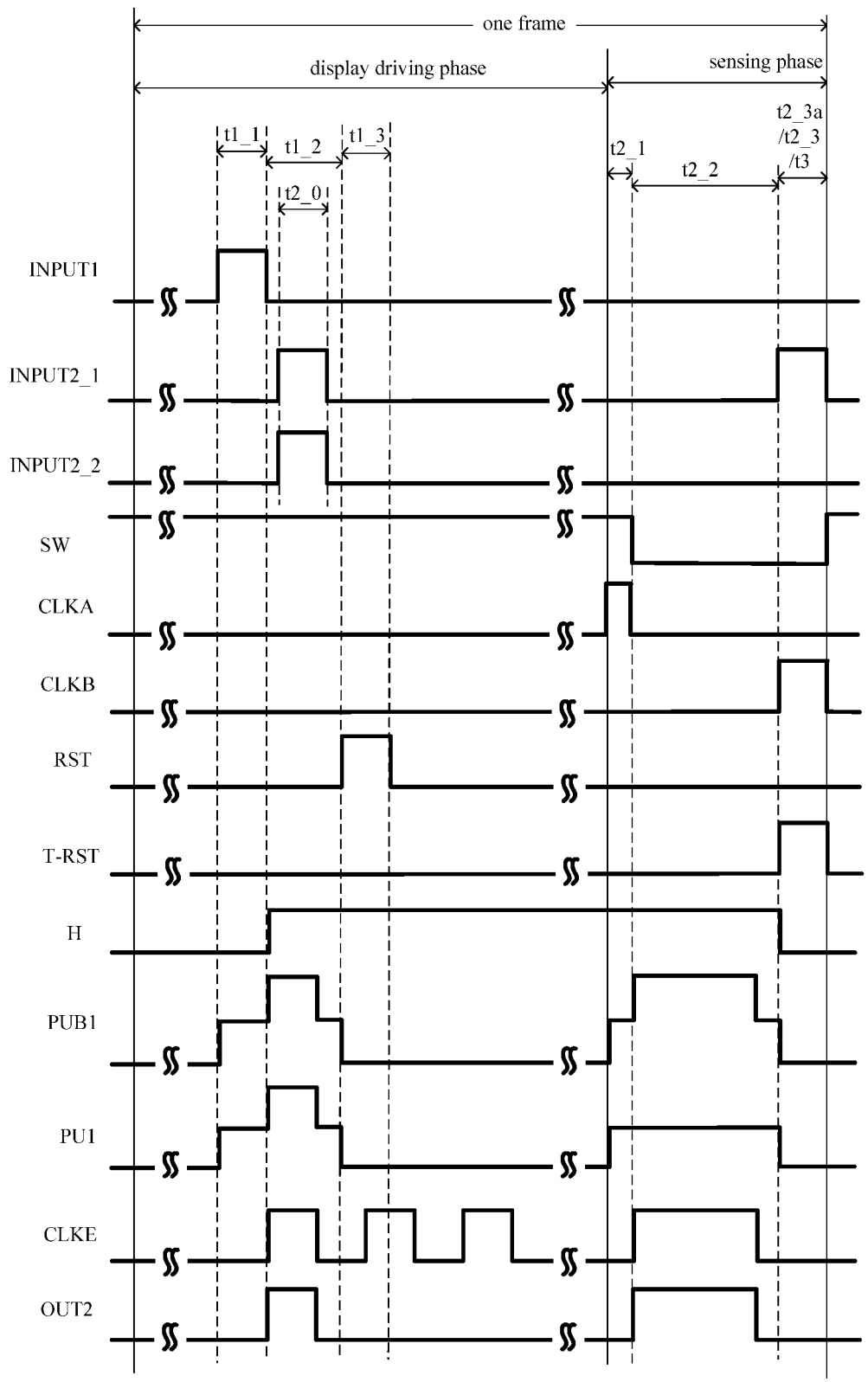
FIG. 14A and FIG. 14B are two operating timing diagrams of the shift register unit shown in FIG. 13.
Figure 14B:
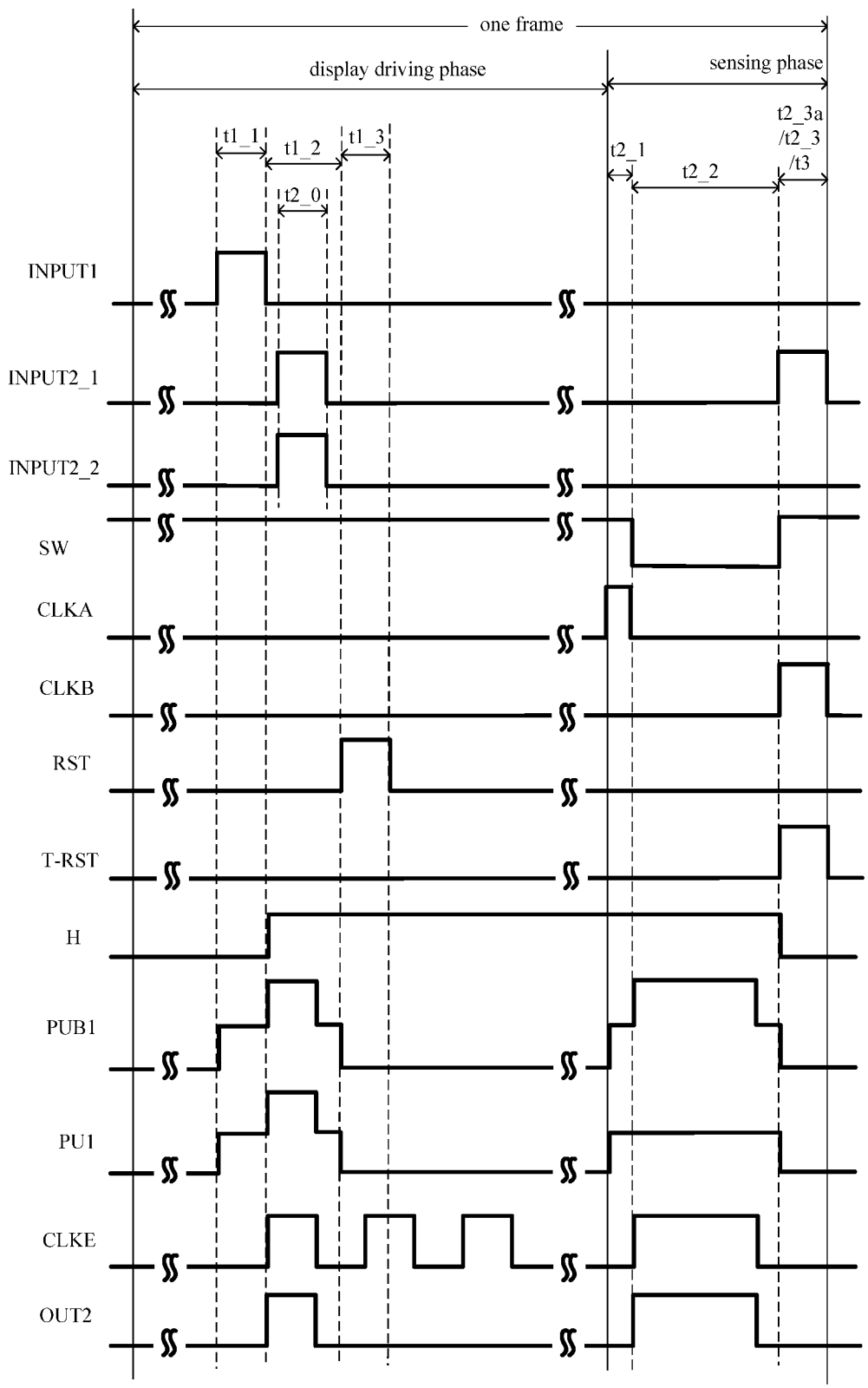

FIG. 14A and FIG. 14B are two operating timing diagrams of the shift register unit shown in FIG. 13. As shown in FIG. 14A and FIG. 14B, illustration is given by taking a case where the second power supply terminal provides the low level voltage VGL1, the third power supply terminal provides the high level voltage VDD1, the first level supply terminal is the first clock control signal input terminal, and the second level supply terminal is the second power supply terminal as an example.

The operating process of the shift register unit includes: the display driving phase, the sensing driving phase, and the global reset phase t3.

The display driving phase includes: the display input sub-phase t1_1, the display output sub-phase t1_2, and the display reset sub-phase t1_3; and the sensing driving phase includes: the sensing preparation sub-phase t2_0, the sensing input sub-phase t2_1, the sensing output sub-phase t2_2, a sensing input reset sub-phase t2_3a, and the sensing control reset sub-phase t2_3.

It should be noted that FIG. 14A and FIG. 14B illustrate an exemplary case where the sensing input reset sub-phase t2_3a, the sensing control reset sub-phase t2_3, and the global reset sub-phase t3 are carried out synchronously, but such case is only for the purpose of illustration, and does not limit the technical solutions of the present disclosure. In the embodiments of the present disclosure, it only needs to be ensured that the sensing input reset sub-phase t2_3a and the sensing control reset sub-phase t2_3 are both after the sensing output sub-phase t2_2.

Detailed descriptions of the display input sub-phase t1_1, the display output sub-phase t1_2, the display reset sub-phase t1_3, the sensing preparation sub-phase t2_0, the sensing input sub-phase t2_1, the sensing output sub-phase t2_2, and the sensing control reset sub-phase t2_3 may refer to the contents of the above embodiments, and thus will not be repeated here. Only the sensing input reset sub-phase t2_3a and the global reset phase t3 are described in detail below.

In the sensing input reset sub-phase t2_3a, the second clock control signal input terminal CLKB provides an active level signal, the seventy-seventh transistor M77 is turned on, the low level voltage VGL1 provided by the second level supply terminal is written to the first pull-up back node PUB1 through the seventy-seventh transistor M77 to reset the first pull-up back node PUB1, and the voltage at the first pull-up back node PUB1 is in a low level state, so the fifth transistor M5 is turned off. At this time, the first driving signal output terminal OUT2 is in the floating state, and the voltage at the first driving signal output terminal OUT2 maintains the low level state as in the previous phase, so the first driving signal output terminal OUT2 outputs a low level signal.

In the global reset phase t3, since the first pull-up back node PUB1 can be reset through the first sensing reset circuit 3, the first switch circuit 61 no longer needs to be in the on state in the global reset phase t3.

With reference to FIG. 14A, a signal provided by the switch signal input terminal SW in the global reset phase t3 is a low level signal, and the seventy-first transistor M71 is turned off in the global reset phase t3, that is, the first switch circuit 61 is in the off state in the global reset phase t3.

With reference to FIG. 14B, a signal provided by the switch signal input terminal SW in the global reset phase t3 is a high level signal, and the seventy-first transistor M71 is turned on in the global reset phase t3, that is, the first switch circuit 61 is in the on state in the global reset phase t3. At this time, the first global reset circuit 6 and the first sensing reset circuit 3 can simultaneously reset the first pull-up back node PUB1, so as to increase a reset speed of the first pull-up back node PUB1.

It should be noted that the state of the first switch circuit 61 in the global reset phase t3 is not limited in the embodiments of the present disclosure in the case where the first sensing reset circuit 3 is provided.

It should be noted that the above case where the second level supply terminal is the second power supply terminal is only an exemplary implementation in the embodiments of the present disclosure, and does not limit the technical solutions of the present disclosure. In the embodiments of the present disclosure, any signal terminal capable of providing an inactive level signal in the sensing input reset sub-phase t2_3a may be used as the second level supply terminal in the embodiments of the present disclosure, for example, a first cascade signal output terminal in the embodiments described below may also be used as the second level supply terminal in the present disclosure.

Figure 15:
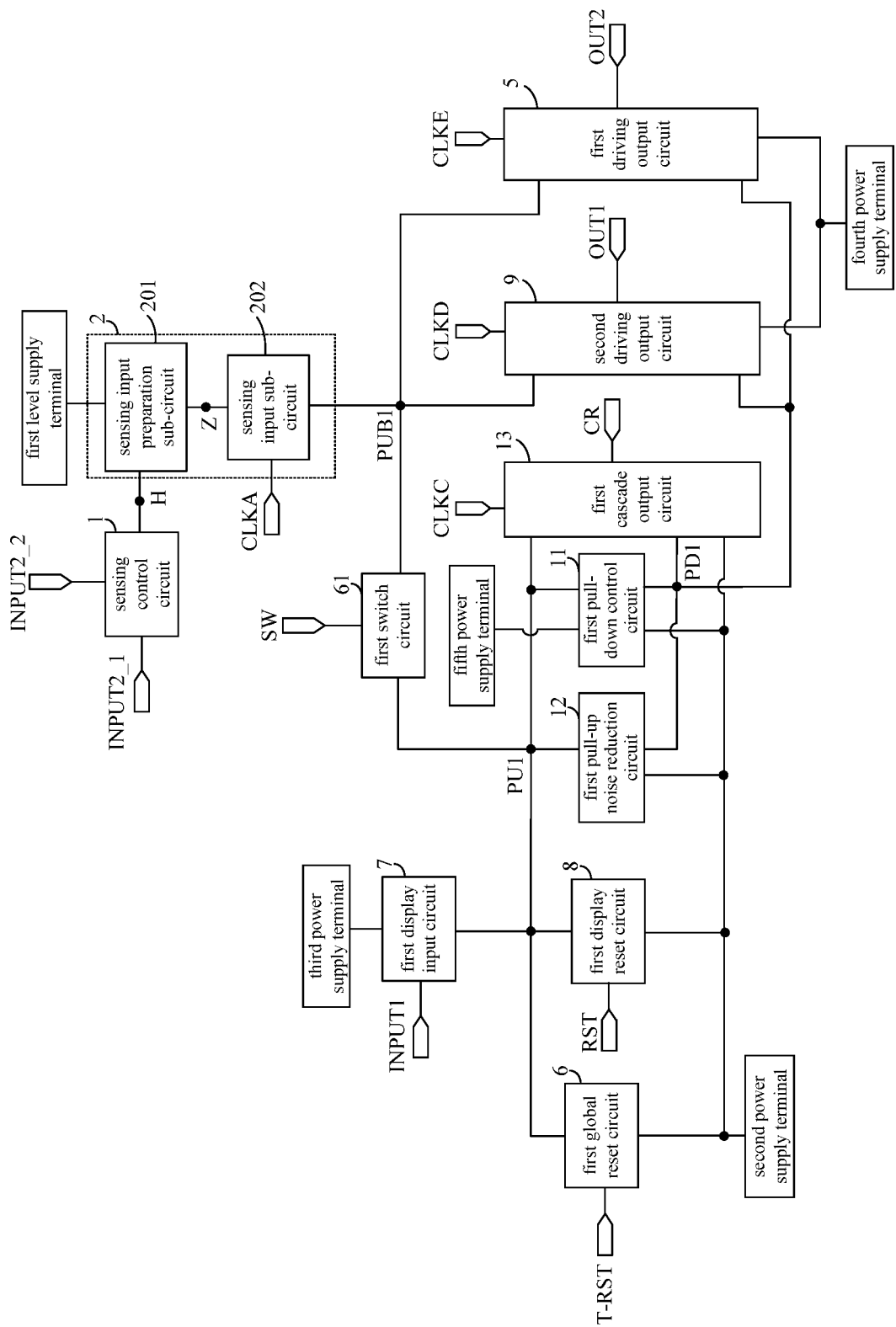
FIG. 15 is a schematic diagram showing yet another circuit structure of the shift register unit according to the embodiments of the present disclosure.

FIG. 15 is a schematic diagram showing yet another circuit structure of the shift register unit according to the embodiments of the present disclosure. As shown in FIG. 15, in some embodiments, the shift register unit further includes: a second driving output circuit 9 and a first cascade output circuit 13.

The second driving output circuit 9 is connected to the first pull-up back node PUB1, a second driving clock signal input terminal CLKD, and a second driving signal output terminal OUT1, and is configured to write a signal provided by the second driving clock signal input terminal CLKD to the second driving signal output terminal OUT1 in response to control of an active level signal at the first pull-up back node PUB1. The second driving signal output terminal OUT1 is connected to a first gate line in pixel units in a corresponding row, so as to provide a driving signal to the first gate line of the corresponding row.

The first cascade output circuit 13 is connected to the first pull-up node PU1, a first cascade clock signal input terminal CLKC, and a first cascade signal output terminal CR, and is configured to write a signal provided by the first cascade clock signal input terminal CLKC to the first cascade signal output terminal CR in response to control of an active level signal at the first pull-up node PU1.

In some embodiments, the shift register unit further includes: a first pull-down control circuit 11 and a first pull-up noise reduction circuit 12.

The first pull-down control circuit 11 is connected to the second power supply terminal, a fifth power supply terminal, the first pull-up node PU1, and a first pull-down node PD1, and is configured to write a voltage having a phase opposite to that of a voltage at the first pull-up node PU1 to the first pull-down node PD1.

The first pull-up noise reduction circuit 12 is connected to the second power supply terminal, the first pull-up node PU1, and the first pull-down node PD1, and is configured to write an inactive level signal provided by the second power supply terminal to the first pull-up node PU1 in response to control of an active level signal at the first pull-down node PD1.

The first cascade output circuit 13 is further connected to the first pull-down node PD1 and the second power supply terminal, and is further configured to write an inactive level signal provided by the second power supply terminal to the first cascade signal output terminal CR in response to control of an active level signal at the first pull-down node PD1.

The first driving output circuit 5 is further connected to the first pull-down node PD1 and a fourth power supply terminal, and is further configured to write an inactive level signal provided by the fourth power supply terminal to the first driving signal output terminal OUT2 in response to control of an active level signal at the first pull-down node PD1.

The second driving output circuit 9 is further connected to the first pull-down node PD1 and the fourth power supply terminal, and is further configured to write an inactive level signal provided by the fourth power supply terminal to the second driving signal output terminal OUT1 in response to control of an active level signal at the first pull-down node PD1.

Figure 16:
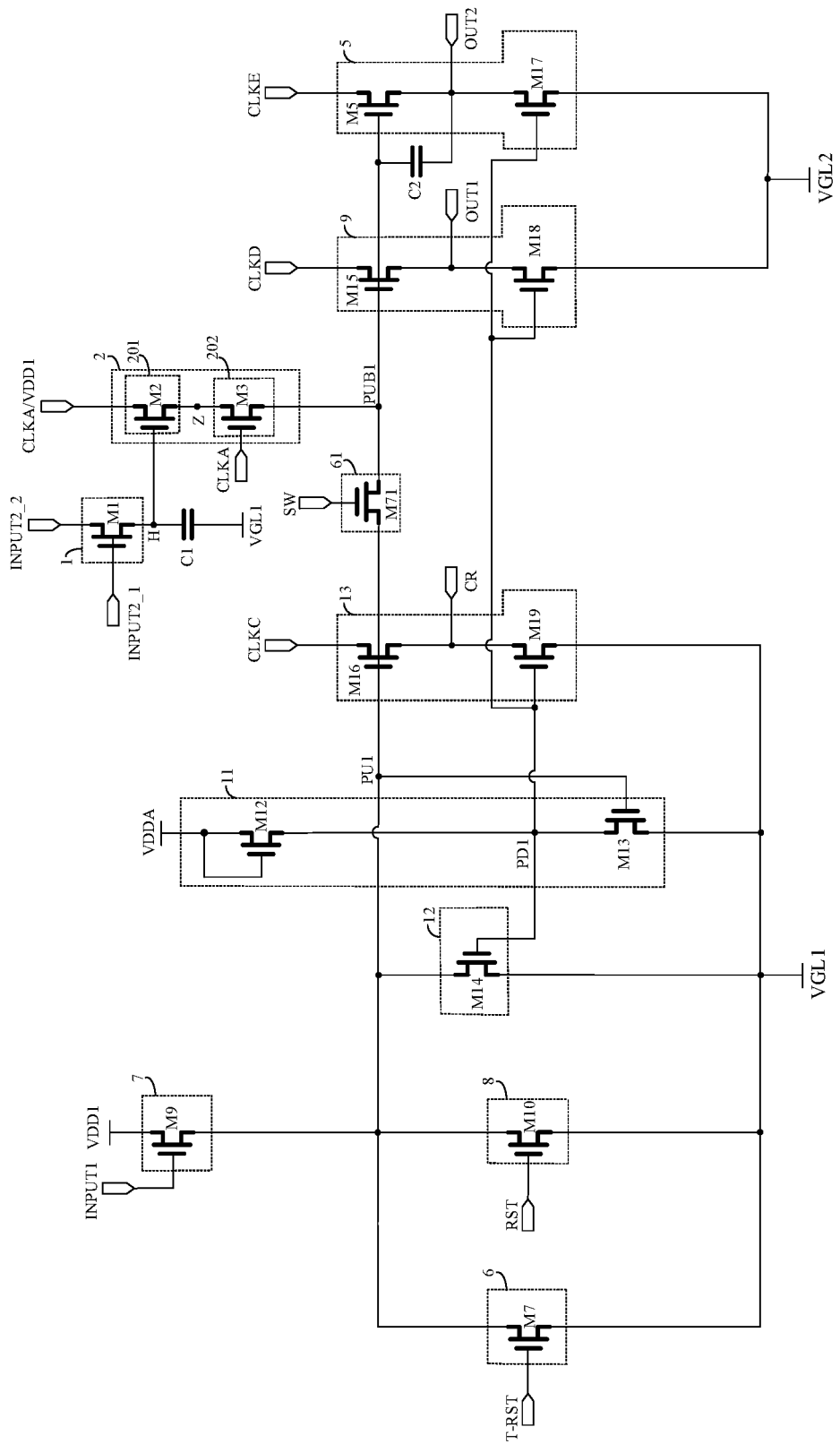
FIG. 16 is a schematic diagram showing yet another circuit structure of the shift register unit according to the embodiments of the present disclosure.

FIG. 16 is a schematic diagram showing yet another circuit structure of the shift register unit according to the embodiments of the present disclosure. As shown in FIG. 16, the shift register unit shown in FIG. 16 is an exemplary implementation based on the shift register unit shown in FIG. 15.

In an embodiment, the sensing control circuit 1 includes: the first transistor M1.

The control electrode of the first transistor M1 is connected to the first sensing signal input terminal INPUT2_1, the first electrode of the first transistor M1 is connected to the second sensing signal input terminal INPUT2_2, and the second electrode of the first transistor M1 is connected to the sensing control node H.

In an embodiment, the first sensing input circuit 2 includes the second transistor M2 and the third transistor M3.

The control electrode of the second transistor M2 is connected to the sensing control node H, the first electrode of the second transistor M2 is connected to the first level supply terminal, and the second electrode of the second transistor M2 is connected to the sensing preparation node Z.

The control electrode of the third transistor M3 is connected to the first clock control signal input terminal CLKA, the first electrode of the third transistor M3 is connected to the sensing preparation node Z, and the second electrode of the third transistor M3 is connected to the first pull-up back node PUB1.

In an embodiment, the first switch circuit 61 includes the seventy-first transistor M71.

The control electrode of the seventy-first transistor M71 is connected to the switch signal input terminal SW, the first electrode of the seventy-first transistor M71 is connected to the first pull-up node PU1, and the second electrode of the seventy-first transistor M71 is connected to the first pull-up back node PUB1.

In an embodiment, the first global reset circuit 6 includes the seventh transistor M7.

The control electrode of the seventh transistor M7 is connected to the global reset signal input terminal T-RST, the first electrode of the seventh transistor M7 is connected to the first pull-up node PU1, and the second electrode of the seventh transistor M7 is connected to the second power supply terminal.

In an embodiment, the first display input circuit 7 includes the ninth transistor M9.

The control electrode of the ninth transistor M9 is connected to the display signal input terminal INT, the first electrode of the ninth transistor M9 is connected to the third power supply terminal, and the second electrode of the ninth transistor M9 is connected to the first pull-up node PU1.

In an embodiment, the first display reset circuit 8 includes the tenth transistor M10.

The control electrode of the tenth transistor M10 is connected to the display reset signal input terminal RST, the first electrode of the tenth transistor M10 is connected to the first pull-up node PU1, and the second electrode of the tenth transistor M10 is connected to the second power supply terminal.

In an embodiment, the first pull-down control circuit 11 includes a twelfth transistor M12 and a thirteenth transistor M13.

A control electrode of the twelfth transistor M12 is connected to the fifth power supply terminal, a first electrode of the twelfth transistor M12 is connected to the fifth power supply terminal, and a second electrode of the twelfth transistor M12 is connected to the first pull-down node PD1.

A control electrode of the thirteenth transistor M13 is connected to the first pull-up node PU1, a first electrode of the thirteenth transistor M13 is connected to the first pull-down node PD1, and a second electrode of the thirteenth transistor M13 is connected to the second power supply terminal.

In an embodiment, the first pull-up noise reduction circuit 12 includes a fourteenth transistor M14.

A control electrode of the fourteenth transistor M14 is connected to the first pull-down node PD1, a first electrode of the fourteenth transistor M14 is connected to the first pull-up node PU1, and a second electrode of the fourteenth transistor M14 is connected to the second power supply terminal.

In an embodiment, the first driving output circuit 5 includes a fifth transistor M5 and a seventeenth transistor M17.

A control electrode of the fifth transistor M5 is connected to the first pull-up back node PUB1, a first electrode of the fifth transistor M5 is connected to the first driving clock signal input terminal CLKE, and a second electrode of the fifth transistor M5 is connected to the first driving signal output terminal OUT2.

A control electrode of the seventeenth transistor M17 is connected to the first pull-down node PD1, a first electrode of the seventeenth transistor M17 is connected to the first driving signal output terminal OUT2, and a second electrode of the seventeenth transistor M17 is connected to the fourth power supply terminal.

In an embodiment, the second driving output circuit 9 includes a fifteenth transistor M15 and an eighteenth transistor M18.

A control electrode of the fifteenth transistor M15 is connected to the first pull-up back node PUB1, a first electrode of the fifteenth transistor M15 is connected to the second driving clock signal input terminal CLKD, and a second electrode of the fifteenth transistor M15 is connected to the second driving signal output terminal OUT1.

A control electrode of the eighteenth transistor M18 is connected to the first pull-down node PD1, a first electrode of the eighteenth transistor M18 is connected to the second driving signal output terminal OUT1, and a second electrode of the eighteenth transistor M18 is connected to the fourth power supply terminal.

In an embodiment, the first cascade output circuit 13 includes a sixteenth transistor M16 and a nineteenth transistor M19.

A control electrode of the sixteenth transistor M16 is connected to the first pull-up node PU1, a first electrode of the sixteenth transistor M16 is connected to the first cascade clock signal input terminal CLKC, and a second electrode of the sixteenth transistor M16 is connected to the first cascade signal output terminal CR.

A control electrode of the nineteenth transistor M19 is connected to the first pull-down node PD1, a first electrode of the nineteenth transistor M19 is connected to the cascade signal output terminal CR, and a second electrode of the nineteenth transistor M19 is connected to the fourth power supply terminal.

In some embodiments, the second capacitor C2 is disposed at the first driving signal output terminal OUT2.

In some embodiments, the first level supply terminal may be the third power supply terminal (which provides an active level voltage) or the first clock control signal input terminal.

The second power supply terminal provides the low level voltage VGL1, the third power supply terminal provides the high level voltage VDD1, the fourth power supply terminal provides a low level voltage VGL2, and the fifth power supply terminal provides a high level voltage VDDA.

Figure 17:
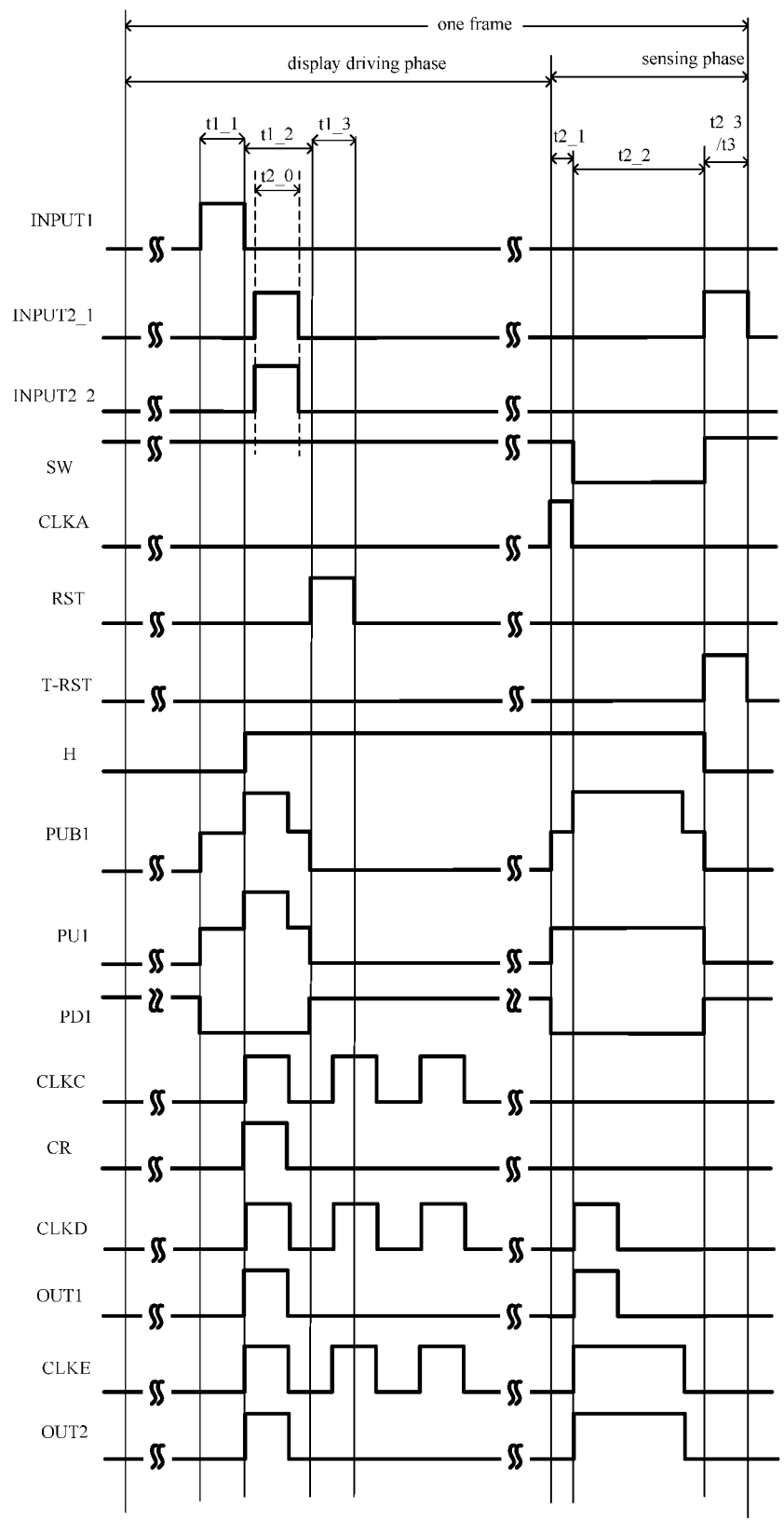
FIG. 17 is an operating timing diagram of the shift register unit shown in FIG. 16.

FIG. 17 is an operating timing diagram of the shift register unit shown in FIG. 16. As shown in FIG. 17, the operating process of the shift register unit includes: the display driving phase, the sensing driving phase, and the global reset phase t3.

The display driving phase includes: the display input sub-phase t1_1, the display output sub-phase t1_2, and the display reset sub-phase t1_3, which are sequentially carried out; and the sensing driving phase includes: the sensing preparation sub-phase t2_0, the sensing input sub-phase t2_1, the sensing output sub-phase t2_2, and the sensing control reset sub-phase t2_3, which are sequentially carried out.

A detailed description of each phase and each sub-phase may refer to the related description of FIG. 8, and thus will not be repeated here. It should be noted that the shift register unit shown in FIG. 16 may operate according to other operating timing, for example, the shift register unit shown in FIG. 16 may adopt the operating timing shown in any one of FIGS. 9 to 11.

The shift register units shown in FIG. 15 and FIG. 16 can not only provide the driving signal to a corresponding second gate line, but can also provide the driving signal to the first gate line of the corresponding row, which is beneficial to reducing the number of gate driving circuits in a display panel and facilitates a narrow frame design of a product.

Figure 18:
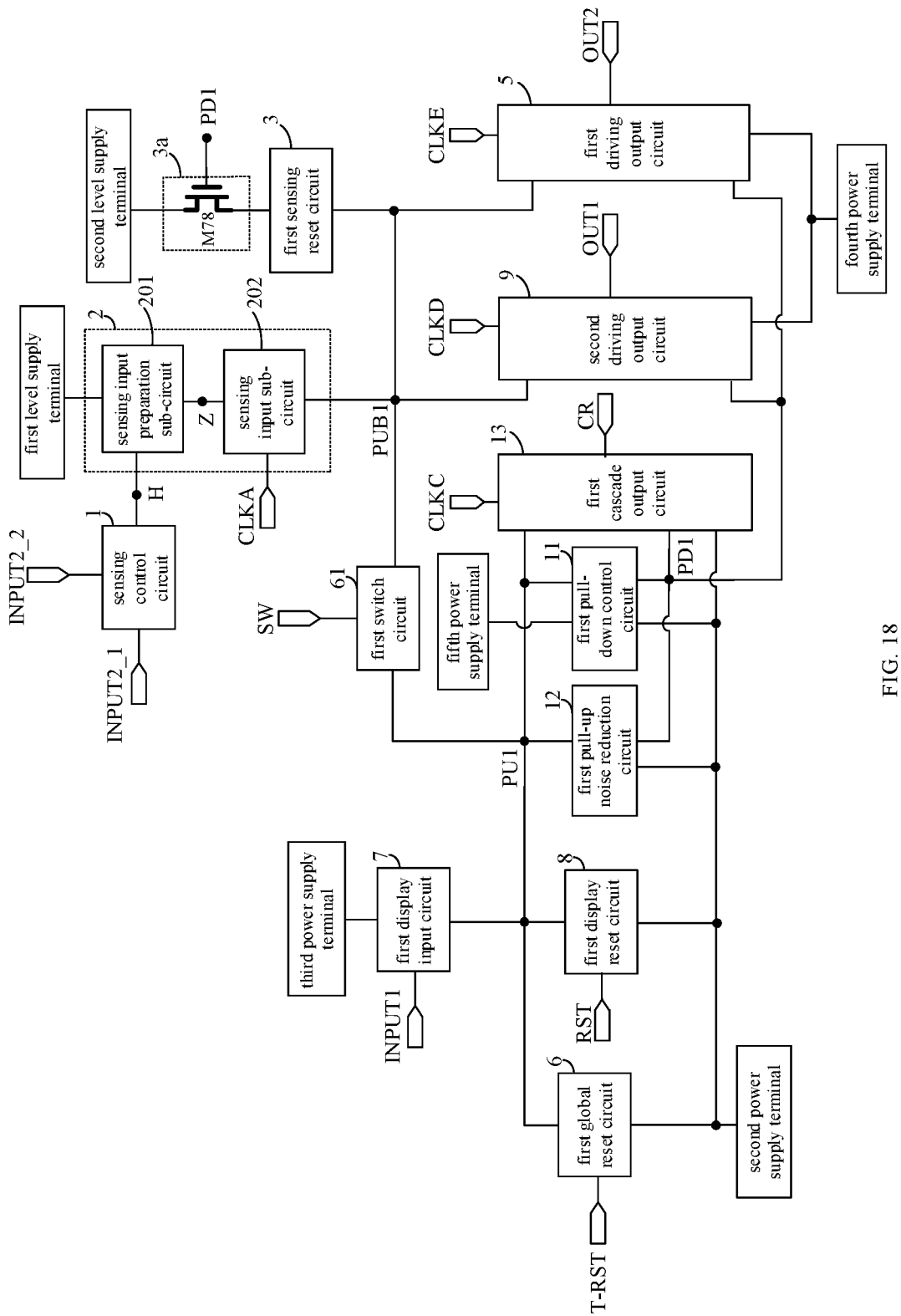
FIG. 18 is a schematic diagram showing yet another circuit structure of the shift register unit according to the embodiments of the present disclosure.

FIG. 18 is a schematic diagram showing yet another circuit structure of the shift register unit according to the embodiments of the present disclosure. As shown in FIG. 18, the shift register unit shown in FIG. 18 is an improvement based on the shift register unit shown in FIG. 15, and the shift register unit shown in FIG. 18 not only includes the circuits in the shift register unit shown in FIG. 15, but also includes the first sensing reset circuit 3.

The first sensing reset circuit 3 is connected to a second clock control signal input terminal CLKB, a second level supply terminal, and the first pull-up back node PUB1, and is configured to write an inactive level signal provided by the second level supply terminal to the first pull-up back node PUB1 in response to control of an active level signal provided by the second clock control signal input terminal CLKB.

A detailed description of the first sensing reset circuit 3 may refer to that in the content of the above embodiments, and thus will not be repeated here.

In some embodiments, the shift register unit further includes: a first sensing reset anti-leakage circuit 3a, and the first sensing reset circuit 3 is connected to the second level supply terminal through the first sensing reset anti-leakage circuit 3a; and the first sensing reset anti-leakage circuit 3a is further connected to the first pull-down node PD1, and is configured to form a path between the first sensing reset circuit 3 and the second level supply terminal in response to control of an active level signal at the first pull-down node PD1, and cut off the path between the first sensing reset circuit 3 and the second level supply terminal in response to control of an inactive level signal at the first pull-down node PD1.

In the embodiments of the present disclosure, when the voltage at the first pull-up back node PUB1 is in an active level state, the voltage at the first pull-down node PD1 is in an inactive level state, at this time, the path between the first sensing reset circuit 3 and the second level supply terminal is cut off, so that the first pull-up back node PUB1 can be effectively prevented from discharging through the first sensing reset circuit 3 and the second level supply terminal.

It should be noted that, in the case where the shift register unit is provided with the first sensing reset anti-leakage circuit 3a, in the sensing input reset sub-phase, the voltage at the first pull-down node PD1 is in an active level state, at this time, the first sensing reset anti-leakage circuit 3a forms the path between the first sensing reset circuit 3 and the second level supply terminal in response to control of an active level signal at the first pull-down node PD1, and an inactive level signal provided by the second level supply terminal can be written to the first pull-up back node PUB1 through the first sensing reset anti-leakage circuit 3a and the first sensing reset circuit 3 to reset the first pull-up back node PUB1.

In some embodiments, the first sensing reset anti-leakage circuit 3a includes: a seventy-eighth transistor M78; and a control electrode of the seventy-eighth transistor M78 is connected to the first pull-down node PD1, a first electrode of the seventy-eighth transistor M78 is connected to the first sensing reset anti-leakage circuit 3a, and a second electrode of the seventy-eighth transistor M78 is connected to the second level supply terminal.

Figure 19:
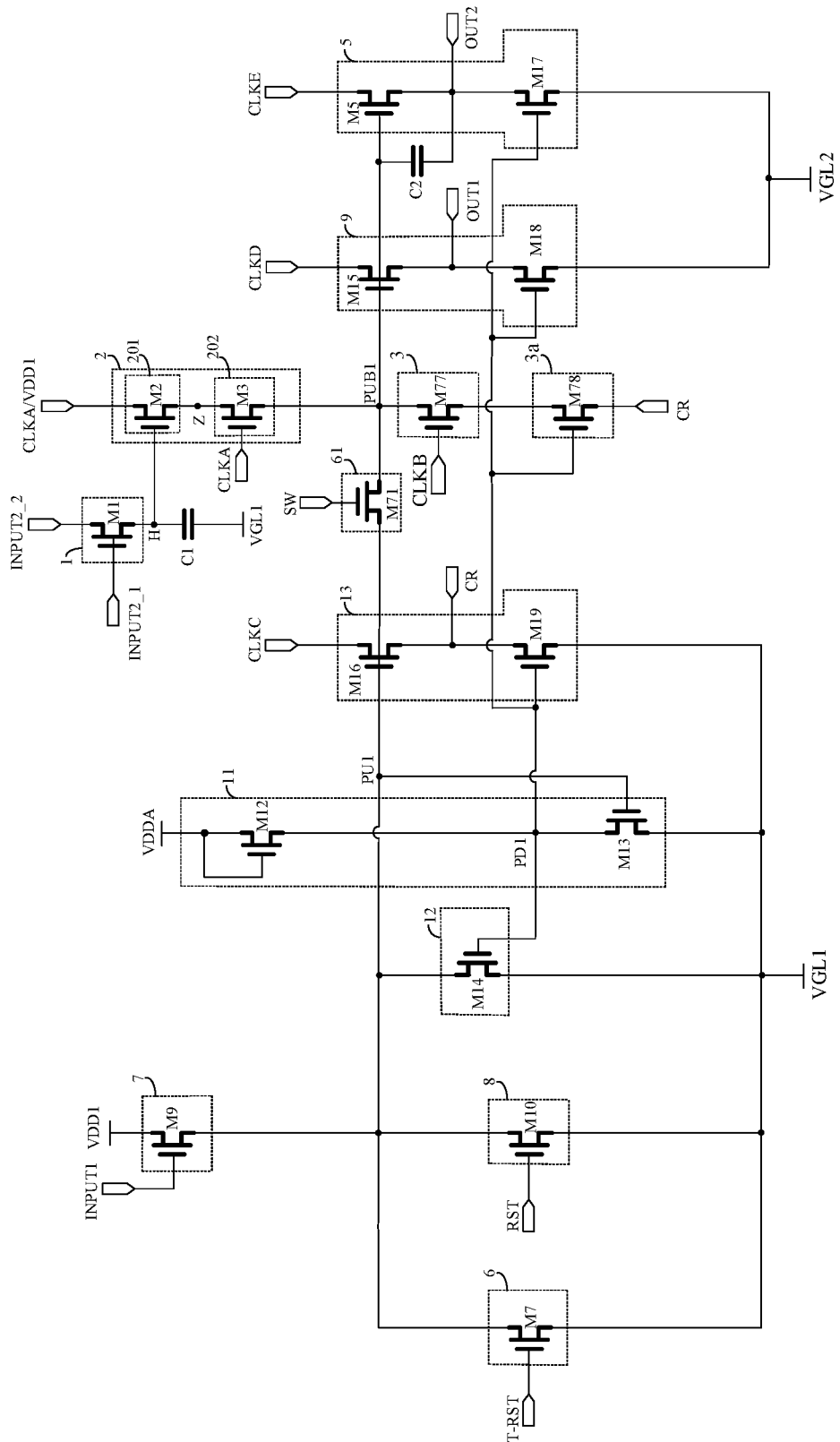
FIG. 19 is a schematic diagram showing yet another circuit structure of the shift register unit according to the embodiments of the present disclosure.

FIG. 19 is a schematic diagram showing yet another circuit structure of the shift register unit according to the embodiments of the present disclosure. As shown in FIG. 19, the shift register unit shown in FIG. 19 is an exemplary implementation based on the shift register unit shown in FIG. 18.

In an embodiment, the sensing control circuit 1 includes the first transistor M1, the first sensing input circuit 2 includes the second transistor M2 and the third transistor M3, the first switch circuit 61 includes the seventy-first transistor M71, the first global reset circuit 6 includes the seventh transistor M7, the first display input circuit 7 includes the ninth transistor M9, the first display reset circuit 8 includes the tenth transistor M10, the first pull-down control circuit 11 includes the twelfth transistor M12 and the thirteenth transistor M13, the first pull-up noise reduction circuit 12 includes the fourteenth transistor M14, the first driving output circuit 5 includes the fifth transistor M5 and the seventeenth transistor M17, the second driving output circuit 9 includes the fifteenth transistor M15 and the eighteenth transistor M18, the first cascade output circuit 13 includes the sixteenth transistor M16 and the nineteenth transistor M19, the first sensing reset circuit 3 includes the seventy-seventh transistor M77, and the first sensing reset anti-leakage circuit 3a includes the seventy-eighth transistor M78. The connection relationship between the transistors may refer to the content of the above embodiments, and thus will not be repeated here.

In some embodiments, the second level supply terminal is the first cascade signal output terminal. As can be seen from the operating timing of the first cascade signal output terminal shown in FIG. 17, the first cascade signal output terminal can provide an inactive level signal in the sensing input reset sub-phase t2_3a, and thus can be used as the second level supply terminal.

In the above case where the second power supply terminal is used as the second level supply terminal, an electrical device (e.g., a transistor) connected to the second level supply terminal is in a high voltage state for a long period of time, in this case, electrical characteristic of the electrical device connected to the second level supply terminal is very likely to drift due to an influence of the long-time high voltage. However, in the case where the first cascade signal output terminal CR is used as the second level supply terminal, since the voltages provided by the first cascade signal output terminal CR vary between a high voltage and a low voltage, the case where the electrical device connected to the second level supply terminal is in the high voltage state for a long period of time does not exist, so that the problem of the electrical characteristic drift of the electrical device can be effectively alleviated.

Figure 20:
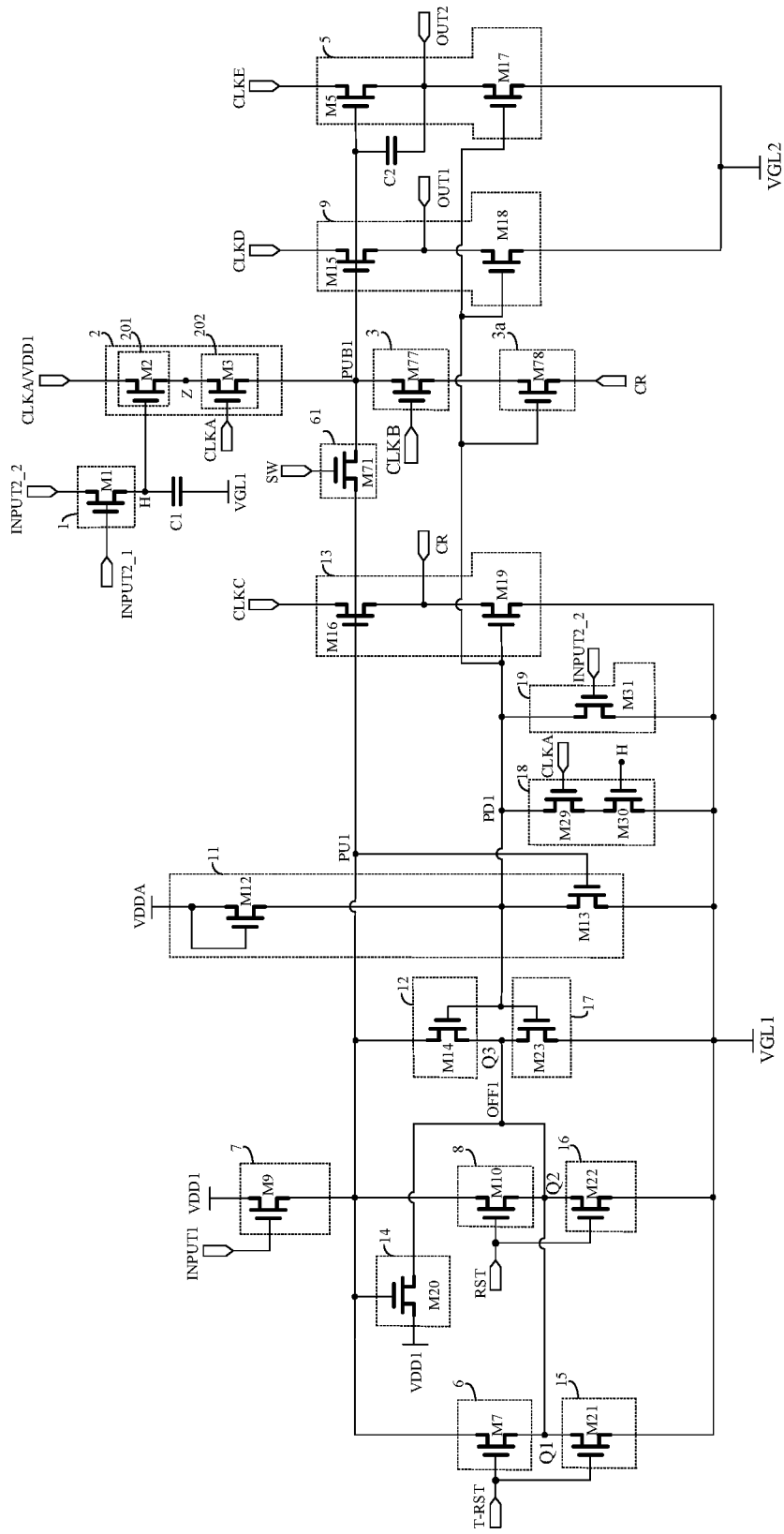
FIG. 20 is a schematic diagram showing yet another circuit structure of the shift register unit according to the embodiments of the present disclosure.

FIG. 20 is a schematic diagram showing yet another circuit structure of the shift register unit according to the embodiments of the present disclosure. As shown in FIG. 20, in some embodiments, in a case where the shift register unit is provided with the first global reset circuit 6, the first display reset circuit 8, and the first pull-up noise reduction circuit 12, an anti-leakage design may be provided for at least one of the first global reset circuit 6, the first display reset circuit 8, and the first pull-up noise reduction circuit 12.

In some embodiments, the shift register unit includes a first voltage control circuit 14; and the first voltage control circuit 14 is connected to the third power supply terminal, the first pull-up node PU1, and a first voltage control node OFF1, and is configured to write an active level signal provided by an active level supply terminal to the first voltage control node OFF1 in response to control of an active level signal at the first pull-up node PU1.

The shift register unit further includes at least one of a first anti-leakage circuit 15, a second anti-leakage circuit 16, and a third anti-leakage circuit 17.

The first global reset circuit 6 is connected to the second power supply terminal through the first anti-leakage circuit 15, and is connected to the first anti-leakage circuit 15 at a first anti-leakage node Q1, and the first anti-leakage node Q1 is connected to the first voltage control node OFF1. The first anti-leakage circuit 15 is connected to the global reset signal input terminal T-RST, and is configured to form a path between the first anti-leakage node Q1 and the second power supply terminal in response to control of an active level signal provided by the global reset signal input terminal T-RST, and cut off the path between the first anti-leakage node Q1 and the second power supply terminal in response to control of an inactive level signal provided by the global reset signal input terminal T-RST.

The first display reset circuit 8 is connected to the second power supply terminal through the second anti-leakage circuit 16, and is connected to the second anti-leakage circuit 16 at a second anti-leakage node Q2, and the second anti-leakage node Q2 is connected to the first voltage control node OFF1. The second anti-leakage circuit 16 is connected to the display reset signal input terminal RST, and is configured to form a path between the second anti-leakage node Q2 and the second power supply terminal in response to control of an active level signal provided by the display reset signal input terminal RST, and cut off the path between the second anti-leakage node Q2 and the second power supply terminal in response to control of an inactive level signal provided by the display reset signal input terminal RST.

The first pull-up noise reduction circuit 12 is connected to the second power supply terminal through the third anti-leakage circuit 17, and is connected to the third anti-leakage circuit 17 at a third anti-leakage node Q3, and the third anti-leakage node Q3 is connected to the first voltage control node OFF1. The third anti-leakage circuit 17 is connected to the first pull-down node PD1, and is configured to form a path between the third anti-leakage node Q3 and the second power supply terminal in response to control of an active level signal at the first pull-down node PD1, and cut off the path between the third anti-leakage node Q3 and the second power supply terminal in response to control of an inactive level signal at the first pull-down node PD1.

The third power supply terminal provides an active level signal. In an exemplary embodiment, the third power supply terminal provides the high level voltage VDD1, and the active level supply terminal is the third power supply terminal.

In some embodiments, the first voltage control circuit 14 includes a twentieth transistor M20, a control electrode of the twentieth transistor M20 is connected to the first pull-up node PU1, a first electrode of the twentieth transistor M20 is connected to the active level supply terminal, and a second electrode of the twentieth transistor M20 is connected to the first voltage control node OFF1.

In some embodiments, the first anti-leakage circuit 15 includes a twenty-first transistor M21, a control electrode of the twenty-first transistor M21 is connected to the global reset signal input terminal T-RST, a first electrode of the twenty-first transistor M21 is connected to the first anti-leakage node Q1, and a second electrode of the twenty-first transistor M21 is connected to the second power supply terminal.

In some embodiments, the second anti-leakage circuit 16 includes a twenty-second transistor M22, a control electrode of the twenty-second transistor M22 is connected to the display reset signal input terminal RST, a first electrode of the twenty-second transistor M22 is connected to the second anti-leakage node Q2, and a second electrode of the twenty-second transistor M22 is connected to the second power supply terminal.

In some embodiments, the third anti-leakage circuit 17 includes: a twenty-third transistor M23, a control electrode of the twenty-third transistor M23 is connected to the first pull-down node PD1, a first electrode of the twenty-third transistor M23 is connected to the third anti-leakage node Q3, and a second electrode of the twenty-third transistor M23 is connected to the second power supply terminal.

It should be noted that FIG. 20 illustrates an exemplary case where the shift register unit includes all of the first anti-leakage circuit 15, the second anti-leakage circuit 16, and the third anti-leakage circuit 17. In practical applications, at least one of the first anti-leakage circuit 15, the second anti-leakage circuit 16, and the third anti-leakage circuit 17 may be configured according to actual needs.

Still with reference to FIG. 20, in some embodiments, the shift register unit further includes a first pull-down noise reduction circuit 18 and/or a second pull-down noise reduction circuit 19.

The first pull-down noise reduction circuit 18 is connected to the first pull-down node PD1, the second power supply terminal, the sensing control node H, and the first clock control signal input terminal CLKA, and is configured to write an inactive level signal provided by the second power supply terminal to the first pull-down node PD1 in response to control of an active level signal at the sensing control node H and an active level signal provided by the first clock control signal input terminal CLKA to perform noise reduction on a voltage at the first pull-down node PD1.

The second pull-down noise reduction circuit 19 is connected to the first pull-down node PD1, the second power supply terminal, and the second sensing signal input terminal INPUT2_2, and is configured to write an inactive level signal provided by the second power supply terminal to the first pull-down node PD1 in response to control of an active level signal provided by the second sensing signal input terminal INPUT2_2 to perform noise reduction on the voltage at the first pull-down node PD1.

In some embodiments, the first pull-down noise reduction circuit 18 includes a twenty-ninth transistor M29 and a thirtieth transistor M30, and the second pull-down noise reduction circuit 19 includes a thirty-first transistor M31.

A control electrode of the twenty-ninth transistor M29 is connected to the first clock control signal input terminal CLKA, a first electrode of the twenty-ninth transistor M29 is connected to the first pull-down node PD1, and a second electrode of the twenty-ninth transistor M29 is connected to a first electrode of the thirtieth transistor M30.

A control electrode of the thirtieth transistor M30 is connected to the sensing control node H, and a second electrode of the thirtieth transistor M30 is connected to the second power supply terminal.

A control electrode of the thirty-first transistor M31 is connected to the second sensing signal input terminal INPUT2_2, a first electrode of the thirty-first transistor M31 is connected to the first pull-down node PD1, and a second electrode of the thirty-first transistor M31 is connected to the second power supply terminal.

Figure 21:
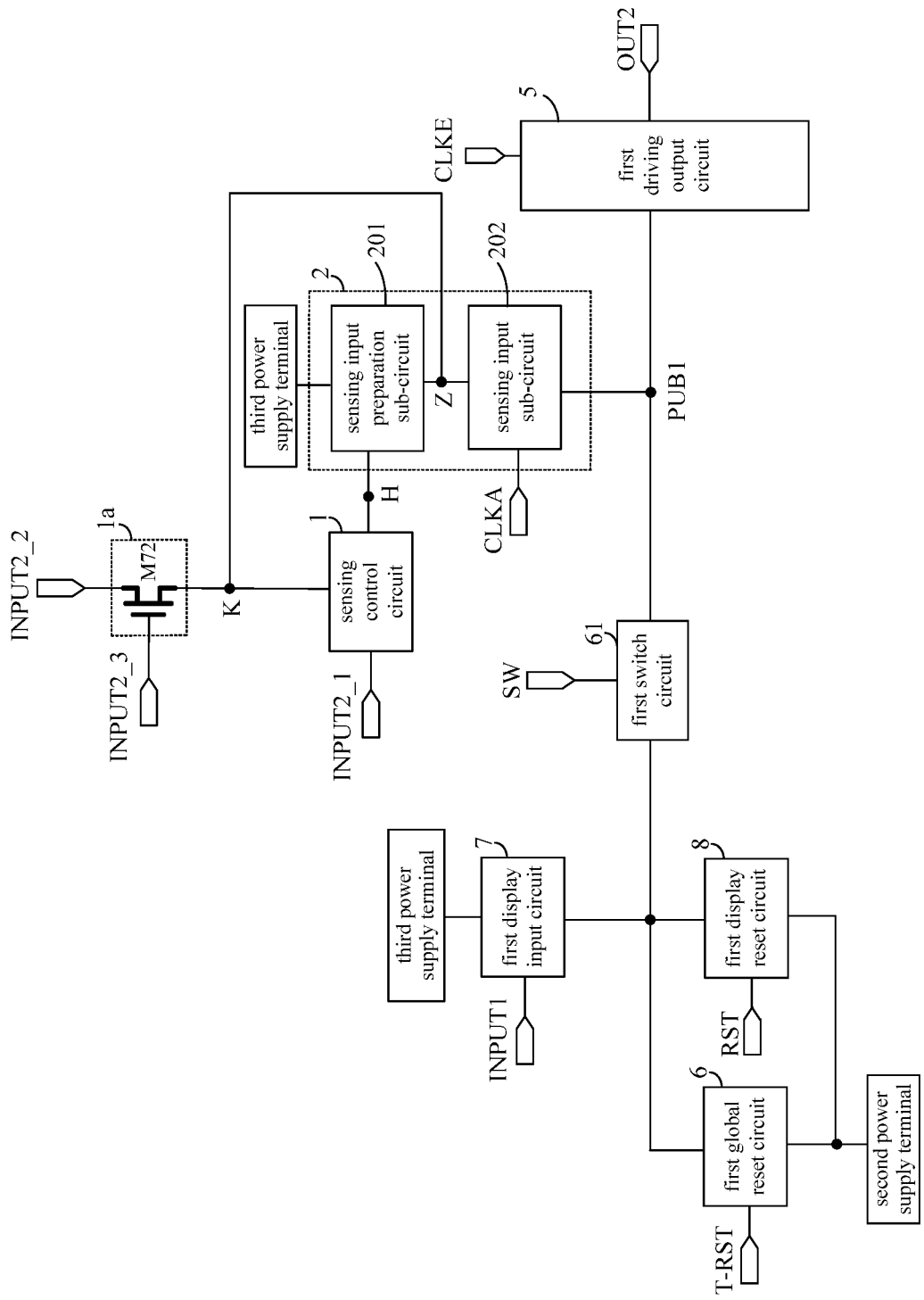
FIG. 21 is a schematic diagram showing yet another circuit structure of the shift register unit according to the embodiments of the present disclosure.

FIG. 21 is a schematic diagram showing yet another circuit structure of the shift register unit according to the embodiments of the present disclosure. As shown in FIG. 21, in an embodiment of the present disclosure, an anti-leakage design is also provided for the sensing control circuit.

In some embodiments, the shift register unit further includes: a sensing control anti-leakage circuit 1a, the sensing control circuit 1 is connected to the second sensing signal input terminal INPUT2_2 through the sensing control anti-leakage circuit 1a, and is connected to the sensing control anti-leakage circuit 1a at a sensing control anti-leakage node K, and the sensing control anti-leakage node K is connected to the sensing preparation node Z. The sensing control anti-leakage circuit 1a is further connected to a third sensing signal input terminal INPUT2_3, and is configured to form a path between the sensing control anti-leakage node K and the second sensing signal input terminal INPUT2_2 in response to control of an active level signal provided by the third sensing signal input terminal INPUT2_3, and cut off the path between the sensing control anti-leakage node K and the second sensing signal input terminal INPUT2_2 in response to control of an inactive level signal provided by the third sensing signal input terminal INPUT2_3.

In the above case, the anti-leakage design is provided for the sensing control circuit 1 based on a voltage at the sensing preparation node Z.

In some embodiments, the sensing control anti-leakage circuit 1a includes: a seventy-second transistor M72; and a control electrode of the seventy-second transistor M72 is connected to the third sensing signal input terminal INPUT2_3, a first electrode of the seventy-second transistor M72 is connected to the second sensing signal input terminal INPUT2_2, and a second electrode of the seventy-second transistor M72 is connected to the sensing control anti-leakage node K.

When the third sensing signal input terminal INPUT2_3 provides an active level signal, the seventy-second transistor M72 is turned on, and the path between the sensing control anti-leakage node K and the second sensing signal input terminal INPUT2_2 is formed; and when the third sensing signal input terminal INPUT2_3 provides an inactive level signal, the seventy-second transistor M72 is turned off, and the path between the sensing control anti-leakage node K and the second sensing signal input terminal INPUT2_2 is cut off.

In some embodiments, the first level supply terminal is the third power supply terminal. With such design, the sensing preparation node Z can be in a high level state while the sensing control node H is in a high level state.

In the display output sub-phase, the sensing control node H is in a floating state for a long period of time, and a high level voltage at the sensing control node H discharges through the sensing control circuit 1 and the second sensing signal input terminal INPUT2_2. In the embodiments of the present disclosure, by providing the sensing control anti-leakage circuit 1a between the sensing control circuit 1 and the second sensing signal input terminal INPUT2_2, the path between the sensing control anti-leakage node K and the second sensing signal input terminal INPUT2_2 is cut off in the display output sub-phase, and meanwhile, a high level signal at the sensing preparation node Z is written to the sensing control anti-leakage node K, so that the sensing control node H can be effectively prevented from discharging through the sensing control circuit 1, thereby achieving an anti-leakage objective.

Figure 22A:
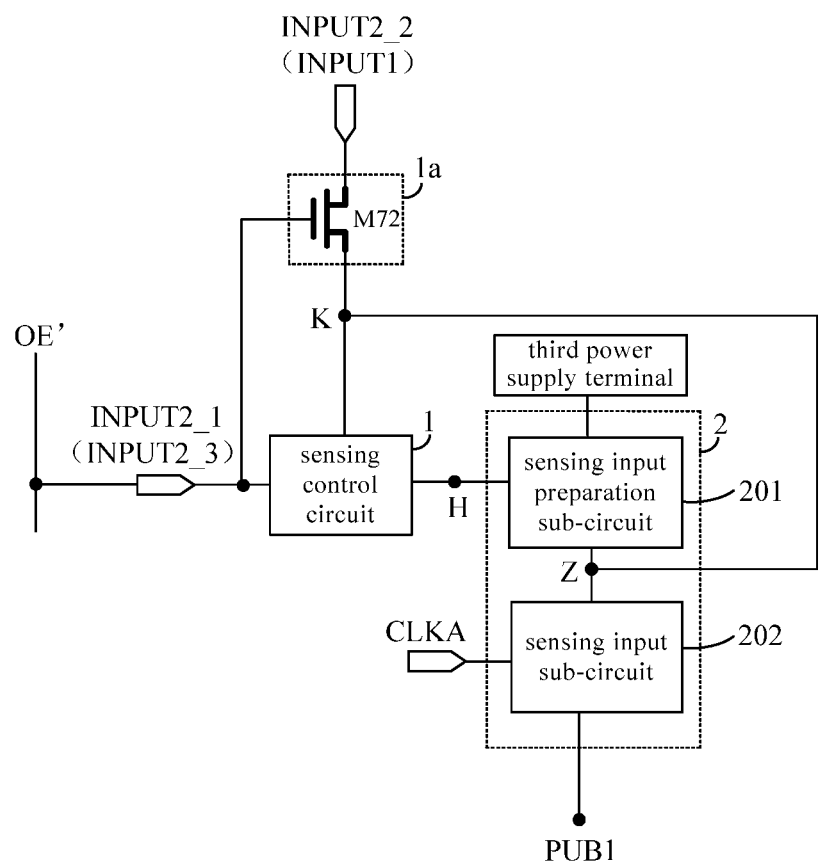
FIGS. 22A to 22D are schematic diagrams showing several different circuit structures of a sensing control circuit, a first sensing input circuit, and a sensing control anti-leakage circuit according to the embodiments of the present disclosure.
Figure 22B:
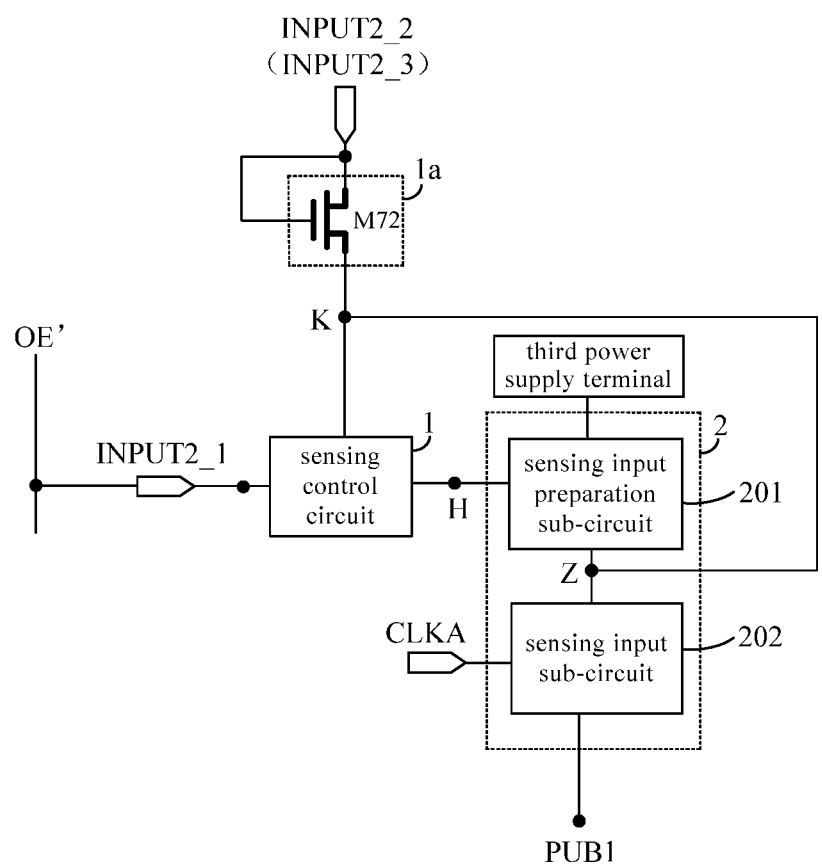
Figure 22C:
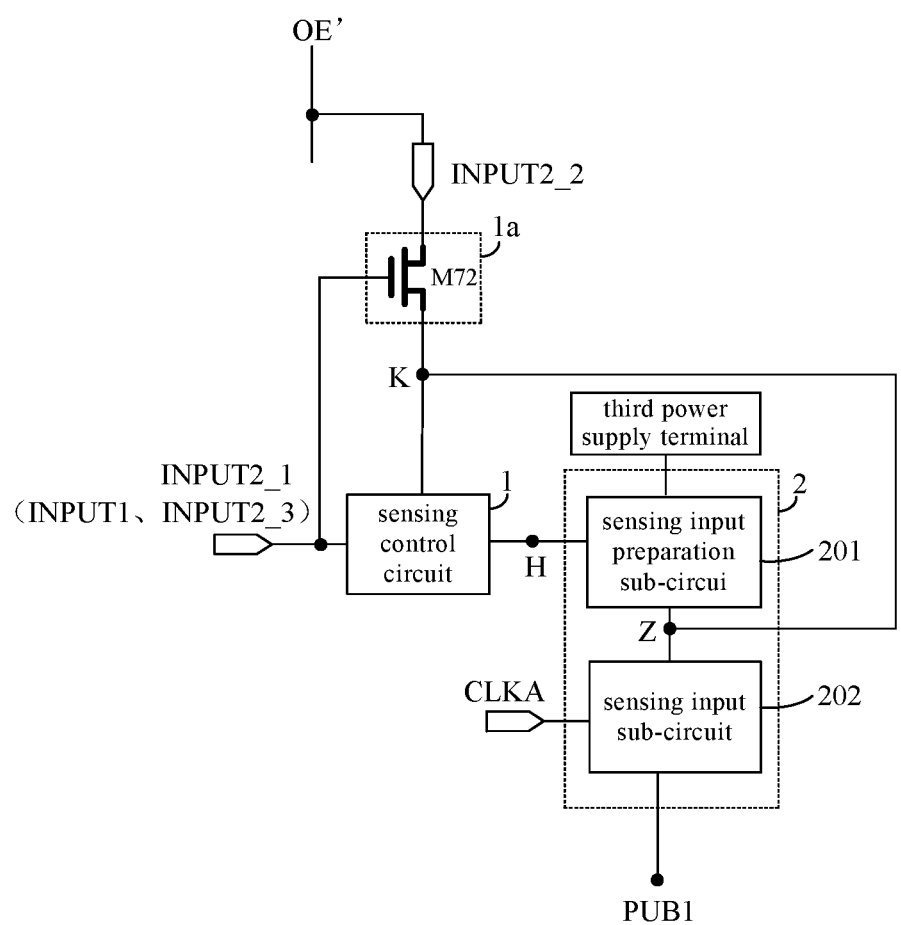
Figure 22D:
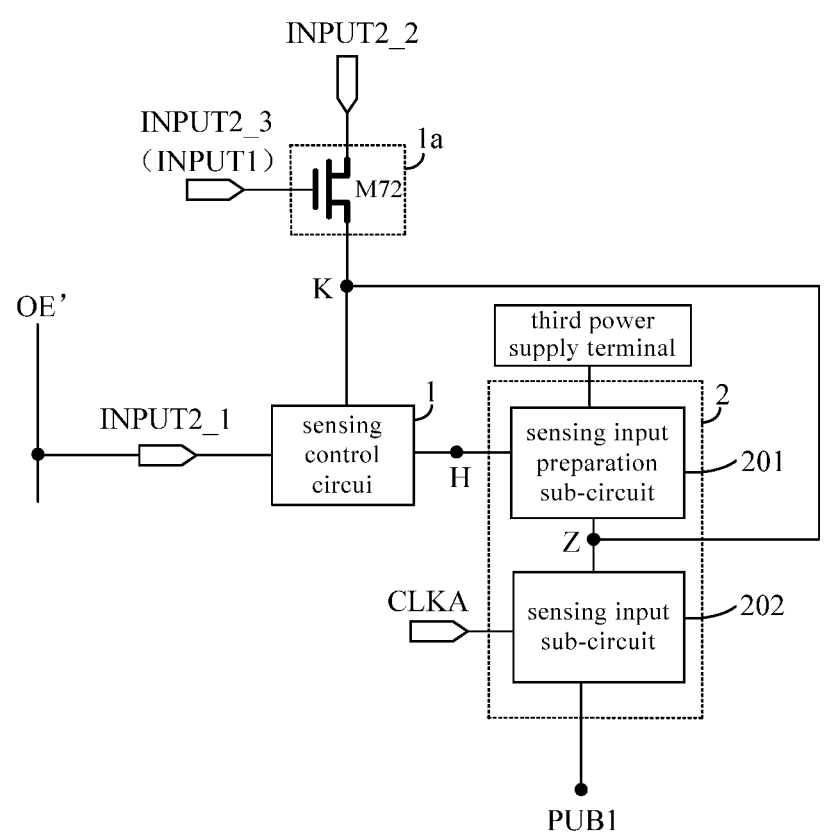

FIGS. 22A to 22D are schematic diagrams showing several different circuit structures of the sensing control circuit, the first sensing input circuit, and the sensing control anti-leakage circuit according to the embodiments of the present disclosure. With reference to FIG. 22A and FIG. 22D, in some embodiments, the third sensing signal input terminal INPUT2_3 is the first sensing signal input terminal INPUT2_1.

With reference to FIG. 22B, in some embodiments, the third sensing signal input terminal INPUT2_3 is the second sensing signal input terminal INPUT2_2.

By using the first sensing signal input terminal INPUT2_1 or the second sensing signal input terminal INPUT2_2 as the third sensing signal input terminal INPUT2_3, the number of signal input terminals configured for the shift register unit can be effectively reduced, which is beneficial to simplifying a circuit structure design. Apparently, in the embodiments of the present disclosure, the third sensing signal input terminal INPUT2_3 may also be a signal input terminal other than the first sensing signal input terminal INPUT2_1 and the second sensing signal input terminal INPUT2_2, which also belongs to the protection scope of the present disclosure.

In practical applications, in order to endow a gate driving circuit with a random sensing function, the gate driving circuit is provided with a random signal input line OE'. With reference to FIGS. 22A to 22D, in some embodiments, one of the first sensing signal input terminal INPUT2_1 and the second sensing signal input terminal INPUT2_2 is connected to the random signal input line OE'. FIGS. 22A, 22B, and 22D illustrate exemplary cases where the first sensing signal input terminal INPUT2_1 is connected to the random signal input line OE'; and FIG. 22C illustrates an exemplary case where the second sensing signal input terminal INPUT2_2 is connected to the random signal input line OE'.

With reference to FIG. 22A and FIG. 22C, in an embodiment, in the case where one of the first sensing signal input terminal INPUT2_1 and the second sensing signal input terminal INPUT2_2 is connected to the random signal input line OE', the other is the display signal input terminal INPUT1; that is, a signal provided by the display signal input terminal INPUT1 can not only be provided to the first display input circuit 7 for cascade of display driving, but also can be provided to the sensing control circuit 1 for cascade of pixel sensing. FIG. 22A illustrates an exemplary case where the first sensing signal input terminal INPUT2_1 is connected to the random signal input line OE' and the second sensing signal input terminal INPUT2_2 is the display signal input terminal INPUT1, and FIG. 22C illustrates an exemplary case where the first sensing signal input terminal INPUT2_1 is the display signal input terminal INPUT1 and the second sensing signal input terminal INPUT2_2 is connected to the random signal input line OE'.

Apparently, in the case where one of the first sensing signal input terminal INPUT2_1 and the second sensing signal input terminal INPUT2_2 is connected to the random signal input line OE', the other may be a signal input terminal other than the display signal input terminal INPUT1. In an exemplary embodiment, with reference to FIG. 22B, the first sensing signal input terminal INPUT2_1 is connected to the random signal input line OE', and the third sensing signal input terminal INPUT2_3 and the second sensing signal input terminal INPUT2_2 are the same signal input terminal other than the display signal input terminal INPUT1.

In another exemplary embodiment, with reference to FIG. 22D, the first sensing signal input terminal INPUT2_1 is connected to the random signal input line OE', the second sensing signal input terminal INPUT2_2 is a signal input terminal other than the display signal input terminal INPUT1, and the third sensing signal input terminal INPUT2_3 is the display signal input terminal INPUT1.

It should be noted that, in the embodiments of the present disclosure, any two of the first sensing signal input terminal INPUT2_1, the second sensing signal input terminal INPUT2_2, and the third sensing signal input terminal INPUT2_3 may be the same or different, which is not limited herein.

Figure 23:
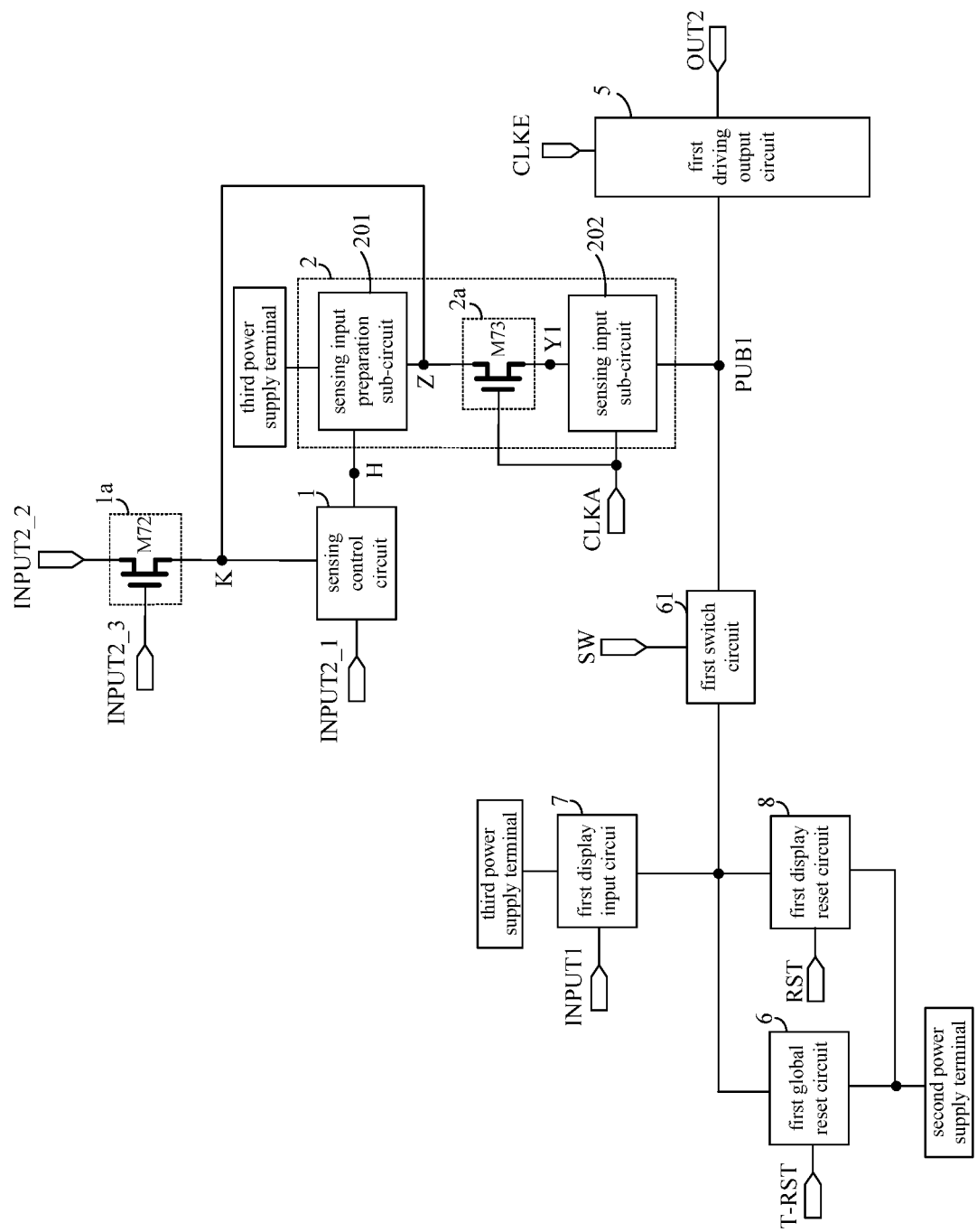
FIG. 23 is a schematic diagram showing yet another circuit structure of the shift register unit according to the embodiments of the present disclosure.

FIG. 23 is a schematic diagram showing yet another circuit structure of the shift register unit according to the embodiments of the present disclosure. As shown in FIG. 23, in some embodiments, the shift register unit further includes: a first sensing input anti-leakage circuit 2a, and the sensing input sub-circuit 202 is connected to the sensing preparation node Z through the first sensing input anti-leakage circuit 2a, and is connected to the first sensing input anti-leakage circuit 2a at a first sensing input anti-leakage node Y1. The first sensing input anti-leakage circuit 2a is further connected to the first clock control signal input terminal CLKA, and is configured to form a path between the first sensing input anti-leakage node Y1 and the sensing preparation node Z in response to control of an active level signal provided by the first clock control signal input terminal CLKA, and cut off the path between the first sensing input anti-leakage node Y1 and the sensing preparation node Z in response to control of an inactive level signal provided by the first clock control signal input terminal CLKA.

In some embodiments, the first sensing input anti-leakage circuit 2a includes: a seventy-third transistor M73.

A control electrode of the seventy-third transistor M73 is connected to the first clock control signal input terminal CLKA, a first electrode of the seventy-third transistor M73 is connected to the sensing preparation node Z, and a second electrode of the seventy-third transistor M73 is connected to the first sensing input anti-leakage node Y1.

Figure 24:
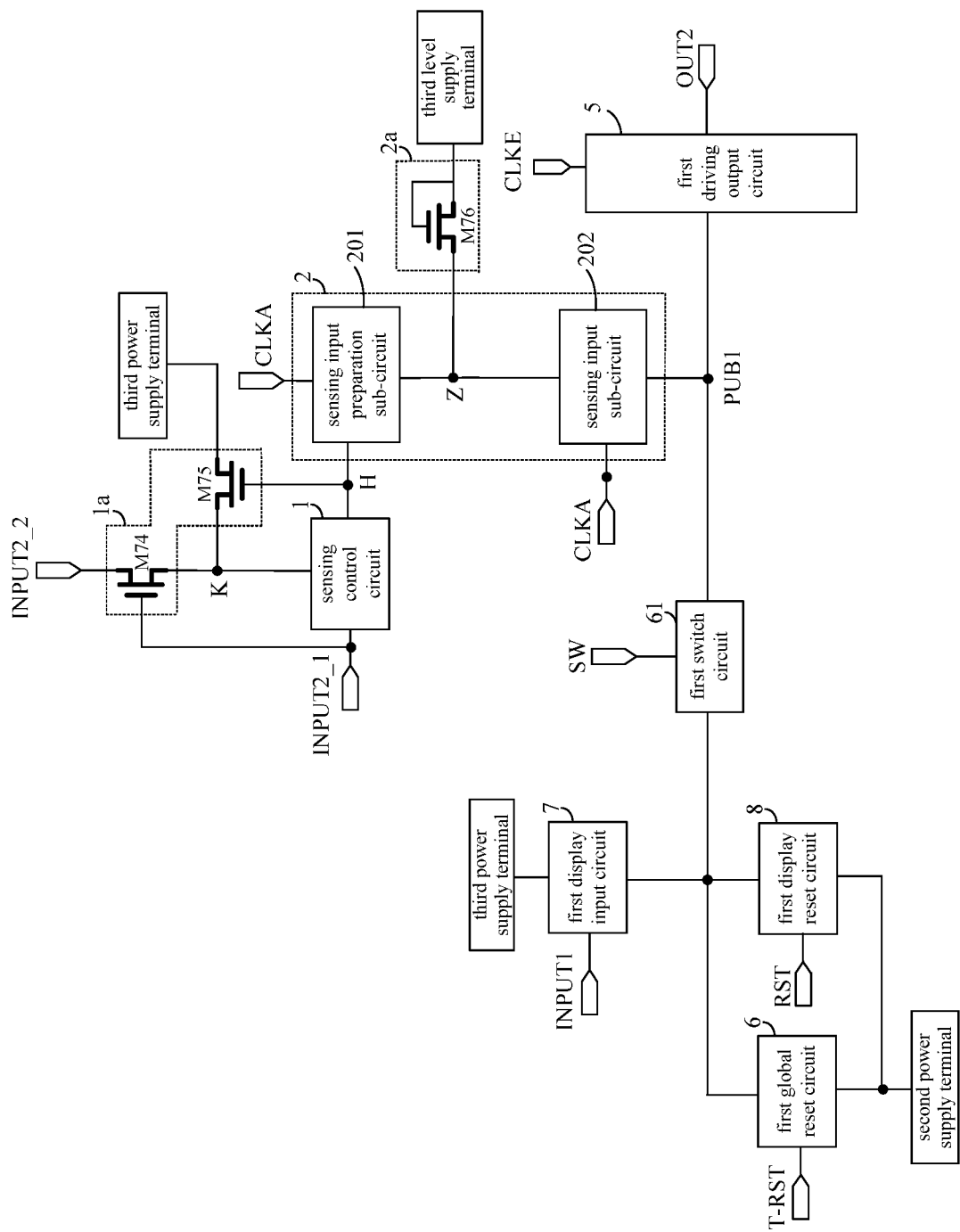
FIG. 24 is a schematic diagram showing yet another circuit structure of the shift register unit according to the embodiments of the present disclosure.

FIG. 24 is a schematic diagram showing yet another circuit structure of the shift register unit according to the embodiments of the present disclosure. As shown in FIG. 24, as another anti-leakage design for the sensing control circuit, in some embodiments, the shift register unit further includes: a sensing control anti-leakage circuit 1a, and the sensing control circuit is connected to the second sensing signal input terminal INPUT2_2 through the sensing control anti-leakage circuit 1a, and is connected to the sensing control anti-leakage circuit 1a at a sensing control anti-leakage node K. The sensing control anti-leakage circuit 1a is further connected to the first sensing signal input terminal INPUT2_1, the sensing control node H, and the third power supply terminal, and is configured to write an active level signal provided by the second sensing signal input terminal INPUT2_2 to the sensing control anti-leakage node K in response to control of an active level signal provided by the first sensing signal input terminal INPUT2_1, and write an active level signal provided by the third power supply terminal to the sensing control anti-leakage node K in response to control of an active level signal at the sensing control node H.

In some embodiments, the sensing control anti-leakage circuit 1a includes: a seventy-fourth transistor M74 and a seventy-fifth transistor M75.

A control electrode of the seventy-fourth transistor M74 is connected to the first sensing signal input terminal INPUT2_1, a first electrode of the seventy-fourth transistor M74 is connected to the second sensing signal input terminal INPUT2_2, and a second electrode of the seventy-fourth transistor M74 is connected to the sensing control anti-leakage node K.

A control electrode of the seventy-fifth transistor M75 is connected to the sensing control node H, a first electrode of the seventy-fifth transistor M75 is connected to the third power supply terminal, and a second electrode of the seventy-fifth transistor M75 is connected to the sensing control anti-leakage node K.

In some embodiments, the first level supply terminal is the first clock control signal input terminal CLKA; and the shift register unit further includes: a first sensing input anti-leakage circuit 2a connected to the sensing preparation node Z and a third level supply terminal, and configured to write an active level signal provided by the third level supply terminal to the sensing preparation node Z in response to control of the active level signal provided by the third level supply terminal.

In some embodiments, the third level supply terminal may be the first cascade signal output terminal, the first driving signal output terminal, or the second driving signal output terminal.

In some embodiments, the first sensing input anti-leakage circuit 2a includes: a seventy-sixth transistor M76; and a control electrode of the seventy-sixth transistor M76 is connected to the third level supply terminal, a first electrode of the seventy-sixth transistor M76 is connected to the third level supply terminal, and a second electrode of the seventy-sixth transistor M76 is connected to the sensing preparation node Z.

Figure 25:
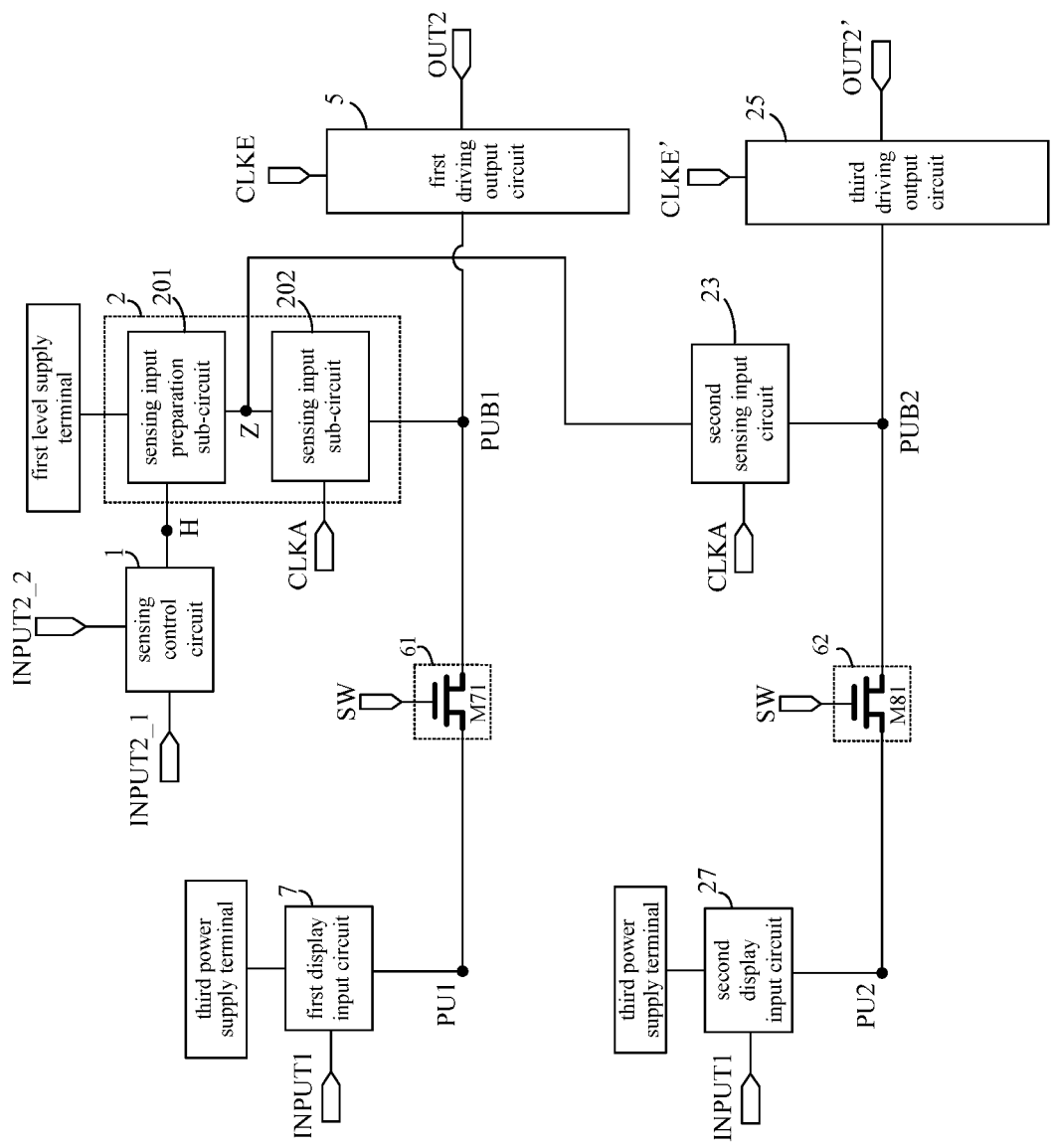
FIG. 25 is a schematic diagram showing yet another circuit structure of the shift register unit according to the embodiments of the present disclosure.

FIG. 25 is a schematic diagram showing yet another circuit structure of the shift register unit according to the embodiments of the present disclosure. As shown in FIG. 25, the shift register unit shown in FIG. 25 not only includes the first sensing input circuit 1, the first display input circuit 7, the first switch circuit 61, and the first driving output circuit 5 in the above embodiments, but also includes: a second sensing input circuit 23, a second display input circuit 27, a second switch circuit 62, and a third driving output circuit 25.

The second sensing input circuit 23 is connected to the first clock control signal input terminal CLKA, the sensing preparation node, and a second pull-up back node PUB2, and is configured to write a signal at the sensing preparation node to the second pull-up back node PUB2 in response to control of an active level signal provided by the first clock control signal input terminal CLKA.

The second display input circuit 27 is connected to the display signal input terminal INPUT1, the third power supply terminal, and a second pull-up node PU2, and is configured to write an active level signal provided by the third power supply terminal to the second pull-up node PU2 in response to control of an active level signal provided by the display signal input terminal INPUT1.

The second switch circuit 62 is connected in series between the second pull-up node PU2 and the second pull-up back node PUB2, is connected to the switch signal input terminal SW, and is configured to control connection and disconnection between the second pull-up node PU2 and the second pull-up back node PUB2 in response to control of a signal provided by the switch signal input terminal SW.

The third driving output circuit 25 is connected to the second pull-up back node PUB2, a third driving clock signal input terminal CLKE', and a third driving signal output terminal OUT2', and is configured to write a signal provided by the third driving clock signal input terminal CLKE' to the third driving signal output terminal OUT2' in response to control of an active level signal at the second pull-up back node PUB2.

In the embodiments of the present disclosure, the first driving output circuit 5 can be configured to provide a corresponding driving signal to one second gate line configured for a certain row of pixel units in the display panel, and meanwhile, the third driving output circuit 25 can also be configured to provide a corresponding driving signal to another second gate line configured for another row of pixel units in the display panel. That is, the shift register unit provided by the embodiments of the present disclosure can be configured to drive the second gate lines configured for two rows of pixel units (e.g., two adjacent rows of pixel units). With such design, the number of stages of shift register units in the gate driving circuit can be effectively reduced, a region occupied by the gate driving circuit can be reduced, and the narrow frame design of the product can be facilitated.

Similar to the function of the first switch circuit described above, the second switch circuit 62 can also effectively improve stability of a process of outputting a pulse for pixel sensing by the third driving output circuit 25. Specifically, in the process of outputting the pulse for pixel sensing by the third driving output circuit 25, a path between the second pull-up node PUB2 and the second pull-up node PU2 remains off state, so that an electrical device in the second display input circuit 27 does not cause interference to a voltage at the second pull-up node PUB2, thereby achieving better stability of the process of outputting the pulse for pixel sensing by the third driving output circuit 25.

In some embodiments, the second switch circuit 62 includes: an eighty-first transistor M81; and a control electrode of the eighty-first transistor M81 is connected to the switch signal input terminal SW, a first electrode of the eighty-first transistor M81 is connected to the second pull-up node PU2, and a second electrode of the eighty-first transistor M81 is connected to the second pull-up back node PUB2.

Figure 26:
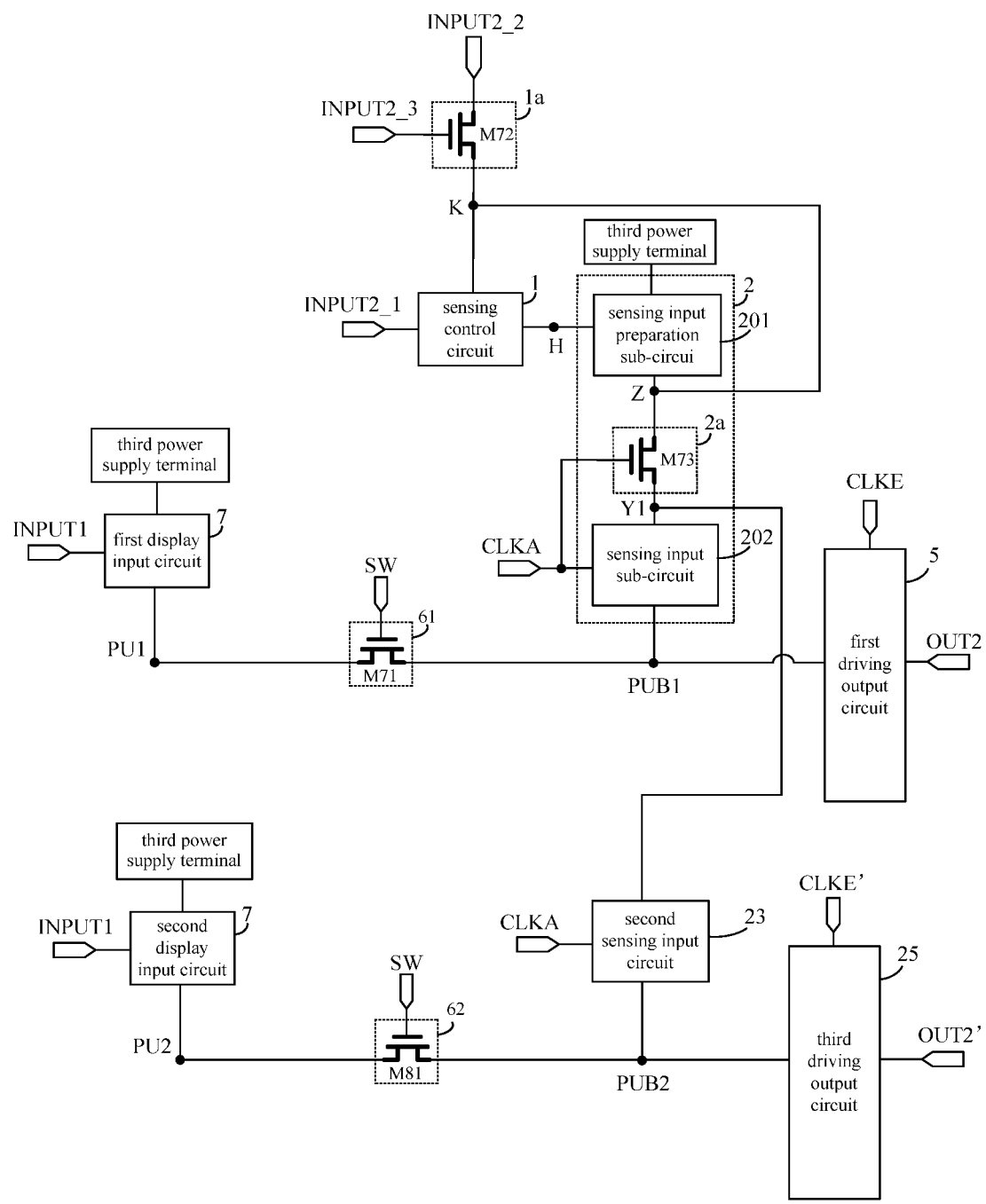
FIG. 26 is a schematic diagram showing yet another circuit structure of the shift register unit according to the embodiments of the present disclosure.

FIG. 26 is a schematic diagram showing yet another circuit structure of the shift register unit according to the embodiments of the present disclosure. As shown in FIG. 26, the shift register unit includes a first sensing input anti-leakage circuit 2a, and the sensing input sub-circuit 202 is connected to the sensing preparation node Z through the first sensing input anti-leakage circuit 2a, and is connected to the first sensing input anti-leakage circuit 2a at a first sensing input anti-leakage node Y1.

The first sensing input anti-leakage circuit 2a is further connected to the first clock control signal input terminal CLKA, and is configured to form a path between the first sensing input anti-leakage node Y1 and the sensing preparation node Z in response to control of an active level signal provided by the first clock control signal input terminal CLKA, and cut off the path between the first sensing input anti-leakage node Y1 and the sensing preparation node Z in response to control of an inactive level signal provided by the first clock control signal input terminal CLKA.

The second sensing input circuit 23 is connected to the first sensing input anti-leakage node Y1 to be connected to the sensing preparation node z through the first sensing input anti-leakage circuit 2a.

In the case illustrated by FIG. 26, the sensing input sub-circuit 202 and the second sensing input circuit 23 share the same first sensing input anti-leakage circuit 2a to achieve leakage prevention.

In some embodiments, the first sensing input anti-leakage circuit 2a includes: a seventy-third transistor M73.

A control electrode of the seventy-third transistor M73 is connected to the first clock control signal input terminal CLKA, a first electrode of the seventy-third transistor M73 is connected to the sensing preparation node Z, and a second electrode of the seventy-third transistor M73 is connected to the first sensing input anti-leakage node Y1.

Figure 27:
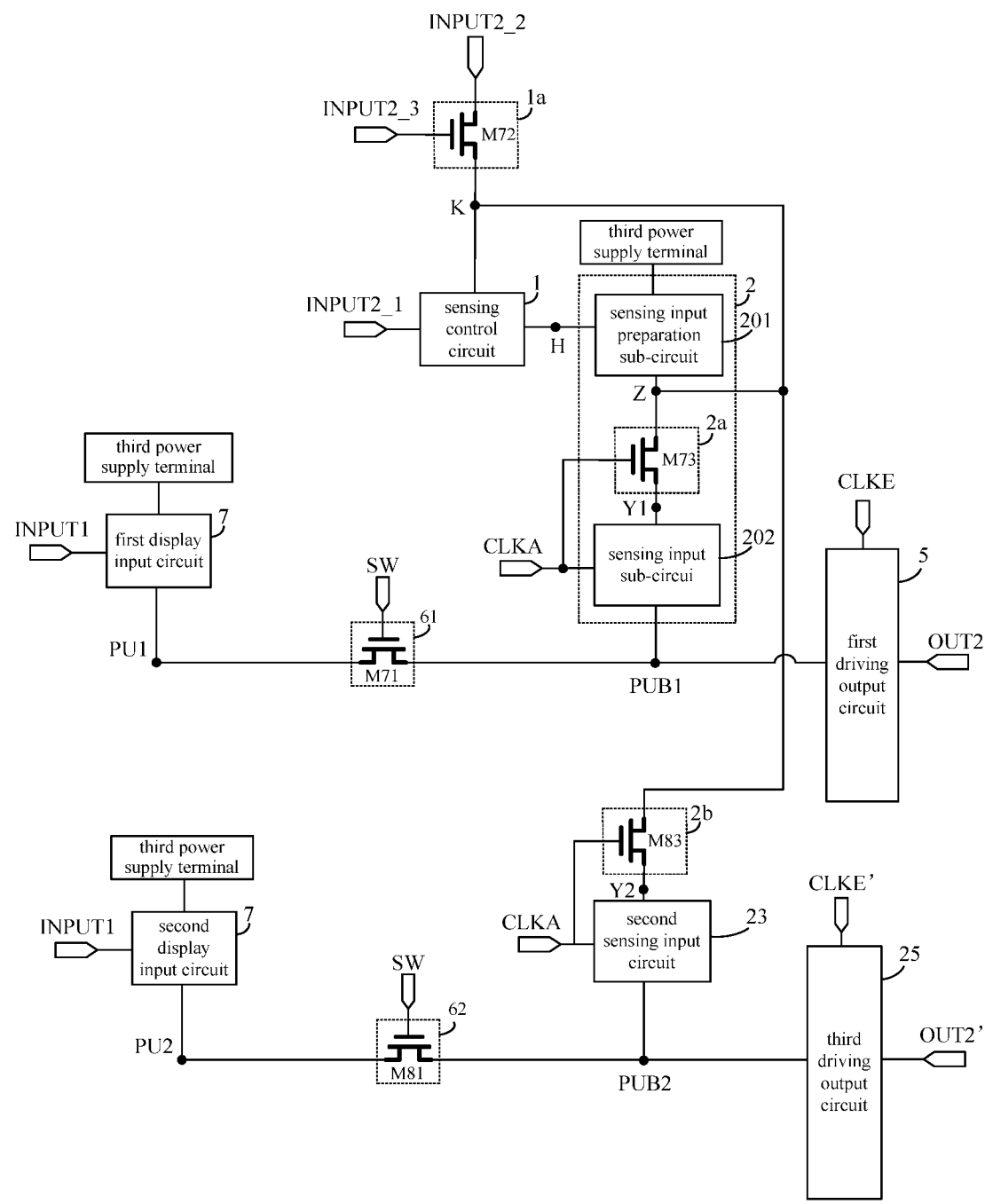
FIG. 27 is a schematic diagram showing yet another circuit structure of the shift register unit according to the embodiments of the present disclosure.

FIG. 27 is a schematic diagram showing yet another circuit structure of the shift register unit according to the embodiments of the present disclosure. As shown in FIG. 27, unlike the solution illustrated by FIG. 26 in which the sensing input sub-circuit 202 and the second sensing input circuit 23 share the same first sensing input anti-leakage circuit 2a to achieve leakage prevention, in the solution illustrated by FIG. 27, the sensing input sub-circuit 202 achieves leakage prevention through the first sensing input anti-leakage circuit 2a, and the second sensing input circuit 23 achieves leakage prevention through a second sensing input anti-leakage circuit 2b.

The second sensing input circuit 23 is connected to the sensing preparation node Z through the second sensing input anti-leakage circuit 2b, and is connected to the second sensing input anti-leakage circuit 2b at a second sensing input anti-leakage node Y2.

The second sensing input anti-leakage circuit 2b is further connected to the first clock control signal input terminal CLKA, and is configured to form a path between the second sensing input anti-leakage node Y2 and the sensing preparation node Z in response to control of an active level signal provided by the first clock control signal input terminal CLKA, and cut off the path between the second sensing input anti-leakage node Y2 and the sensing preparation node Z in response to control of an inactive level signal provided by the first clock control signal input terminal CLKA.

In some embodiments, the second sensing input anti-leakage circuit 2b includes: an eighty-third transistor M83.

A control electrode of the eighty-third transistor M83 is connected to the first clock control signal input terminal CLKA, a first electrode of the eighty-third transistor M83 is connected to the sensing preparation node Z, and a second electrode of the eighty-third transistor M83 is connected to the second sensing input anti-leakage node Y2.

Figure 28:
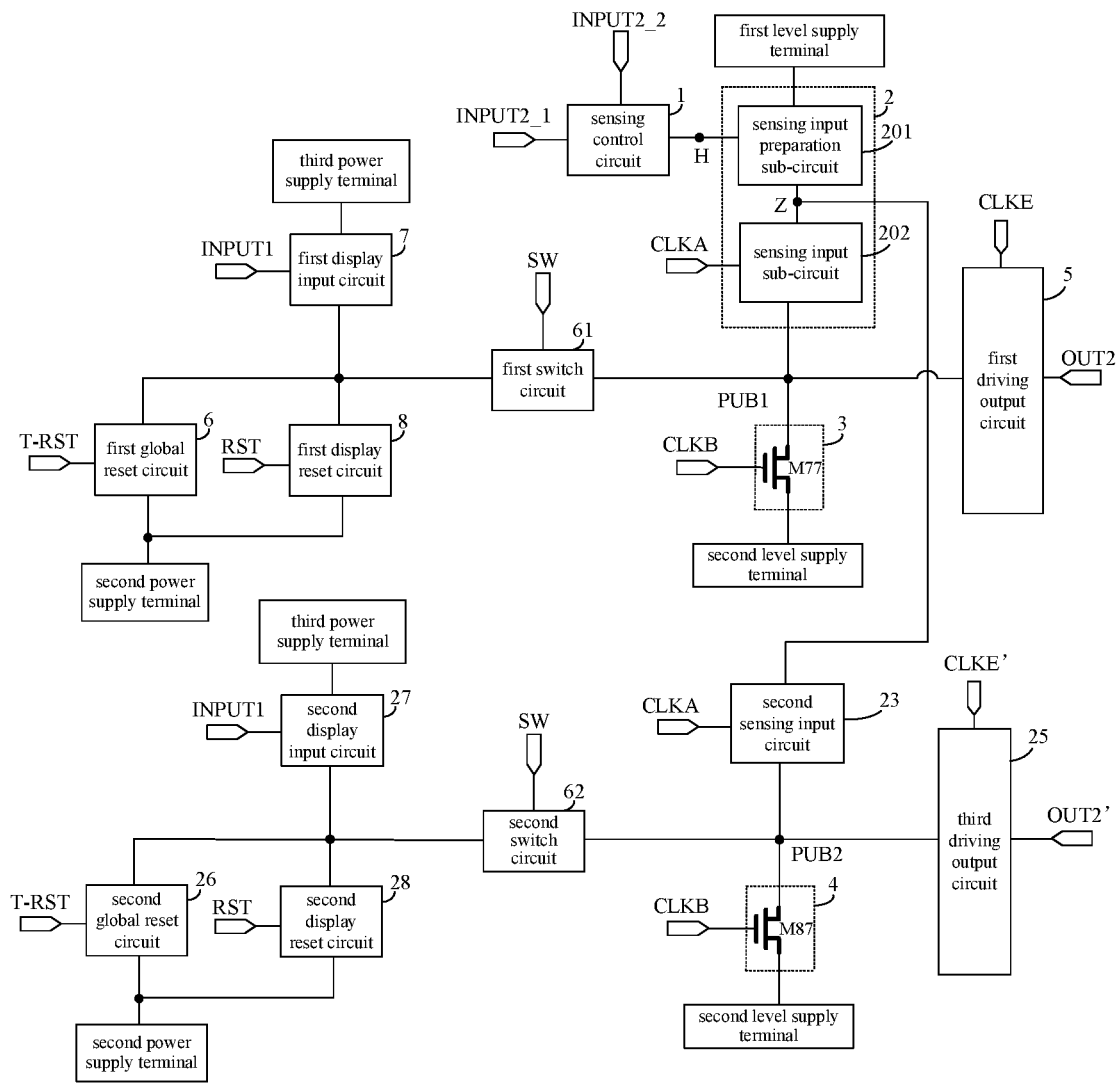
FIG. 28 is a schematic diagram showing yet another circuit structure of the shift register unit according to the embodiments of the present disclosure.

FIG. 28 is a schematic diagram showing yet another circuit structure of the shift register unit according to the embodiments of the present disclosure. As shown in FIG. 28, in some embodiments, the shift register unit further includes: a second display reset circuit 28 and a second global reset circuit 26.

The second display reset circuit 28 is connected to the display reset signal input terminal RST, the second power supply terminal, and the second pull-up node PU2, and is configured to write an inactive level signal provided by the second power supply terminal to the second pull-up node PU2 in response to control of an active level signal provided by the display reset signal input terminal RST.

The second global reset circuit 26 is connected to the global reset signal input terminal T-RST, the second power supply terminal, and the second pull-up node PU2, and is configured to write an inactive level signal provided by the second power supply terminal to the second pull-up node PU2 in response to control of an active level signal provided by the global reset signal input terminal T-RST.

In some embodiments, the shift register unit further includes: a second sensing reset circuit 4 connected to the second clock control signal input terminal CLKB, the second level supply terminal, and the second pull-up back node PUB2, is configured to write an inactive level signal provided by the second level supply terminal to the second pull-up back node PUB2 in response to control of an active level signal provided by the second clock control signal input terminal CLKB.

Similar to the function of the first sensing reset circuit described above, the second sensing reset circuit 4 in the present embodiment can be configured to reset the second pull-up back node, so that reset of the second pull-up back node PUB2 no longer depends on the second global reset circuit 26 and the second switch circuit 62.

In some embodiments, the second sensing reset circuit 4 includes: an eighty-seventh transistor M87.

A control electrode of the eighty-seventh transistor M87 is connected to the second clock control signal input terminal CLKB, a first electrode of the eighty-seventh transistor M87 is connected to the second pull-up back node PUB2, and a second electrode of the eighty-seventh transistor M87 is connected to the second level supply terminal.

Figure 29:
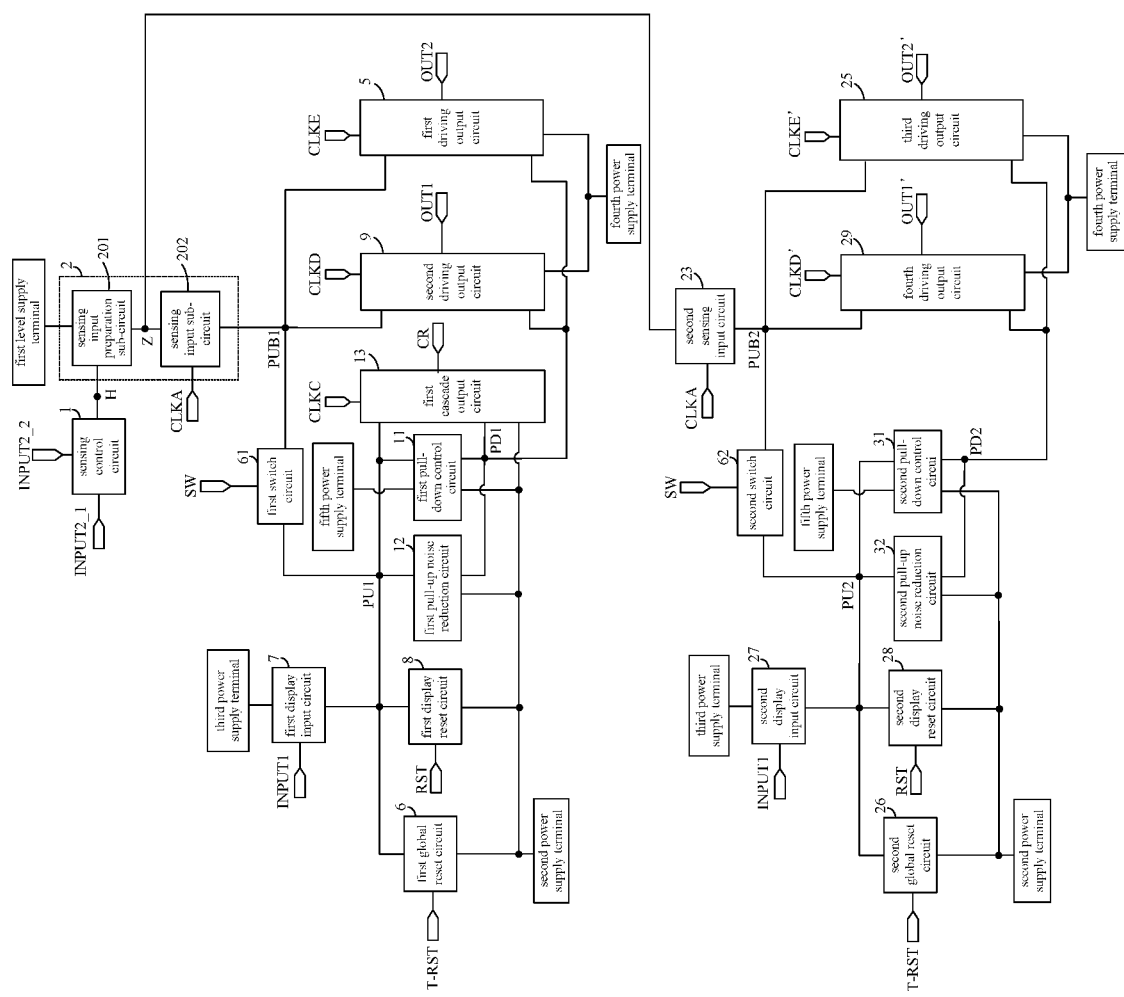
FIG. 29 is a schematic diagram showing yet another circuit structure of the shift register unit according to the embodiments of the present disclosure.

FIG. 29 is a schematic diagram showing yet another circuit structure of the shift register unit according to the embodiments of the present disclosure. As shown in FIG. 29, in some embodiments, the shift register unit further includes: a fourth driving output circuit 29 connected to the second pull-up back node PUB2, a fourth driving clock signal input terminal CLKD', and a fourth driving signal output terminal OUT1', and configured to write a signal provided by the fourth driving clock signal input terminal CLKD' to the fourth driving signal output terminal OUT1' in response to control of an active level signal at the second pull-up back node PUB2. The fourth driving signal output terminal OUT1' is connected to a first gate line in pixel units in a corresponding row to provide a driving signal to the first gate line of the corresponding row.

In the embodiments of the present disclosure, the first driving output circuit 5 and the second driving output circuit 9 can be configured to respectively provide corresponding driving signals to one first gate line and one second gate line configured for a certain row of pixel units in the display panel, and meanwhile, the third driving output circuit 25 and the fourth driving output circuit 29 can be configured to respectively provide corresponding driving signals to one first gate line and one second gate line configured for another row of pixel units in the display panel. That is, the shift register unit provided by the present embodiment can be configured to drive four gate lines configured for two rows of pixel units (e.g., two adjacent rows of pixel units). With such design, the number of the stages of the shift register units in the gate driving circuit can be effectively reduced, the region occupied by the gate driving circuit can be reduced, and the narrow frame design of the product can be facilitated.

In some embodiments, the shift register unit further includes: a second pull-down control circuit 31 and a second pull-up noise reduction circuit 32.

The second pull-down control circuit 31 is connected to the second power supply terminal, the fifth power supply terminal, the second pull-up node PU2, and the second pull-down node PD2, and is configured to write a voltage having a phase opposite to that of a voltage at the second pull-up node PU2 to the second pull-down node PD2.

The second pull-up noise reduction circuit 32 is connected to the second power supply terminal, the second pull-up node PU2, and the second pull-down node PD2, and is configured to write an inactive level signal provided by the second power supply terminal to the second pull-up node PU2 in response to control of an active level signal at the second pull-down node PD2.

The third driving output circuit 25 is further connected to the second pull-down node PD2 and the fourth power supply terminal, and is further configured to write an inactive level signal provided by the fourth power supply terminal to the third driving signal output terminal OUT2' in response to control of an active level signal at the second pull-down node PD2.

The fourth driving output circuit 29 is further connected to the second pull-down node PD2 and the fourth power supply terminal, and is further configured to write an inactive level signal provided by the fourth power supply terminal to the fourth driving signal output terminal OUT1' in response to control of an active level signal at the second pull-down node PD2.

Figure 30:
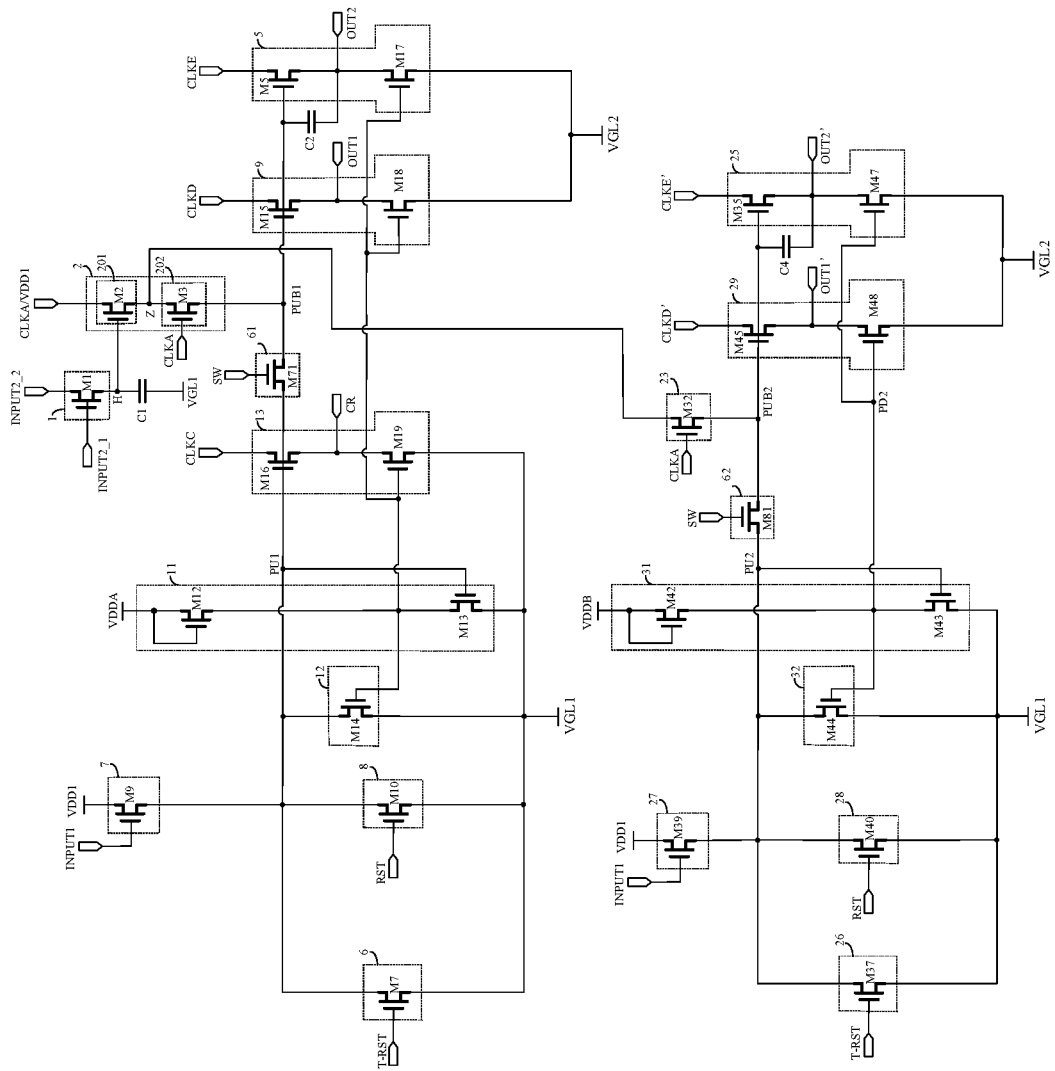
FIG. 30 is a schematic diagram showing yet another circuit structure of the shift register unit according to the embodiments of the present disclosure.

FIG. 30 is a schematic diagram showing yet another circuit structure of the shift register unit according to the embodiments of the present disclosure. As shown in FIG. 30, the shift register unit shown in FIG. 30 is an exemplary implementation based on the shift register unit shown in FIG. 29.

Specific circuit structures of the sensing control circuit 1, the first sensing input circuit 2, the first switch circuit 61, the first global reset circuit 6, the first display input circuit 7, the first display reset circuit 8, the first pull-down control circuit 11, the first pull-up noise reduction circuit 12, the first driving output circuit 5, the second driving output circuit 9, and the first cascade output circuit 13 in the present embodiment may refer to the contents of the above embodiments, and thus will not be repeated here.

The second sensing input circuit 23 includes: a thirty-second transistor M32; and a control electrode of the thirty-second transistor M32 is connected to the sensing control node H, a first electrode of the thirty-second transistor M32 is connected to the first clock control signal input terminal CLKA, and a second electrode of the thirty-second transistor M32 is connected to the second pull-up node PU2.

In some embodiments, the second switch circuit 62 includes: the eighty-first transistor M81; and the control electrode of the eighty-first transistor M81 is connected to the switch signal input terminal SW, the first electrode of the eighty-first transistor M81 is connected to the second pull-up node PU2, and the second electrode of the eighty-first transistor M81 is connected to the second pull-up back node PUB2.

In some embodiments, the second display input circuit 27 includes a thirty-ninth transistor M39.

A control electrode of the thirty-ninth transistor M39 is connected to the display signal input terminal INPUT1, a first electrode of the thirty-ninth transistor M39 is connected to the third power supply terminal, and a second electrode of the thirty-ninth transistor M39 is connected to the second pull-up node PU2.

The third driving output circuit 25 includes a thirty-fifth transistor M35 and a forty-seventh transistor M47, and the fourth driving output circuit 29 includes a forty-fifth transistor M45 and a forty-eighth transistor M48.

A control electrode of the thirty-fifth transistor M35 is connected to the second pull-up back node PUB2, a first electrode of the thirty-fifth transistor M35 is connected to the third driving clock signal input terminal CLKE', and a second electrode of the thirty-fifth transistor M35 is connected to the third driving signal output terminal OUT2.

A control electrode of the forty-seventh transistor M47 is connected to the second pull-down node PD2, a first electrode of the forty-seventh transistor M47 is connected to the third driving signal output terminal OUT2', and a second electrode of the forty-seventh transistor M47 is connected to the fourth power supply terminal.

A control electrode of the forty-fifth transistor M45 is connected to the second pull-up back node PUB2, a first electrode of the forty-fifth transistor M45 is connected to the fourth driving clock signal input terminal CLKD', and a second electrode of the forty-fifth transistor M45 is connected to the fourth driving signal output terminal OUT1.

A control electrode of the forty-eighth transistor M48 is connected to the second pull-down node PD2, a first electrode of the forty-eighth transistor M48 is connected to the fourth driving signal output terminal OUT1', and a second electrode of the forty-eighth transistor M48 is connected to the fourth power supply terminal.

In some embodiments, a fourth capacitor C4 is provided for the third driving signal output terminal OUT2'.

In some embodiments, the second global reset circuit 26 includes a thirty-seventh transistor M37, the second display reset circuit 28 includes a fortieth transistor M40, the second pull-down control circuit 31 includes a forty-second transistor M42 and a forty-third transistor M43, and the second pull-up noise reduction circuit 32 includes a forty-fourth transistor M44.

A control electrode of the thirty-seventh transistor M37 is connected to the global reset signal input terminal T-RST, a first electrode of the thirty-seventh transistor M37 is connected to the second pull-up node PU2, and a second electrode of the thirty-seventh transistor M37 is connected to an inactive level supply terminal.

A control electrode of the fortieth transistor M40 is connected to the display reset signal input terminal RST, a first electrode of the fortieth transistor M40 is connected to the second pull-up node PU2, and a second electrode of the fortieth transistor M40 is connected to the inactive level supply terminal.

A control electrode of the forty-second transistor M42 is connected to a sixth power supply terminal, a first electrode of the forty-second transistor M42 is connected to the sixth power supply terminal (the sixth power supply terminal provides a voltage VDDB), and a second electrode of the forty-second transistor M42 is connected to the second pull-down node PD2.

A control electrode of the forty-third transistor M43 is connected to the second pull-up node PU2, a first electrode of the forty-third transistor M43 is connected to the second pull-down node PD2, and a second electrode of the forty-third transistor M43 is connected to the inactive level supply terminal.

A control electrode of the forty-fourth transistor M44 is connected to the second pull-down node PD2, a first electrode of the forty-fourth transistor M44 is connected to the second pull-up node PU2, and a second electrode of the forty-fourth transistor M44 is connected to the inactive level supply terminal.

In some embodiments, the fifth power supply terminal provides the voltage VDDA and the sixth power supply terminal provides the voltage VDDB, and VDDA and VDDB can each be switched between a high level voltage and a low level voltage (such as switched once every one frame or every several frames). At any moment, one of VDDA and VDDB is a high level voltage, and the other is a low level voltage.

In some embodiments, the shift register unit may further include a second cascade output circuit (not shown). The second cascade output circuit is connected to the second pull-up node, a second cascade clock signal input terminal, and a second cascade signal output terminal, and is configured to write a signal provided by the second cascade clock signal input terminal to the second cascade signal output terminal in response to control of an active level signal at the second pull-up node.

In some embodiments, the second cascade output circuit may be further connected to the second power supply terminal and the second pull-down node, and is configured to write an inactive level signal provided by the second power supply terminal to the second cascade signal output terminal in response to control of an active level signal at the second pull-down node.

Figure 31:
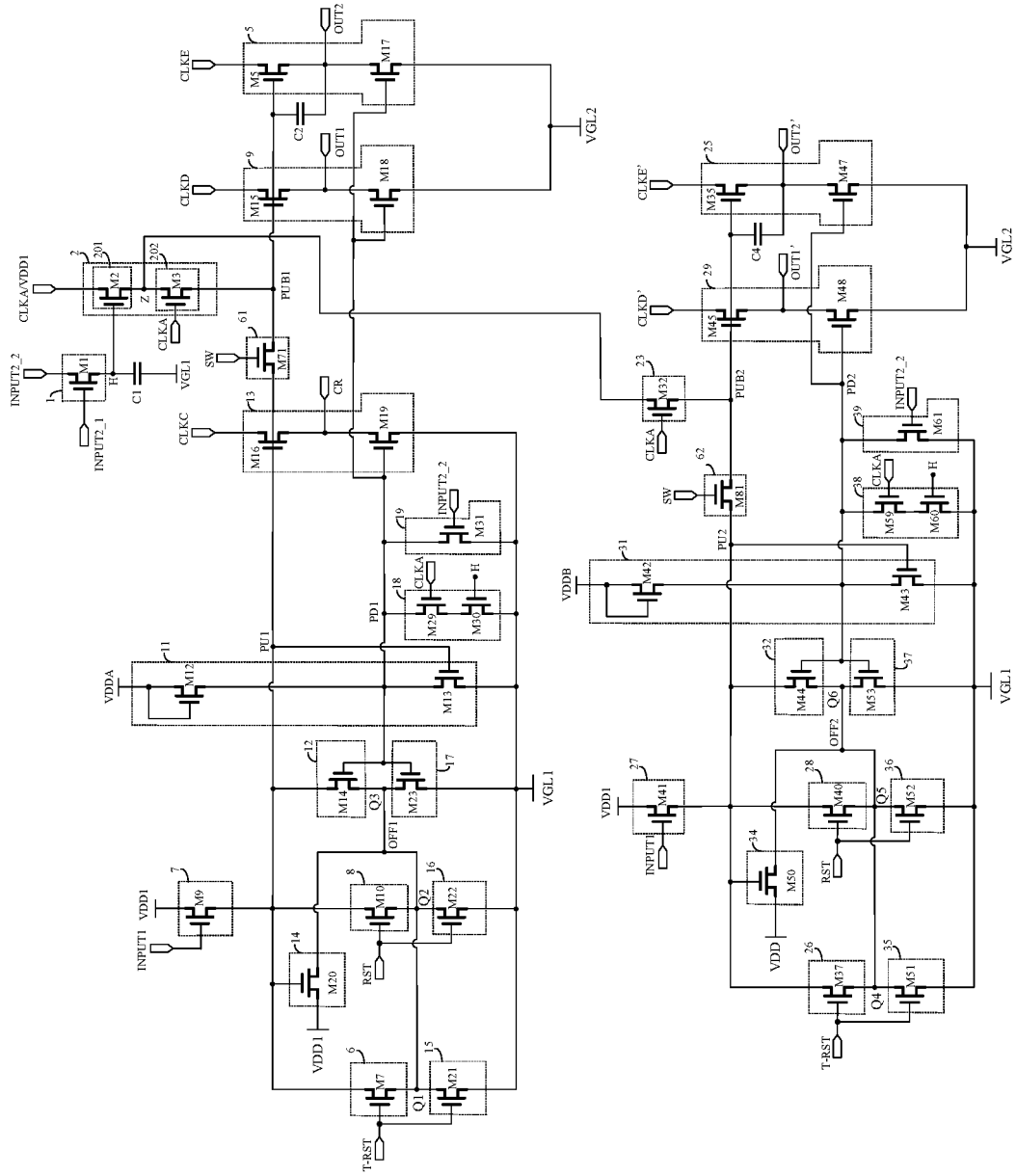
FIG. 31 is a schematic diagram showing yet another circuit structure of the shift register unit according to the embodiments of the present disclosure.

FIG. 31 is a schematic diagram showing yet another circuit structure of the shift register unit according to the embodiments of the present disclosure. As shown in FIG. 31, in some embodiments, in a case where the shift register unit includes the second global reset circuit 26, the second display reset circuit 28, and the second pull-up noise reduction circuit 32, an anti-leakage design may be provided for at least one of the second global reset circuit 26, the second display reset circuit 28, and the second pull-up noise reduction circuit 32.

In some embodiments, the shift register unit further includes: a second voltage control circuit 34; and the second voltage control circuit 34 is connected to the third power supply terminal, the second pull-up node PU2, and a second voltage control node OFF2, and is configured to write an active level signal provided by the third power supply terminal to the second voltage control node OFF2 in response to control of an active level signal at the second pull-up node PU2.

The shift register unit further includes: at least one of a fourth anti-leakage circuit 35, a fifth anti-leakage circuit 36, and a sixth anti-leakage circuit 37.

The second global reset circuit 26 is connected to the second power supply terminal through the fourth anti-leakage circuit 35, and is connected to the fourth anti-leakage circuit 35 at a fourth anti-leakage node Q4, and the fourth anti-leakage node Q4 is connected to the second voltage control node OFF2. The fourth anti-leakage circuit 35 is connected to the sensing reset signal input terminal T-RST, and is configured to form a path between the fourth anti-leakage node Q4 and the second power supply terminal in response to control of an active level signal provided by the sensing reset signal input terminal T-RST, and cut off the path between the fourth anti-leakage node Q4 and the second power supply terminal in response to control of an inactive level signal provided by a cascade reset signal input terminal.

The second display reset circuit 28 is connected to the second power supply terminal through the fifth anti-leakage circuit 36, and is connected to the fifth anti-leakage circuit 36 at a fifth anti-leakage node Q5, and the fifth anti-leakage node Q5 is connected to the second voltage control node OFF2. The fifth anti-leakage circuit 36 is connected to the display reset signal input terminal RST, and is configured to form a path between the fifth anti-leakage node Q5 and the second power supply terminal in response to control of an active level signal provided by the display reset signal input terminal RST, and cut off the path between the fifth anti-leakage node Q5 and the second power supply terminal in response to control of an inactive level signal provided by the cascade reset signal input terminal.

The second pull-up noise reduction circuit 32 is connected to the second power supply terminal through the sixth anti-leakage circuit 37, and is connected to the sixth anti-leakage circuit 37 at a sixth anti-leakage node Q6, and the sixth anti-leakage node Q6 is connected to the second voltage control node OFF2. The sixth anti-leakage circuit 37 is connected to the second pull-down node PD2, and is configured to form a path between the sixth anti-leakage node Q6 and the second power supply terminal in response to control of an active level signal at the second pull-down node PD2, and cut off the path between the sixth anti-leakage node Q6 and the second power supply terminal in response to control of an inactive level signal at the second pull-down node PD2.

In some embodiments, the second voltage control circuit 34 includes a fiftieth transistor M50, a control electrode of the fiftieth transistor M50 is connected to the first pull-up node PU1, a first electrode of the fiftieth transistor M50 is connected to the active level supply terminal, and a second electrode of the fiftieth transistor M50 is connected to the second voltage control node OFF2.

In some embodiments, the fourth anti-leakage circuit 35 includes a fifty-first transistor M51, a control electrode of the fifty-first transistor M51 is connected to the sensing reset signal input terminal T-RST, a first electrode of the fifty-first transistor M51 is connected to the sensing reset circuit and the second voltage control node OFF2, and a second electrode of the fifty-first transistor M51 is connected to the second power supply terminal.

In some embodiments, the fifth anti-leakage circuit 36 includes a fifty-second transistor M52, a control electrode of the fifty-second transistor M52 is connected to the display reset signal input terminal RST, a first electrode of the fifty-second transistor M52 is connected to the display reset circuit and the second voltage control node OFF2, and a second electrode of the fifty-second transistor M52 is connected to the second power supply terminal.

In some embodiments, the sixth anti-leakage circuit 37 includes: a fifty-third transistor M53, a control electrode of the fifty-third transistor M53 is connected to the second pull-down node PD2, a first electrode of the fifty-third transistor M53 is connected to the second pull-down control circuit and the second voltage control node OFF2, and a second electrode of the fifty-third transistor M53 is connected to the second power supply terminal.

FIG. 31 illustrates an exemplary case where the shift register unit includes all of the fourth anti-leakage circuit 35, the fifth anti-leakage circuit 36, and the sixth anti-leakage circuit 37. In practical applications, at least one of the fourth anti-leakage circuit 35, the fifth anti-leakage circuit 36, and the sixth anti-leakage circuit 37 may be configured according to actual needs.

Still with reference to FIG. 31, in some embodiments, the shift register unit further includes a third pull-down noise reduction circuit 38 and/or a fourth pull-down noise reduction circuit 39.

The third pull-down noise reduction circuit 38 is connected to the second pull-down node PD2, the second power supply terminal, the sensing control node H, and the clock control signal input terminal CLKA, and the first pull-down noise reduction circuit 18 is configured to write an inactive level signal provided by the second power supply terminal to the first pull-down node PD1 in response to control of an active level signal at the sensing control node H and an active level signal provided by the clock control signal input terminal CLKA to perform noise reduction on a voltage at the first pull-down node PD1.

The fourth pull-down noise reduction circuit 39 is connected to the second pull-down node PD2, the second power supply terminal, and the second sensing signal input terminal INPUT2_2, and the second pull-down noise reduction circuit 19 is configured to write an inactive level signal provided by the second power supply terminal to the second pull-down node PD2 in response to control of an active level signal provided by the second sensing signal input terminal INPUT2_2 to perform noise reduction on the voltage at the first pull-down node PD1.

In some embodiments, the third pull-down noise reduction circuit 38 includes a fifty-ninth transistor M59 and a sixtieth transistor M60, and the fourth pull-down noise reduction circuit 39 includes a sixty-first transistor M61.

A control electrode of the fifty-ninth transistor M59 is connected to the first clock control signal input terminal CLKA, a first electrode of the fifty-ninth transistor M59 is connected to the second pull-down node PD2, and a second electrode of the fifty-ninth transistor M59 is connected to a first electrode of the sixtieth transistor M60.

A control electrode of the sixtieth transistor M60 is connected to the sensing control node H, and a second electrode of the sixtieth transistor M60 is connected to the second power supply terminal.

A control electrode of the sixty-first transistor M61 is connected to the second sensing signal input terminal, a first electrode of the sixty-first transistor M61 is connected to the second pull-down node PD2, and a second electrode of the sixty-first transistor M61 is connected to the second power supply terminal.

Figure 32:
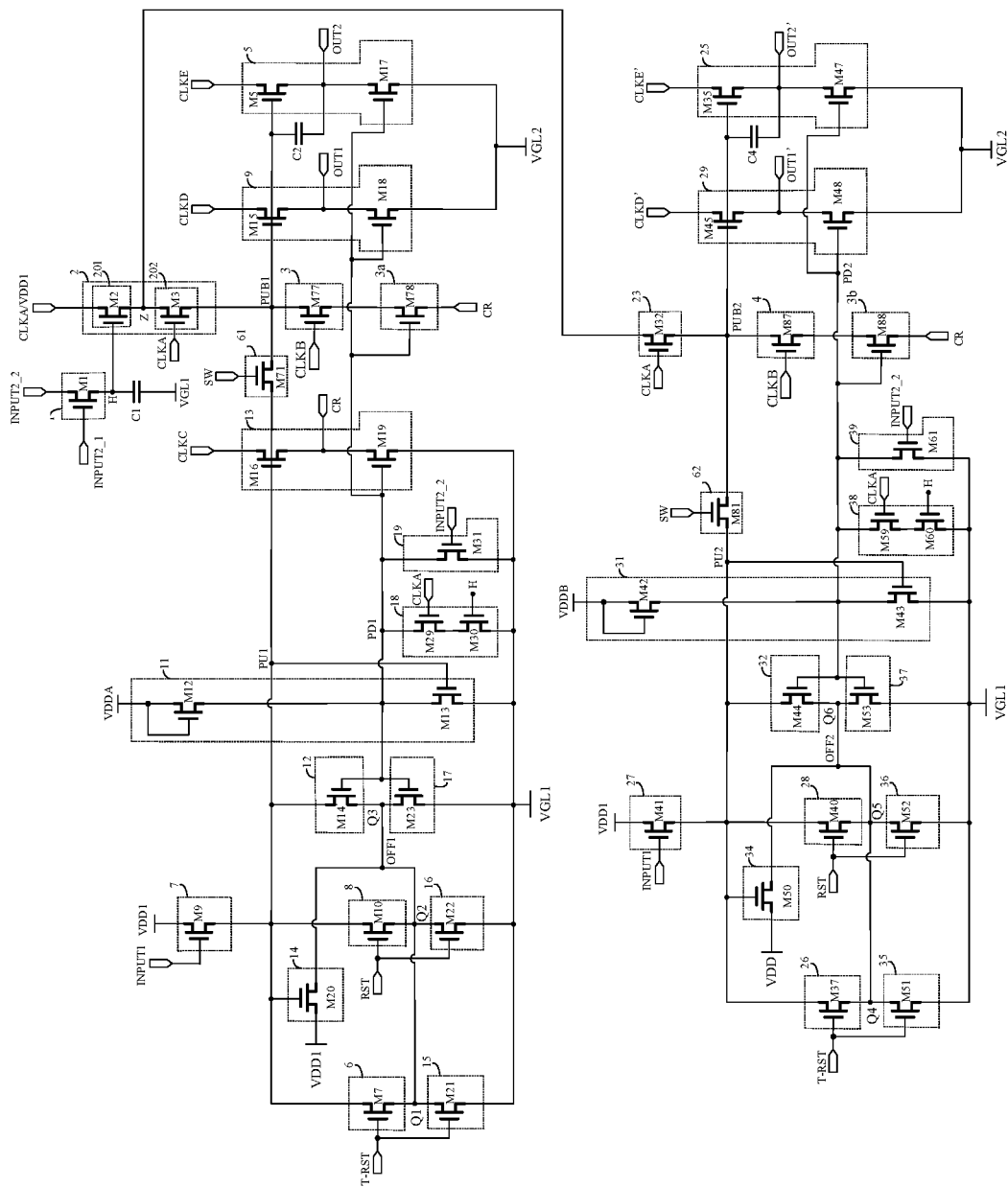
FIG. 32 is a schematic diagram showing yet another circuit structure of the shift register unit according to the embodiments of the present disclosure.

FIG. 32 is a schematic diagram showing yet another circuit structure of the shift register unit according to the embodiments of the present disclosure. As shown in FIG. 32, in some embodiments, the shift register unit includes a second sensing reset circuit 4 connected to the second clock control signal input terminal CLKB, the second level supply terminal, and the second pull-up back node PUB2, and configured to write an inactive level signal provided by the second level supply terminal to the second pull-up back node PUB2 in response to control of an active level signal provided by the second clock control signal input terminal CLKB.

The shift register unit further includes: a second sensing reset anti-leakage circuit 4b, and the second sensing reset circuit is connected to the second level supply terminal through the second sensing reset anti-leakage circuit 4b; and the second sensing reset anti-leakage circuit 4b is further connected to the second pull-down node PD2, and is configured to form a path between the second sensing reset circuit and the second level supply terminal in response to control of an active level signal at the second pull-down node PD2, and cut off the path between the second sensing reset circuit and the second level supply terminal in response to control of an inactive level signal at the second pull-down node PD2.

In some embodiments, the second sensing reset anti-leakage circuit 4b includes: an eighty-eighth transistor M88; and a control electrode of the eighty-eighth transistor M88 is connected to the second pull-down node PD2, a first electrode of the eighty-eighth transistor M88 is connected to the second sensing reset anti-leakage circuit 4b, and a second electrode of the eighty-eighth transistor M88 is connected to the second level supply terminal.

Similar to the function of the first sensing reset anti-leakage circuit 3a described above, the second sensing reset anti-leakage circuit 4b in the present embodiment can effectively prevent the second pull-up back node PUB2 from discharging through the second sensing reset circuit 4 and the second level supply terminal.

Figure 33:
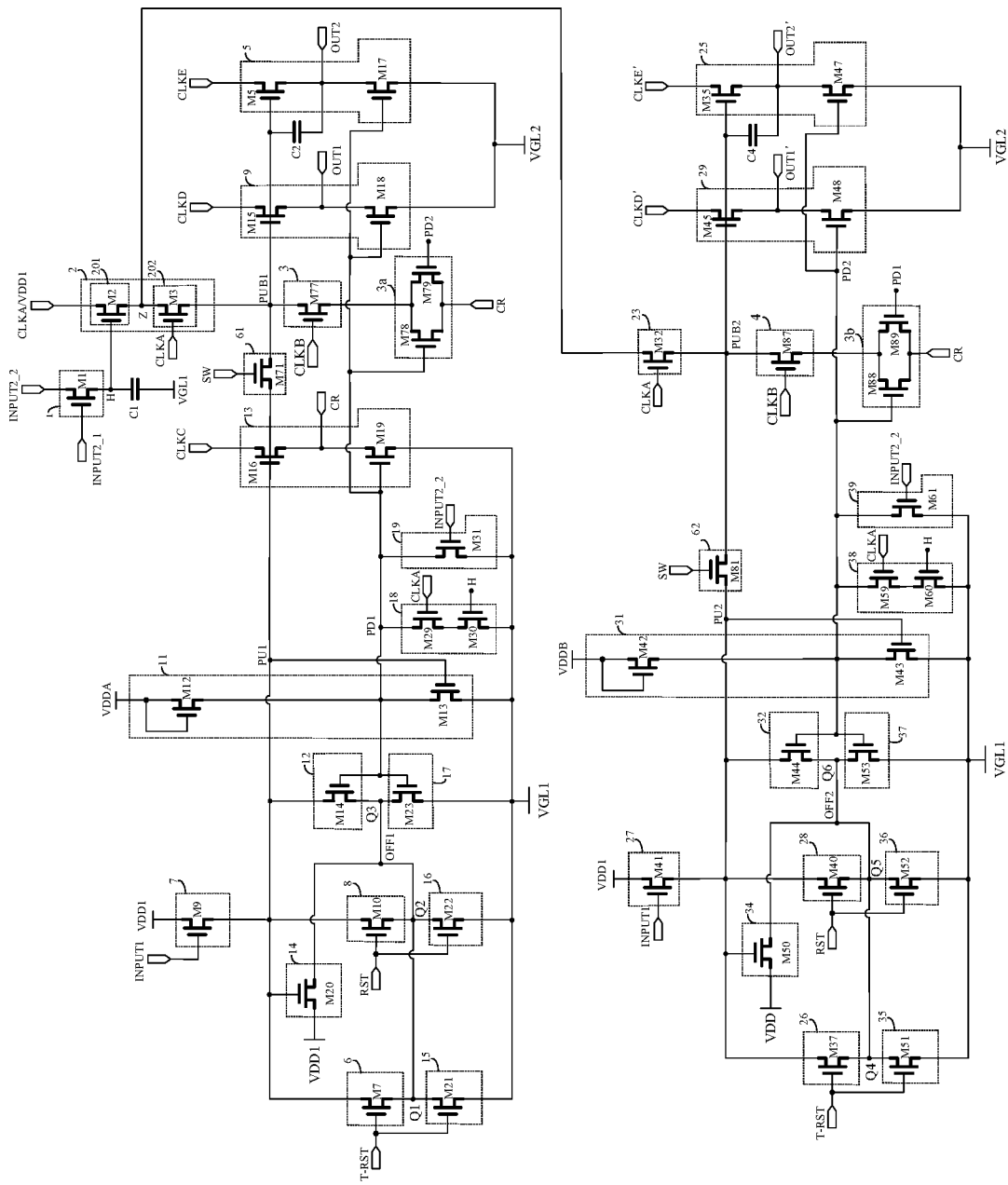
FIG. 33 is a schematic diagram showing yet another circuit structure of the shift register unit according to the embodiments of the present disclosure.

FIG. 33 is a schematic diagram showing yet another circuit of the shift register unit according to the embodiments of the present disclosure. As shown in FIG. 33, in some embodiments, the shift register unit includes a first sensing reset anti-leakage circuit 3a, and the first sensing reset circuit 3 is connected to the second level supply terminal through the first sensing reset anti-leakage circuit 3a; and the first sensing reset anti-leakage circuit 3a is further connected to the first pull-down node PD1, and is configured to form a path between the first sensing reset circuit 3 and the second level supply terminal in response to control of an active level signal at the first pull-down node PD1, and cut off the path between the first sensing reset circuit 3 and the second level supply terminal in response to control of an inactive level signal at the first pull-down node PD1.

The first sensing reset anti-leakage circuit 3a is further connected to the second pull-down node PD2, and is further configured to form the path between the first sensing reset circuit 3 and the second level supply terminal in response to control of an active level signal at the second pull-down node PD2, and cut off the path between the first sensing reset circuit 3 and the second level supply terminal in response to control of an inactive level signal at the second pull-down node PD2.

The second sensing reset anti-leakage circuit 3b is further connected to the first pull-down node PD1, and the second sensing reset anti-leakage circuit 3b is further configured to form the path between the second sensing reset circuit 4 and the second level supply terminal in response to control of an active level signal at the first pull-down node PD1, and cut off the path between the second sensing reset circuit 4 and the second level supply terminal in response to control of an inactive level signal at the first pull-down node PD1.

In some embodiments, the first sensing reset anti-leakage circuit 3a includes: a seventy-eighth transistor M78 and a seventy-ninth transistor M79.

The second sensing reset anti-leakage circuit 3b includes: an eighty-eighth transistor M88 and an eighty-ninth transistor M89.

A control electrode of the seventy-eighth transistor M78 is connected to the first pull-down node PD1, a first electrode of the seventy-eighth transistor M78 is connected to the first sensing reset anti-leakage circuit 3a, and a second electrode of the seventy-eighth transistor M78 is connected to the second level supply terminal.

A control electrode of the seventy-ninth transistor M79 is connected to the second pull-down node PD2, a first electrode of the seventy-ninth transistor M79 is connected to the first sensing reset anti-leakage circuit 3a, and a second electrode of the seventy-ninth transistor M79 is connected to the second level supply terminal.

A control electrode of the eighty-eighth transistor M88 is connected to the second pull-down node PD2, a first electrode of the eighty-eighth transistor M88 is connected to the second sensing reset anti-leakage circuit 3b, and a second electrode of the eighty-eighth transistor M88 is connected to the second level supply terminal.

A control electrode of the eighty-ninth transistor M89 is connected to the first pull-down node PD1, a first electrode of the eighty-ninth transistor M89 is connected to the second sensing reset anti-leakage circuit 3b, and a second electrode of the eighty-ninth transistor M89 is connected to the second level supply terminal.

It should be noted that, in each embodiment in which the shift register unit includes the second sensing input circuit, the second display input circuit, the second switch circuit, and the third driving output circuit, the shift register unit may also operate adopting the operating timing shown in any one of FIGS. 8 to 11, 14A, and 14B.

In addition, new circuit structures of the shift register unit which are obtained by combining parts of the circuit structures in the above embodiments should also belong to the protection scope of the present disclosure.

Figure 34:
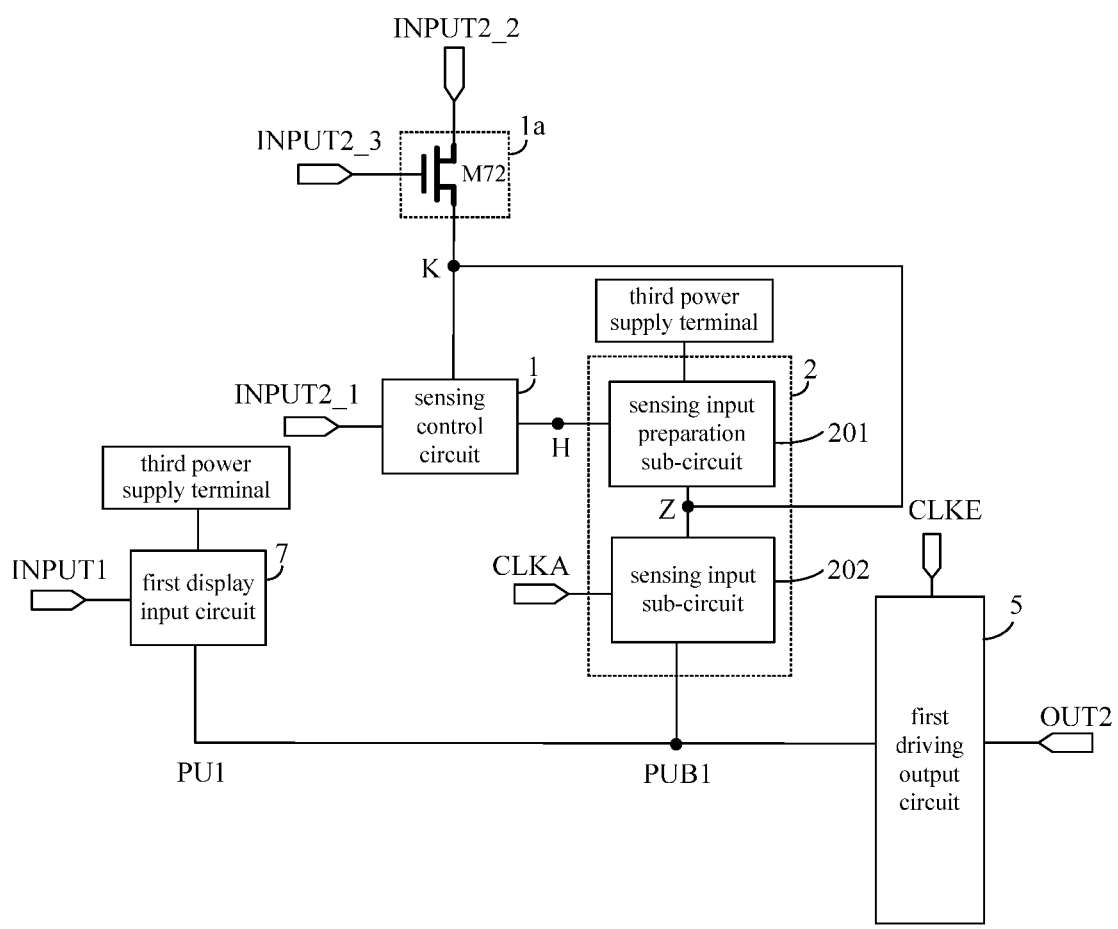
FIG. 34 is a schematic diagram showing a circuit structure of a shift register unit according to the embodiments of the present disclosure.

FIG. 34 is a schematic diagram showing a circuit structure of a shift register unit according to the embodiments of the present disclosure. As shown in FIG. 34, the shift register unit includes: a sensing control circuit 1, a first sensing input circuit 2, a sensing control anti-leakage circuit 1a, and a first driving output circuit 5.

The sensing control circuit 1 is connected to a first sensing signal input terminal INPUT2_1, a second sensing signal input terminal INPUT2_2, and a sensing control node H, and is configured to write an active level signal provided by the second sensing signal input terminal INPUT2_2 to the sensing control node H in response to control of an active level signal provided by the first sensing signal input terminal INPUT2_1.

The first sensing input circuit 2 includes: a sensing input preparation sub-circuit 201 and a sensing input sub-circuit 202. The sensing input preparation sub-circuit 201 is connected to a sensing preparation node Z, the sensing control node H, and a first level supply terminal, and is configured to write a signal provided by the first level supply terminal to the sensing preparation node Z in response to control of an active level signal provided by the sensing control node H. The sensing input sub-circuit 202 is connected to the sensing preparation node Z, a first clock control signal input terminal CLKA, and a first pull-up back node PUB1, and is configured to write a signal at the sensing preparation node Z to the first pull-up back node PUB1 in response to control of an active level signal provided by the first clock control signal input terminal CLKA.

The sensing control circuit 1 is connected to the second sensing signal input terminal through the sensing control anti-leakage circuit 1a, and is connected to the sensing control anti-leakage circuit 1a at a sensing control anti-leakage node K, and the sensing control anti-leakage node K is connected to the sensing preparation node Z. The sensing control anti-leakage circuit 1a is further connected to a third sensing signal input terminal INPUT2_3, and is configured to form a path between the sensing control anti-leakage node K and the second sensing signal input terminal INPUT2_2 in response to control of an active level signal provided by the third sensing signal input terminal INPUT2_3, and cut off the path between the sensing control anti-leakage node K and the second sensing signal input terminal INPUT2_2 in response to control of an inactive level signal provided by the third sensing signal input terminal INPUT2_3.

The first driving output circuit 5 is connected to the first pull-up back node PUB1, a first driving clock signal input terminal CLKE, and a first driving signal output terminal OUT2, and is configured to write a signal provided by the first driving clock signal input terminal CLKE to the first driving signal output terminal OUT2 in response to control of an active level signal at the first pull-up back node PUB1.

In the embodiments of the present disclosure, an anti-leakage design is provided for the sensing control circuit 1 based on a voltage at the sensing preparation node Z.

In some embodiments, the third sensing signal input terminal INPUT2_3 is the first sensing signal input terminal INPUT2_1 or the second sensing signal input terminal INPUT2_2, a detailed description of which may refer to the content of the above embodiments, and thus will not be repeated here.

In some embodiments, the shift register unit further includes: a first display input circuit 7 connected to a display signal input terminal INPUT1, a third power supply terminal, and a first pull-up node PU1, and configured to write an active level signal provided by the third power supply terminal to the first pull-up node PU1 in response to control of an active level signal provided by the display signal input terminal INPUT1; and the first pull-up node PU1 is connected to the first pull-up back node PUB1.

In some embodiments, the sensing control anti-leakage circuit 1a includes: a seventy-second transistor M72; and a control electrode of the seventy-second transistor M72 is connected to the third sensing signal input terminal INPUT2_3, a first electrode of the seventy-second transistor M72 is connected to the second sensing signal input terminal INPUT2_2, and a second electrode of the seventy-second transistor M72 is connected to the sensing control anti-leakage node K When the third sensing signal input terminal INPUT2_3 provides the active level signal, the seventy-second transistor M72 is turned on, and the path between the sensing control anti-leakage node K and the second sensing signal input terminal INPUT2_2 is formed; and when the third sensing signal input terminal INPUT2_3 provides the inactive level signal, the seventy-second transistor M72 is turned off, and the path between the sensing control anti-leakage node K and the second sensing signal input terminal INPUT2_2 is cut off.

In some embodiments, the first level supply terminal is the third power supply terminal. With such design, the sensing preparation node Z can be in a high level state while the sensing control node H is in a high level state.

It should be noted that, in the embodiment illustrated by FIG. 34, the shift register unit may optionally include a part or all of the second driving output circuit, the first switch circuit, the first sensing reset circuit, the first sensing reset anti-leakage circuit, the first cascade output circuit, the first global reset circuit, the first display reset circuit, the first pull-down control circuit, the first pull-up noise reduction circuit, the first pull-down noise reduction circuit, the first voltage control circuit, the first anti-leakage circuit, the second anti-leakage circuit, the third anti-leakage circuit, the second pull-down noise reduction circuit, the second sensing input circuit, the second display input circuit, the third driving output circuit, the fourth driving output circuit, the second sensing reset circuit, the second sensing reset anti-leakage circuit, the second global reset circuit, the second display reset circuit, the second pull-down control circuit, the second pull-up noise reduction circuit, the second voltage control circuit, the fourth anti-leakage circuit, the fifth anti-leakage circuit, the sixth anti-leakage circuit, the third pull-down noise reduction circuit, and the fourth pull-down noise reduction circuit; and the combinations of the above circuits are not shown in the drawings.

Figure 35:
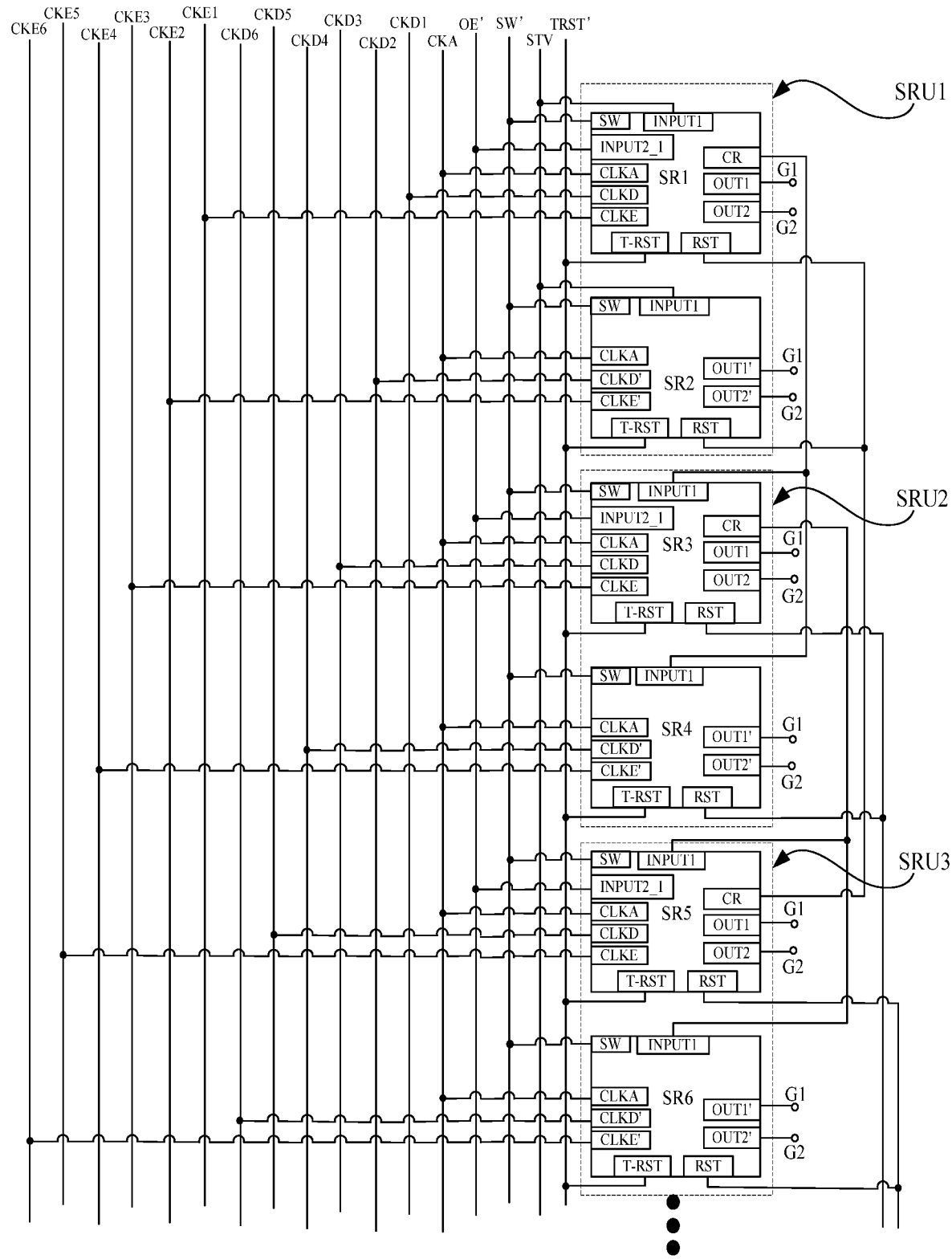
FIG. 35 is a schematic diagram showing a circuit structure of a gate driving circuit according to the embodiments of the present disclosure.

Based on the same inventive concept, the embodiments of the present disclosure further provide a gate driving circuit. FIG. 35 is a schematic diagram showing a circuit structure of the gate driving circuit according to the embodiments of the present disclosure. As shown in FIG. 35, the gate driving circuit includes a plurality of shift register units SRU1 to SRU3 that are cascaded, each of the plurality of shift register units SRU1 to SRU3 may adopt the shift register unit provided by any one of the above embodiments, and a detailed description of the shift register unit may refer to the content of the above embodiments, and thus will not be repeated here.

In some embodiments, each of the shift register units SRU1 to SRU3 is configured to drive gate lines corresponding to two rows of pixel units, that is, each of the shift register units SRU1 to SRU3 includes the first driving output circuit 5, the second driving output circuit 9, the third driving output circuit 25, the fourth driving output circuit 29, and the first cascade output circuit 13. In such case, the shift register unit SRU1/SRU2/SRU3 in each stage may be regarded as two shift register circuits, for example, the shift register unit SRU1 includes shift register circuits SR1 and SR2, the shift register unit SRU2 includes shift register circuits SR3 and SR4, and the shift register unit SRU3 includes shift register circuits SR5 and SR6.

In an exemplary embodiment, 2N rows of pixel units are disposed in a display panel, and accordingly N shift register units may be disposed in the gate driving circuit. The N shift register units are cascaded, which may be regarded as 2N shift register circuits being cascaded, each odd-numbered shift register circuit SR(2n−1) is provided with the first sensing signal input terminal, the second sensing signal input terminal, and the first cascade signal output terminal CR, while each even-numbered shift register circuit SR2n is not provided with the first sensing signal input terminal, the second sensing signal input terminal, and the first cascade signal output terminal CR, where 1≤n≤N and n is an integer.

FIG. 35 only illustrates an exemplary case of three stages of shift register units SRU1 to SRU3 (six stages of shift register circuits SR1 to SR6), but such case is only for the purpose of illustration.

In some embodiments, the second sensing signal input terminal of each stage of shift register units SRU1 to SRU3 is connected to the first cascade signal output terminal CR provided for the each stage of shift register units SRU1 to SRU3 or is connected to the first cascade signal output terminal CR of a shift register unit in another stage (e.g., the first cascade signal output terminal of a shift register unit located a stage(s) before, or the first cascade signal output terminal of a shift register unit located a stage(s) after, where a is a positive integer); the first clock control signal input terminal CLKA of each stage of shift register units SRU1 to SRU3 is connected to a first clock control signal line CKA; the second clock control signal input terminal CLKB of each stage of shift register units SRU1 to SRU3 is connected to a second clock control signal line CKB; and the global reset signal input terminal T-RST of each stage of shift register units SRU1 to SRU3 is connected to a global reset signal input line TRST', and the first sensing signal input terminal of each stage of shift register units is connected to the random signal input line OE', and the switch signal input terminal SW of each stage of shift register units SRU1 to SRU3 is connected to a switch signal input line SW'.

The display signal input terminal INPUT1 of the shift register unit SRU1 in the first stage is connected to a frame start signal input terminal STV, and the display signal input terminal INPUT1 of each of the shift register units in other stages than the first stage is connected to the first cascade signal output terminal CR of the shift register unit in the previous stage; the global reset signal input terminal T-RST of the shift register unit in each stage is connected to the global reset signal line TRST'; and the display reset signal input terminal RST of the shift register unit in the $N^{th}$ stage and the display reset signal input terminal RST of the shift register unit in the $(N-1)^{th}$ stage are connected to a frame end reset signal line, and the display reset signal input terminal RST of each of the shift register units in other stages than the $N^{th}$ and $(N-1)^{th}$ stages is connected to the first cascade signal output terminal CR of the shift register unit in one stage after the next stage.

Apparently, a specific cascading mode may be adjusted according to actual needs in practical applications.

In some embodiments, six first driving clock signal lines CKE1 to CKE6 and six second driving clock signal lines CKD1 to CKD6 are provided for the gate driving circuit.

The first driving clock signal input terminal CLKE of the shift register unit SRU(3i+1) in the (3i+1)$^{th}$ stage is connected to the first driving clock signal line CKE1, the second driving clock signal input terminal CLKD of the shift register unit SRU(3i+1) in the (3i+1)$^{th}$ stage is connected to the second driving clock signal line CKD1, the third driving clock signal input terminal CLKE' of the shift register unit SRU(3i+1) in the (3i+1)$^{th}$ stage is connected to the first driving clock signal line CKE2, and the fourth driving clock signal input terminal CLKD' of the shift register unit SRU(3i+1) in the (3i+1)$^{th}$ stage is connected to the second driving clock signal line CKD2.

The first driving clock signal input terminal CLKE of the shift register unit SRU(3i+2) in the (3i+2)$^{th}$ stage is connected to the first driving clock signal line CKE3, the second driving clock signal input terminal CLKD of the shift register unit SRU(3i+2) in the (3i+2)$^{th}$ stage is connected to the second driving clock signal line CKD3, the third driving clock signal input terminal CLKE' of the shift register unit SRU(3i+2) in the (3i+2)$^{th}$ stage is connected to the first driving clock signal line CKE4, and the fourth driving clock signal input terminal CLKD' of the shift register unit SRU(3i+2) in the (3i+2)$^{th}$ stage is connected to the second driving clock signal line CKD4.

The first driving clock signal input terminal CLKE of the shift register unit SRU(3i+3) in the (3i+3)$^{th}$ stage is connected to the first driving clock signal line CKE5, the second driving clock signal input terminal CLKD of the shift register unit SRU(3i+3) in the (3i+3)$^{th}$ stage is connected to the second driving clock signal line CKD5, the third driving clock signal input terminal CLKE' of the shift register unit SRU(3i+3) in the (3i+3)$^{th}$ stage is connected to the first driving clock signal line CKE6, and the fourth driving clock signal input terminal CLKD' of the shift register unit SRU(3i+3) in the (3i+3)$^{th}$ stage is connected to the second driving clock signal line CKD6. Here, i is a positive integer and 3i+3≤N.

Apparently, the shift register units may be cascaded in other cascade manners in the embodiments of the present disclosure.

Based on the same inventive concept, the embodiments of the present disclosure further provide a display panel, including the gate driving circuit provided by the above embodiments, and a detailed description of the gate driving circuit may refer to the content of the above embodiments, and thus will not be repeated here.

In some embodiments, the gate driving circuit is formed on an array substrate of the display panel by way of GOA.

Based on the same inventive concept, the embodiments of the present disclosure further provide a display device, including the display panel provided by the above embodiments, and a detailed description of the display panel may refer to the content of the above embodiments, and thus will not be repeated here.

The display device provided by the embodiments of the present disclosure may be any product or component with a display function, such as a liquid crystal display screen, a wearable device, a mobile phone, a tablet computer, a television, a display, a notebook computer, a digital photo frame, or a navigator. The inclusion of other essential components of the display device should be understood by those of ordinary skill in the art, those essential components will not be described here, and should not be considered as a limitation to the present disclosure.

Figure 36:
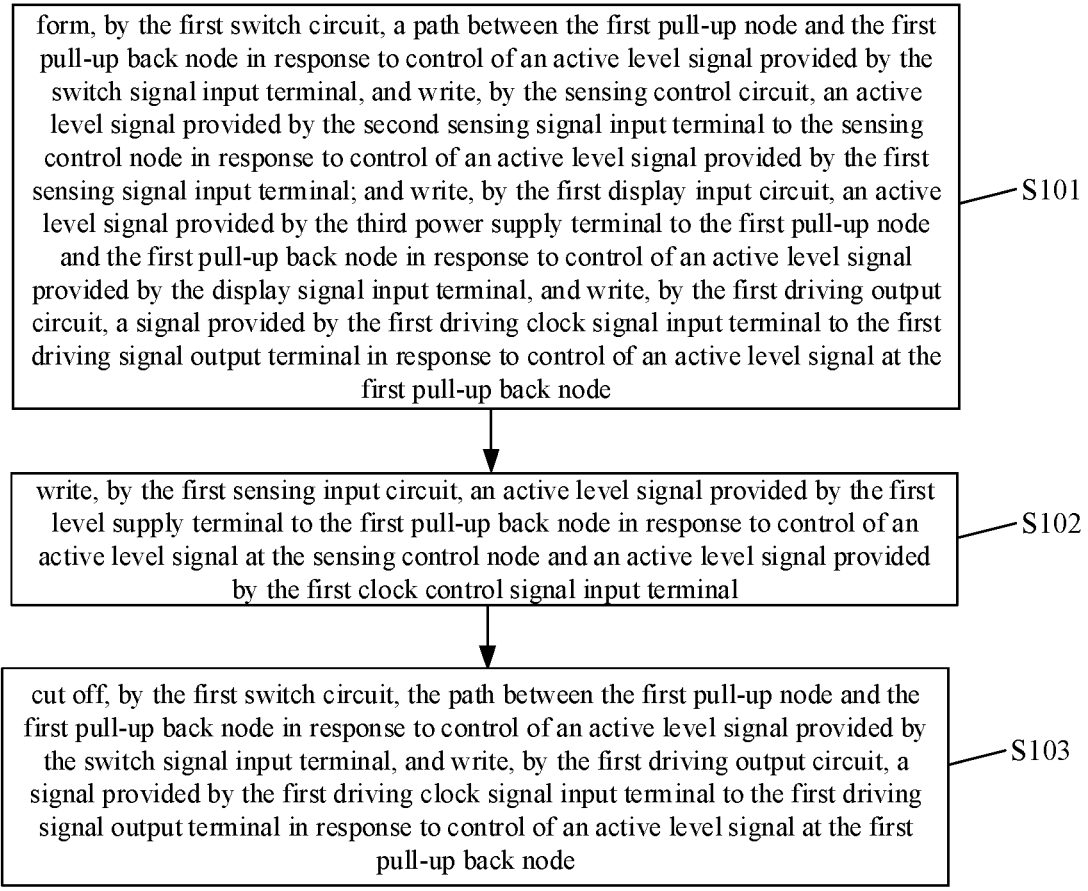
FIG. 36 is a flowchart illustrating a gate driving method according to the embodiments of the present disclosure.

Based on the same inventive concept, the embodiments of the present disclosure further provide a gate driving method. The gate driving method is based on the shift register unit provided by the above embodiments, and a detailed description of the shift register unit may refer to the content of the above embodiments, and thus will not be repeated here. FIG. 36 is a flowchart illustrating the gate driving method according to the embodiments of the present disclosure. As shown in FIG. 36, the gate driving method includes steps as follows.

In step S101, the first switch circuit forms a path between the first pull-up node and the first pull-up back node in response to control of an active level signal provided by the switch signal input terminal, and the sensing control circuit writes an active level signal provided by the second sensing signal input terminal to the sensing control node in response to control of an active level signal provided by the first sensing signal input terminal; and the first display input circuit writes an active level signal provided by the third power supply terminal to the first pull-up node and the first pull-up back node in response to control of an active level signal provided by the display signal input terminal, and the first driving output circuit writes a signal provided by the first driving clock signal input terminal to the first driving signal output terminal in response to control of an active level signal at the first pull-up back node.

In step S102, the first sensing input circuit writes an active level signal provided by the first level supply terminal to the first pull-up back node in response to control of an active level signal at the sensing control node and an active level signal provided by the first clock control signal input terminal.

In step S103, the first switch circuit cuts off the path between the first pull-up node and the first pull-up back node in response to control of an active level signal provided by the switch signal input terminal, and the first driving output circuit writes a signal provided by the first driving clock signal input terminal to the first driving signal output terminal in response to control of an active level signal at the first pull-up back node.

A detailed description of the above steps S101 to S103 may refer to the content of the above embodiments, and thus will not be repeated here.

It should be understood that the above embodiments are merely exemplary embodiments adopted to illustrate the principle of the present disclosure, and the present disclosure is not limited thereto. Various modifications and improvements can be made by those of ordinary skill in the art without departing from the spirit and essence of the present disclosure, and those modifications and improvements are also considered to fall within the protection scope of the present disclosure.

What is claimed is:

1. A shift register unit, comprising:
a sensing control circuit connected to a first sensing signal input terminal, a second sensing signal input terminal, and a sensing control node, and configured to write an active level signal provided by the second sensing signal input terminal to the sensing control node in response to control of an active level signal provided by the first sensing signal input terminal;
a first sensing input circuit connected to a first level supply terminal, a first clock control signal input terminal, the sensing control node, and a first pull-up back node, and configured to write an active level signal provided by the first level supply terminal to the first pull-up back node in response to control of an active level signal at the sensing control node and an active level signal provided by the first clock control signal input terminal;

a first display input circuit connected to a display signal input terminal, a third power supply terminal, and a first pull-up node, and configured to write an active level signal provided by the third power supply terminal to the first pull-up node in response to control of an active level signal provided by the display signal input terminal;

a first switch circuit connected in series between the first pull-up node and the first pull-up back node, connected to a switch signal input terminal, and configured to control connection and disconnection between the first pull-up node and the first pull-up back node in response to control of a signal provided by the switch signal input terminal; and a first driving output circuit connected to the first pull-up back node, a first driving clock signal input terminal, and a first driving signal output terminal, and configured to write a signal provided by the first driving clock signal input terminal to the first driving signal output terminal in response to control of an active level signal at the first pull-up back node.

2. The shift register unit of claim 1, wherein the first switch circuit comprises: a seventy-first transistor; and a control electrode of the seventy-first transistor is connected to the switch signal input terminal, a first electrode of the seventy-first transistor is connected to the first pull-up node, and a second electrode of the seventy-first transistor is connected to the first pull-up back node.

3. The shift register unit of claim 1, wherein the first sensing input circuit comprises:

a sensing input preparation sub-circuit connected to a sensing preparation node, the sensing control node, and the first level supply terminal, and configured to write a signal provided by the first level supply terminal to the sensing preparation node in response to control of an active level signal provided by the sensing control node; and a sensing input sub-circuit connected to the sensing preparation node, the first clock control signal input terminal, and the first pull-up back node, and configured to write a signal at the sensing preparation node to the first pull-up back node in response to control of an active level signal provided by the first clock control signal input terminal.

4. The shift register unit of claim 3, further comprising:
a sensing control anti-leakage circuit, wherein the sensing control circuit is connected to the second sensing signal input terminal through the sensing control anti-leakage circuit, and is connected to the sensing control anti-leakage circuit at a sensing control anti-leakage node, and the sensing control anti-leakage node is connected to the sensing preparation node;

the sensing control anti-leakage circuit is further connected to a third sensing signal input terminal, and is configured to form a path between the sensing control anti-leakage node and the second sensing signal input terminal in response to control of an active level signal provided by the third sensing signal input terminal, and cut off the path between the sensing control anti-leakage node and the second sensing signal input terminal in response to control of an inactive level signal provided by the third sensing signal input terminal; and the sensing control anti-leakage circuit comprises: a seventy-second transistor; and a control electrode of the seventy-second transistor is connected to the third sensing signal input terminal, a first electrode of the seventy-second transistor is connected to the second sensing signal input terminal, and a second electrode of the seventy-second transistor is connected to the sensing control anti-leakage node.

5. The shift register unit of claim 4, wherein the third sensing signal input terminal is one of the first sensing signal input terminal and the second sensing signal input terminal; and/or the first level supply terminal is the third power supply terminal.

6. The shift register unit of claim 4, further comprising:
a first sensing input anti-leakage circuit, wherein the sensing input sub-circuit is connected to the sensing preparation node through the first sensing input anti-leakage circuit, and is connected to the first sensing input anti-leakage circuit at a first sensing input anti-leakage node; and the first sensing input anti-leakage circuit is further connected to the first clock control signal input terminal, and is configured to form a path between the first sensing input anti-leakage node and the sensing preparation node in response to control of an active level signal provided by the first clock control signal input terminal, and cut off the path between the first sensing input anti-leakage node and the sensing preparation node in response to control of an inactive level signal provided by the first clock control signal input terminal.

7. The shift register unit of claim 6, wherein the first sensing input anti-leakage circuit comprises: a seventy-third transistor; and a control electrode of the seventy-third transistor is connected to the first clock control signal input terminal, a first electrode of the seventy-third transistor is connected to the sensing preparation node, and a second electrode of the seventy-third transistor is connected to the first sensing input anti-leakage node.

8. The shift register unit of claim 3, further comprising:
a sensing control anti-leakage circuit, wherein the sensing control circuit is connected to the second sensing signal input terminal through the sensing control anti-leakage circuit, and is connected to the sensing control anti-leakage circuit at a sensing control anti-leakage node; and the sensing control anti-leakage circuit is further connected to the first sensing signal input terminal, the sensing control node, and the third power supply terminal, and is configured to write an active level signal provided by the second sensing signal input terminal to the sensing control anti-leakage node in response to control of an active level signal provided by the first sensing signal input terminal, and write an active level signal provided by the third power supply terminal to the sensing control anti-leakage node in response to control of an active level signal at the sensing control node.

9. The shift register unit of claim 8, wherein the sensing control anti-leakage circuit comprises: a seventy-fourth transistor and a seventy-fifth transistor;

a control electrode of the seventy-fourth transistor is connected to the first sensing signal input terminal, a first electrode of the seventy-fourth transistor is connected to the second sensing signal input terminal, and a second electrode of the seventy-fourth transistor is connected to the sensing control anti-leakage node; and a control electrode of the seventy-fifth transistor is connected to the sensing control node, a first electrode of the seventy-fifth transistor is connected to the third power supply terminal, and a second electrode of the seventy-fifth transistor is connected to the sensing control anti-leakage node.

10. The shift register unit of claim 8, wherein the first level supply terminal is the first clock control signal input terminal; and
the shift register unit further comprises:
a first sensing input anti-leakage circuit connected to the sensing preparation node and a third level supply terminal, and configured to write an active level signal provided by the third level supply terminal to the sensing preparation node in response to control of the active level signal provided by the third level supply terminal.

11. The shift register unit of claim 10, wherein the first sensing input anti-leakage circuit comprises: a seventy-sixth transistor; and
a control electrode of the seventy-sixth transistor is connected to the third level supply terminal, a first electrode of the seventy-sixth transistor is connected to the third level supply terminal, and a second electrode of the seventy-sixth transistor is connected to the sensing preparation node.

12. The shift register unit of claim 3, further comprising:
a first sensing reset circuit connected to a second clock control signal input terminal, a second level supply terminal, and the first pull-up back node, and configured to write an inactive level signal provided by the second level supply terminal to the first pull-up back node in response to control of an active level signal provided by the second clock control signal input terminal.

13. The shift register unit of claim 12, wherein the first sensing reset circuit comprises: a seventy-seventh transistor; and
a control electrode of the seventy-seventh transistor is connected to the second clock control signal input terminal, a first electrode of the seventy-seventh transistor is connected to the first pull-up back node, and a second electrode of the seventy-seventh transistor is connected to the second level supply terminal.

14. The shift register unit of claim 3, further comprising:
a second driving output circuit connected to the first pull-up back node, a second driving clock signal input terminal, and a second driving signal output terminal, and configured to write a signal provided by the second driving clock signal input terminal to the second driving signal output terminal in response to control of an active level signal at the first pull-up back node; and
a first cascade output circuit connected to the first pull-up node, a first cascade clock signal input terminal, and a first cascade signal output terminal, and configured to write a signal provided by the first cascade clock signal input terminal to the first cascade signal output terminal in response to control of an active level signal at the first pull-up node.

15. The shift register unit of claim 14, comprising a first sensing reset circuit connected to a second clock control signal input terminal, a second level supply terminal, and the first pull-up back node, and configured to write an inactive level signal provided by the second level supply terminal to the first pull-up back node in response to control of an active level signal provided by the first clock control signal input terminal;
wherein the second level supply terminal is the first cascade signal output terminal.

16. A gate driving circuit, comprising: a plurality of shift register units that are cascaded, wherein each of the plurality of shift register units is the shift register unit of claim 1.

17. A gate driving method based on the shift register unit of claim 1, comprising:
forming, by the first switch circuit, a path between the first pull-up node and the first pull-up back node in response to control of an active level signal provided by the switch signal input terminal, and writing, by the sensing control circuit, an active level signal provided by the second sensing signal input terminal to the sensing control node in response to control of an active level signal provided by the first sensing signal input terminal; and writing, by the first display input circuit, an active level signal provided by the third power supply terminal to the first pull-up node and the first pull-up back node in response to control of an active level signal provided by the display signal input terminal, and writing, by the first driving output circuit, a signal provided by the first driving clock signal input terminal to the first driving signal output terminal in response to control of an active level signal at the first pull-up back node;
writing, by the first sensing input circuit, an active level signal provided by the first level supply terminal to the first pull-up back node in response to control of an active level signal at the sensing control node and an active level signal provided by the first clock control signal input terminal; and
cutting off, by the first switch circuit, the path between the first pull-up node and the first pull-up back node in response to control of an active level signal provided by the switch signal input terminal, and writing, by the first driving output circuit, a signal provided by the first driving clock signal input terminal to the first driving signal output terminal in response to control of an active level signal at the first pull-up back node.

18. A shift register unit, comprising:
a sensing control circuit connected to a first sensing signal input terminal, a second sensing signal input terminal, and a sensing control node, and configured to write an active level signal provided by the second sensing signal input terminal to the sensing control node in response to control of an active level signal provided by the first sensing signal input terminal;
a first sensing input circuit comprising: a sensing input preparation sub-circuit and a sensing input sub-circuit; wherein the sensing input preparation sub-circuit is connected to a sensing preparation node, the sensing control node, and a first level supply terminal, and is configured to write a signal provided by the first level supply terminal to the sensing preparation node in response to control of an active level signal provided by the sensing control node; and the sensing input sub-circuit is connected to the sensing preparation node, a first clock control signal input terminal, and a first pull-up back node, and is configured to write a signal at the sensing preparation node to the first pull-up back node in response to control of an active level signal provided by the first clock control signal input terminal;
a sensing control anti-leakage circuit, wherein the sensing control circuit is connected to the second sensing signal input terminal through the sensing control anti-leakage circuit, and is connected to the sensing control anti-leakage circuit at a sensing control anti-leakage node, and the sensing control anti-leakage node is connected to the sensing preparation node; and the sensing control anti-leakage circuit is further connected to a third sensing signal input terminal, and is configured to form a path between the sensing control anti-leakage node and the second sensing signal input terminal in response to control of an active level signal provided by the third sensing signal input terminal, and cut off the path between the sensing control anti-leakage node and the second sensing signal input terminal in response to control of an inactive level signal provided by the third sensing signal input terminal; and a first driving output circuit connected to the first pull-up back node, a first driving clock signal input terminal, and a first driving signal output terminal, and configured to write a signal provided by the first driving clock signal input terminal to the first driving signal output terminal in response to control of an active level signal at the first pull-up back node.

19. The shift register unit of claim 18, wherein the third sensing signal input terminal is the first sensing signal input terminal or the second sensing signal input terminal.

20. The shift register unit of claim 18, further comprising:
a first display input circuit connected to a display signal input terminal, a third power supply terminal, and a first pull-up node, and configured to write an active level signal provided by the third power supply terminal to the first pull-up node in response to control of an active level signal provided by the display signal input terminal;

wherein the first pull-up node is connected to the first pull-up back node; and the first level supply terminal is the third power supply terminal.

* * * * *